(12) United States Patent
Minami et al.

(10) Patent No.: US 7,977,738 B2
(45) Date of Patent: Jul. 12, 2011

(54) SEMICONDUCTOR MEMORY DEVICE AND MANUFACTURING METHOD THEREOF

(75) Inventors: Yoshihiro Minami, Yokosuka (JP);
Takashi Ohsawa, Yokohama (JP);
Tomoaki Shino, Kawasaki (JP); Takeshi Hamamoto, Yokohama (JP); Akihiro Nitayama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 151 days.

(21) Appl. No.: 12/497,010

(22) Filed: Jul. 2, 2009

(65) Prior Publication Data

US 2010/0019304 A1    Jan. 28, 2010

(30) Foreign Application Priority Data

Jul. 28, 2008    (JP) ................................. 2008-193278

(51) Int. Cl.
*H01L 29/76*    (2006.01)
*H01L 29/94*    (2006.01)

(52) U.S. Cl. .. 257/329; 257/378; 257/390; 257/E29.118

(58) Field of Classification Search .................. 257/329, 257/378, 390, E29.118
See application file for complete search history.

(56) References Cited

U.S. PATENT DOCUMENTS

| | | | |
|---|---|---|---|
| 6,381,168 B2 * | 4/2002 | Forbes | 365/149 |
| 6,621,725 B2 | 9/2003 | Ohsawa | |
| 6,825,524 B1 | 11/2004 | Ikehashi et al. | |
| 2009/0179262 A1 * | 7/2009 | Holz et al. | 257/331 |
| 2009/0315090 A1 * | 12/2009 | Weis et al. | 257/296 |
| 2010/0061145 A1 * | 3/2010 | Weis | 365/163 |

FOREIGN PATENT DOCUMENTS

| | | |
|---|---|---|
| JP | 2003-68877 | 3/2003 |
| JP | 2005-79314 | 3/2005 |

OTHER PUBLICATIONS

K. Okano, et al., "Process Integration Technology and Device Characteristics of CMOS FinFET on Bulk Silicon Substrate with sub-10 nm Fin Width and 20 nm Gate Length", 2005 IEEE International Electron Devices Meeting Technical Digest, Dec. 5-7, 2005, 6 pages.

* cited by examiner

*Primary Examiner* — Ngan Ngo
(74) *Attorney, Agent, or Firm* — Oblon, Spivak, McClelland, Maier & Neustadt, L.L.P.

(57) ABSTRACT

A semiconductor memory device includes bodies electrically floating; sources; drains; gate electrodes, each of which is adjacent to one side surface of the one of the bodies via a gate dielectric film; plates, each of which is adjacent to the other side surface of the one of the bodies via a plate dielectric film; first bit lines on the drains, the first bit lines including a semiconductor with a same conductivity type as that of the drains; and emitters on the semiconductor of the first bit lines, the emitters including a semiconductor with an opposite conductivity type to that of the semiconductor of the first bit lines, wherein the emitters are stacked above the bodies and the drains.

9 Claims, 64 Drawing Sheets

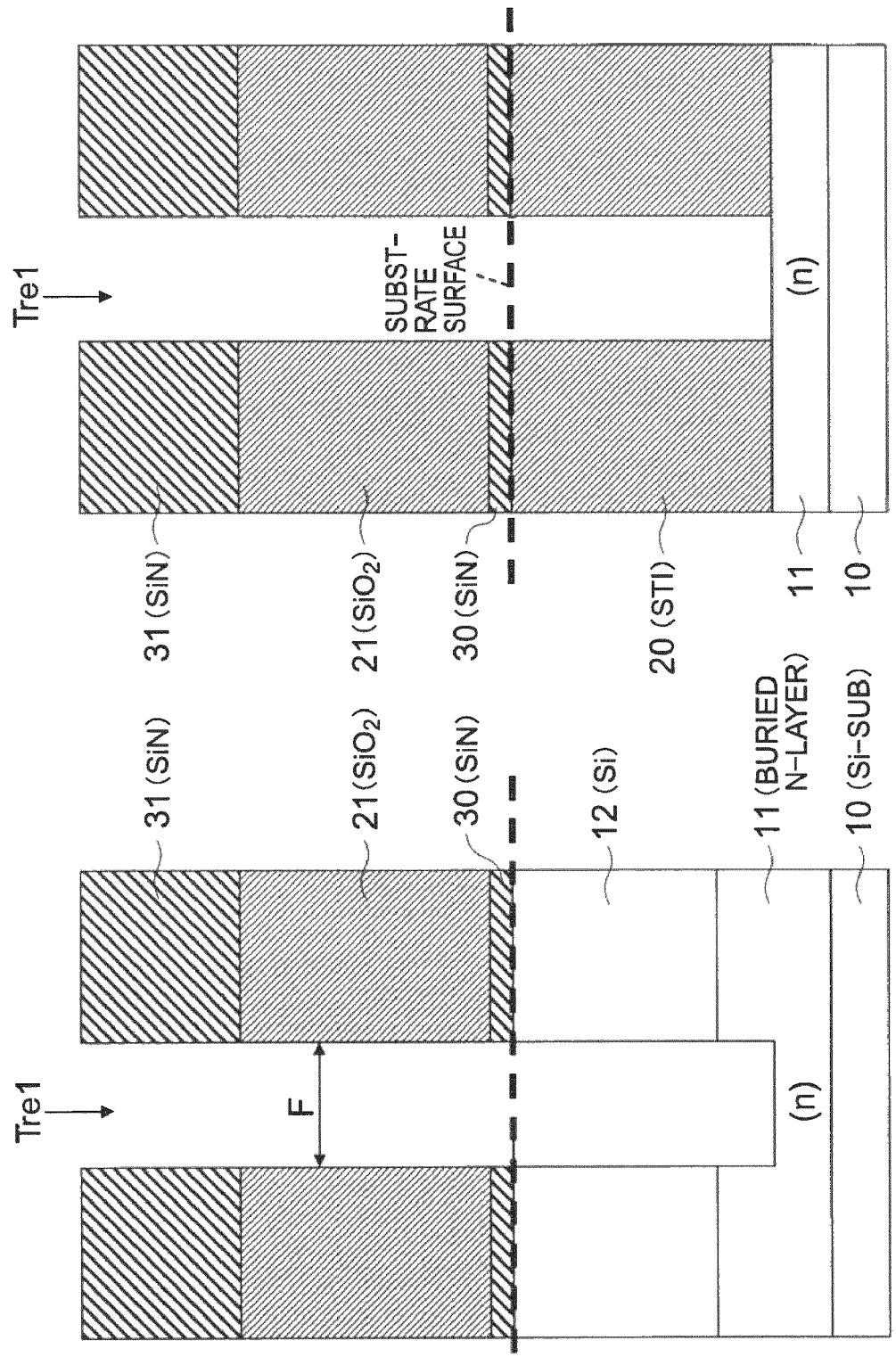

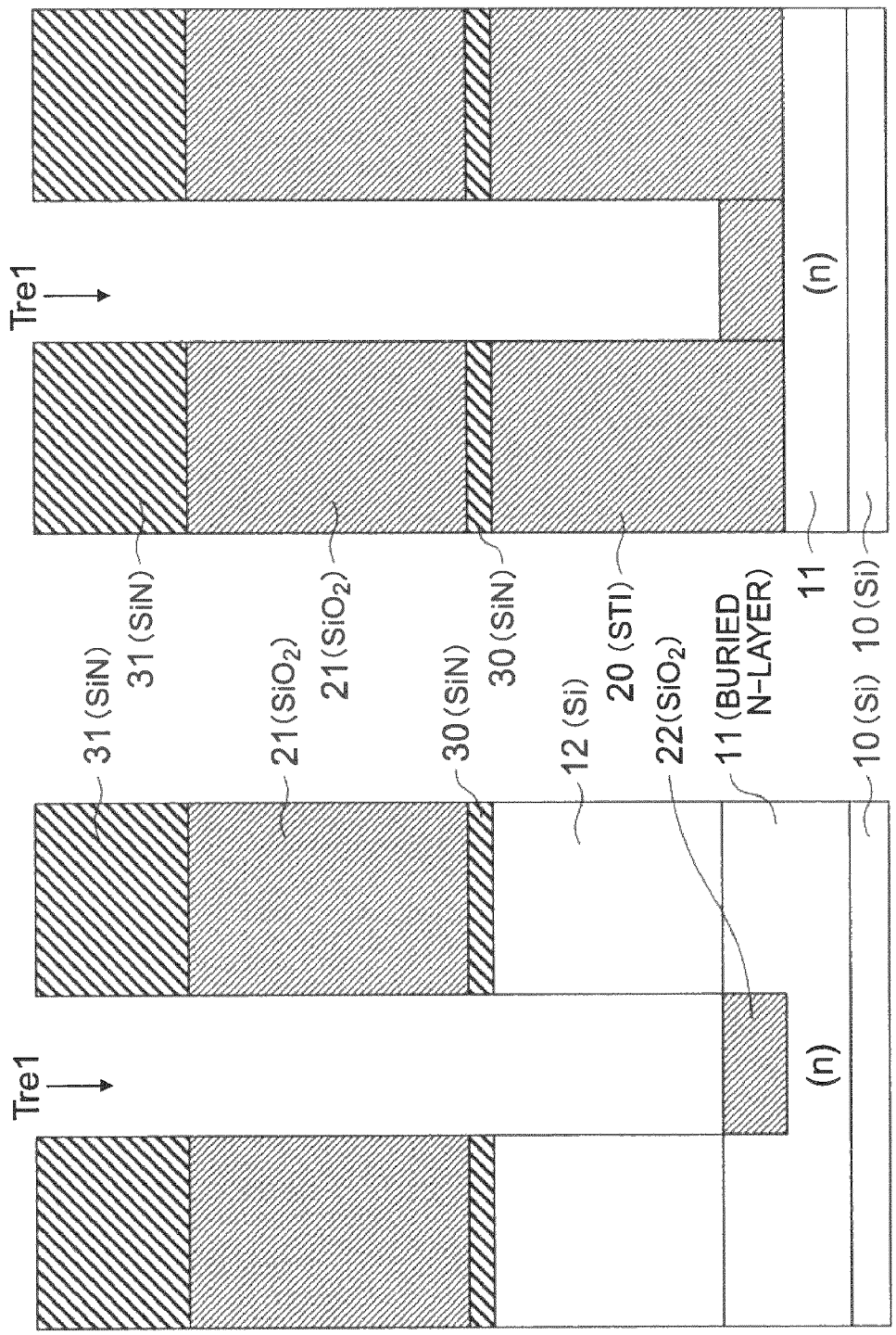

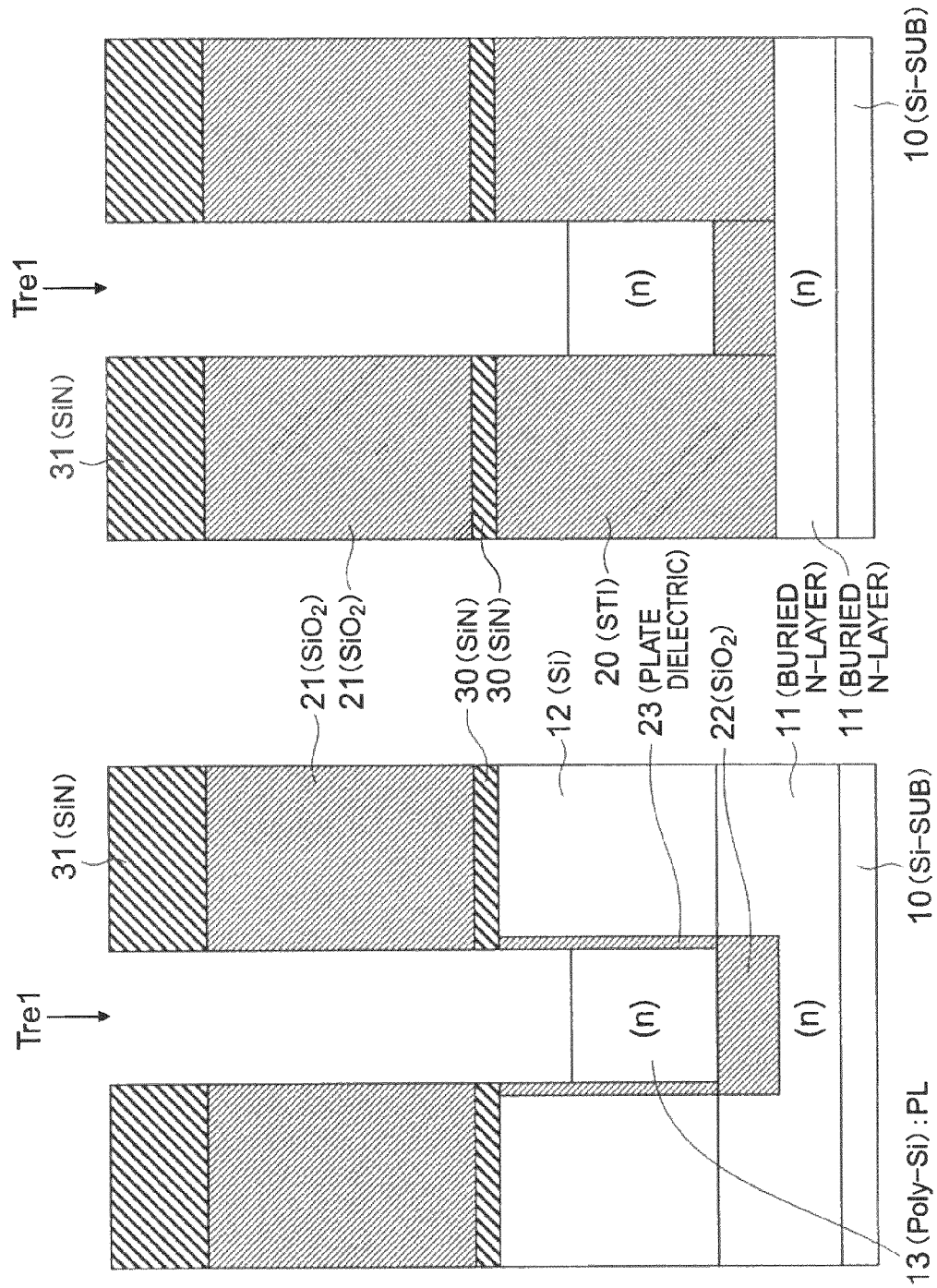

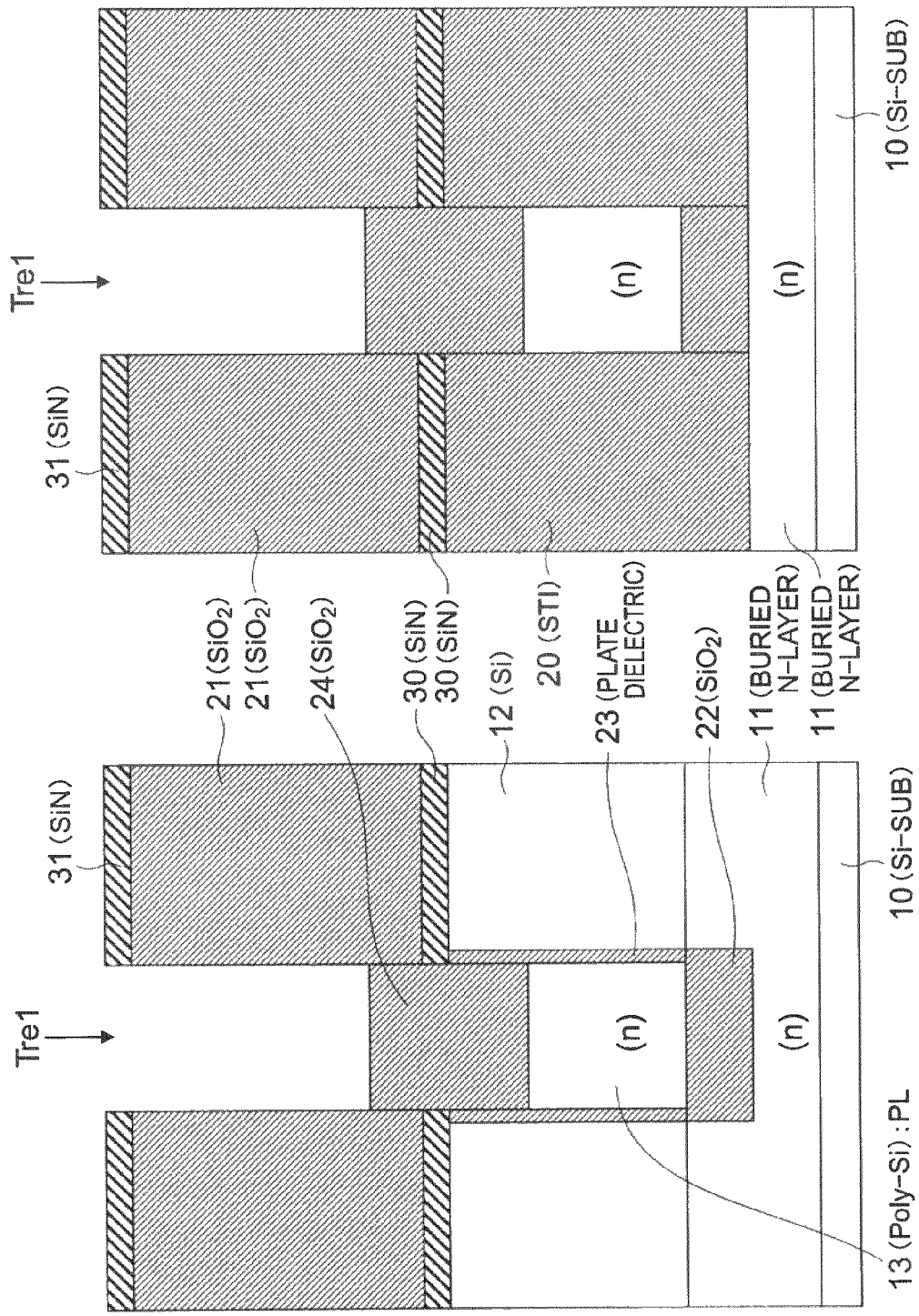

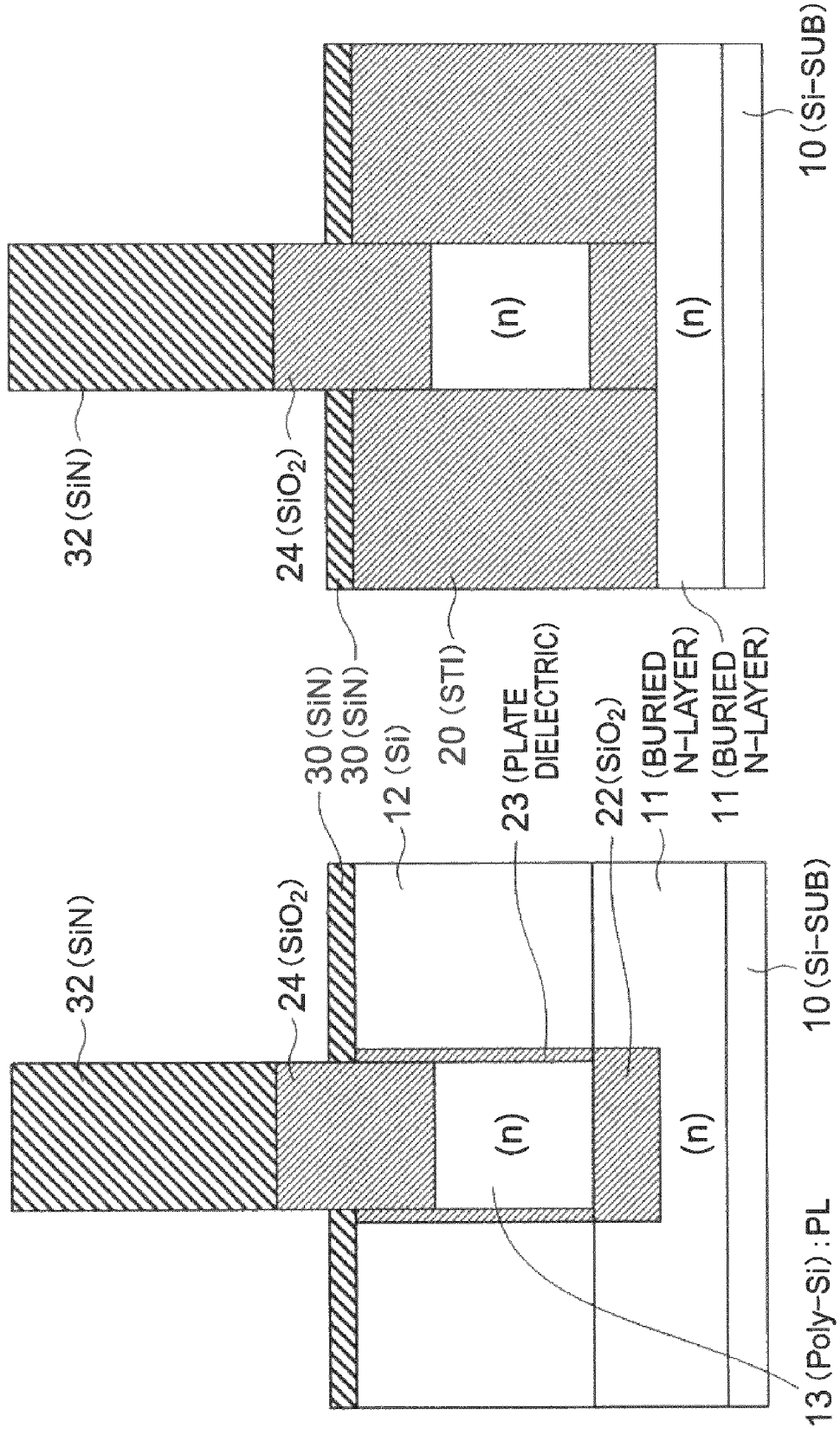

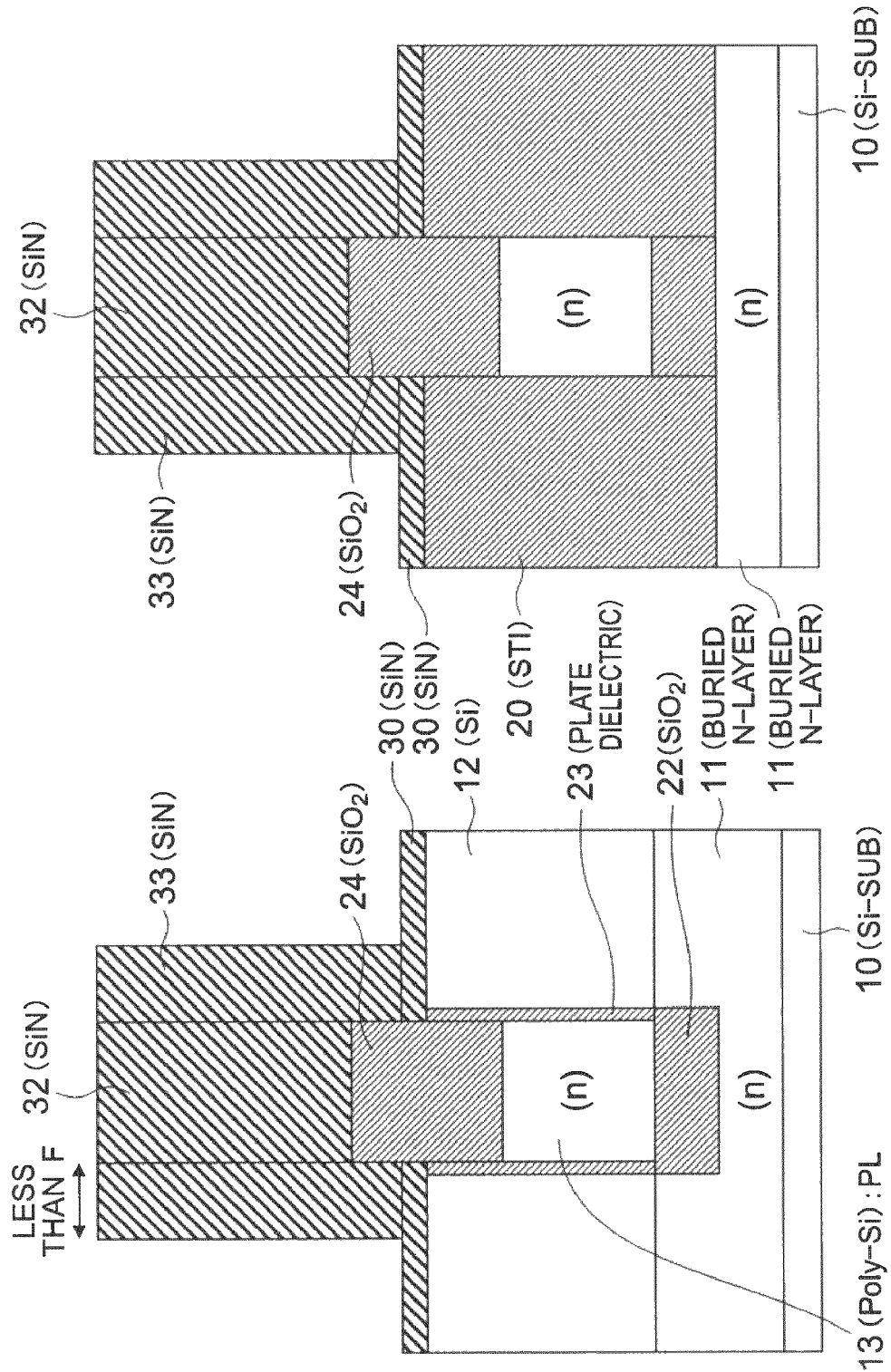

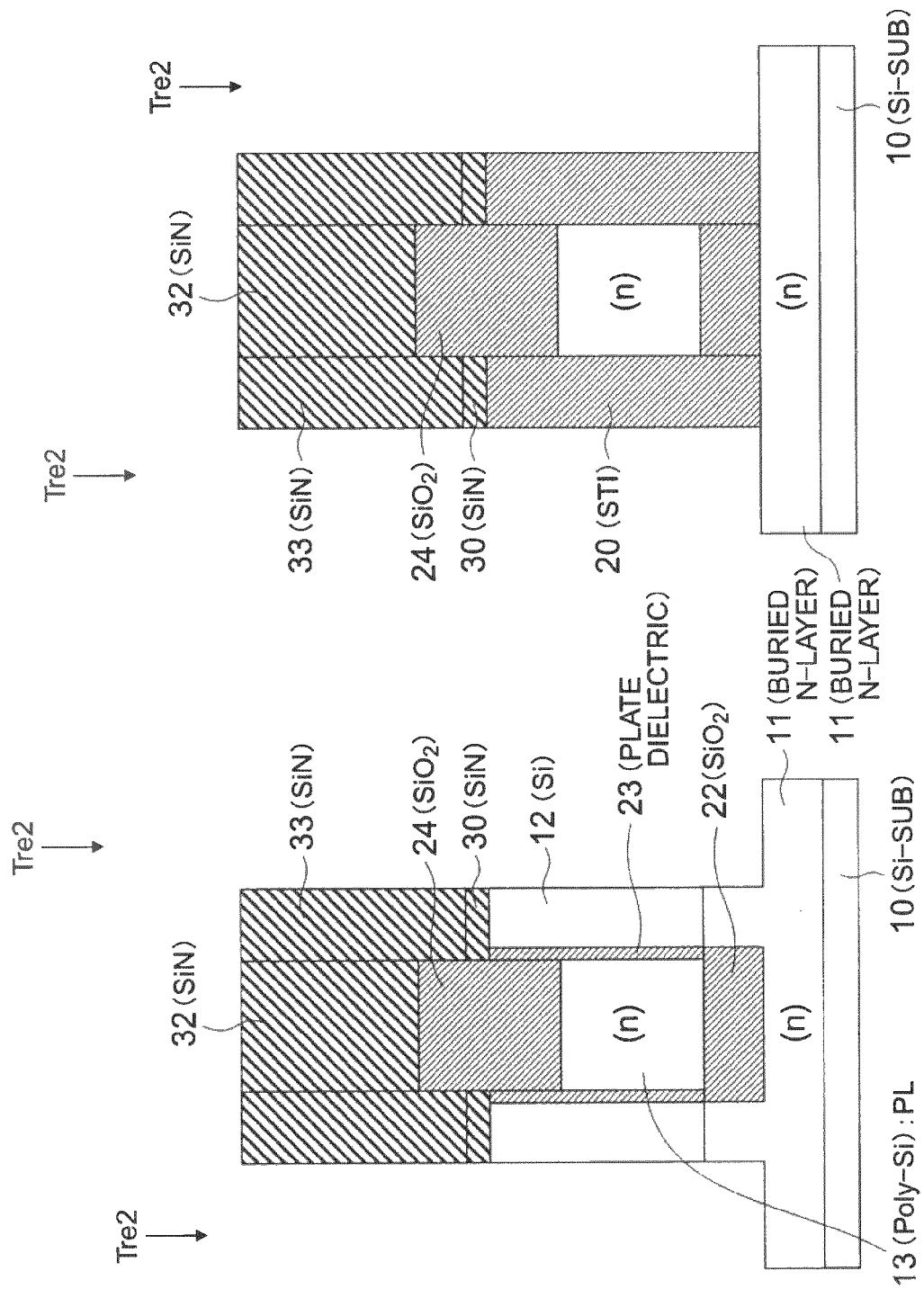

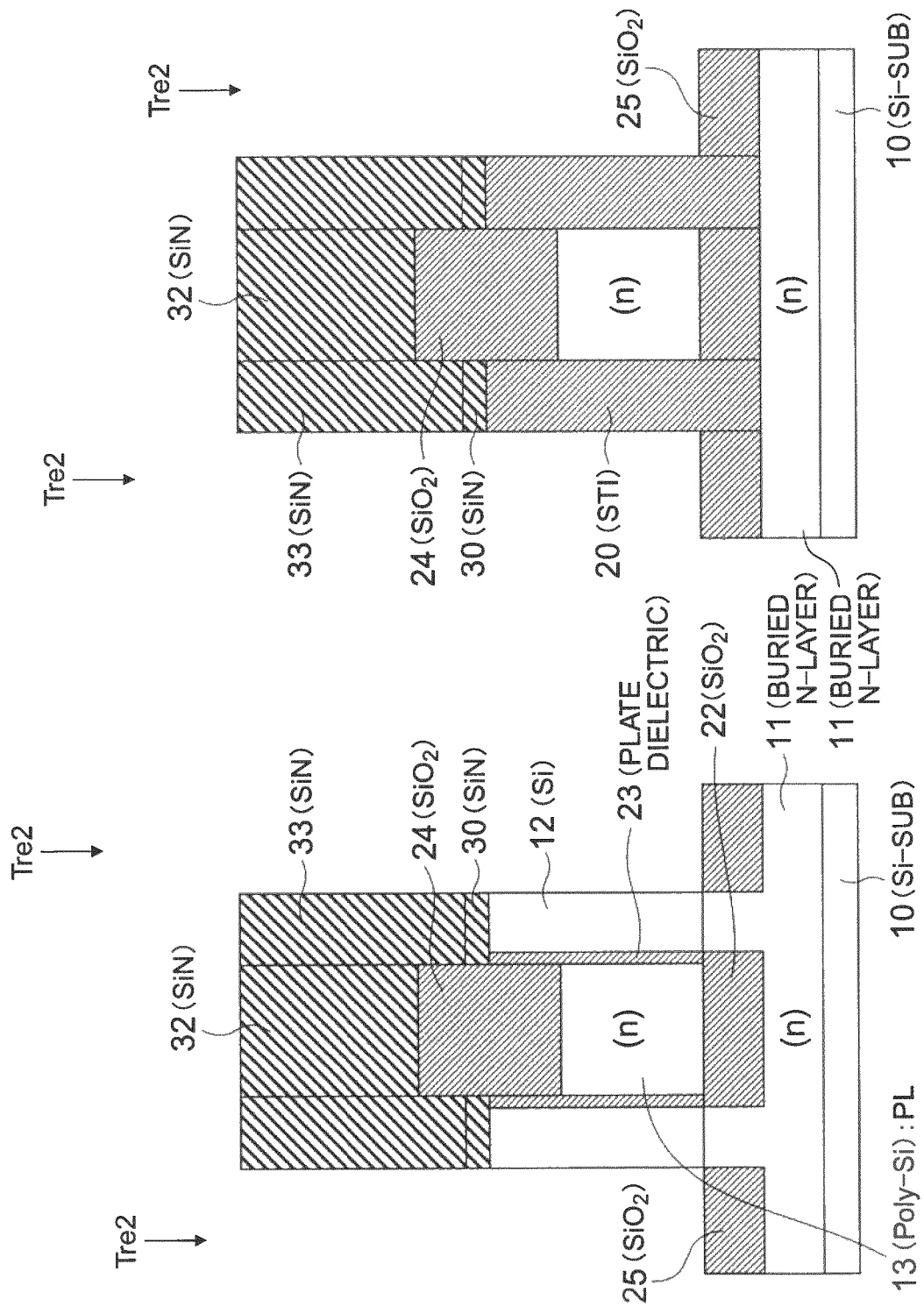

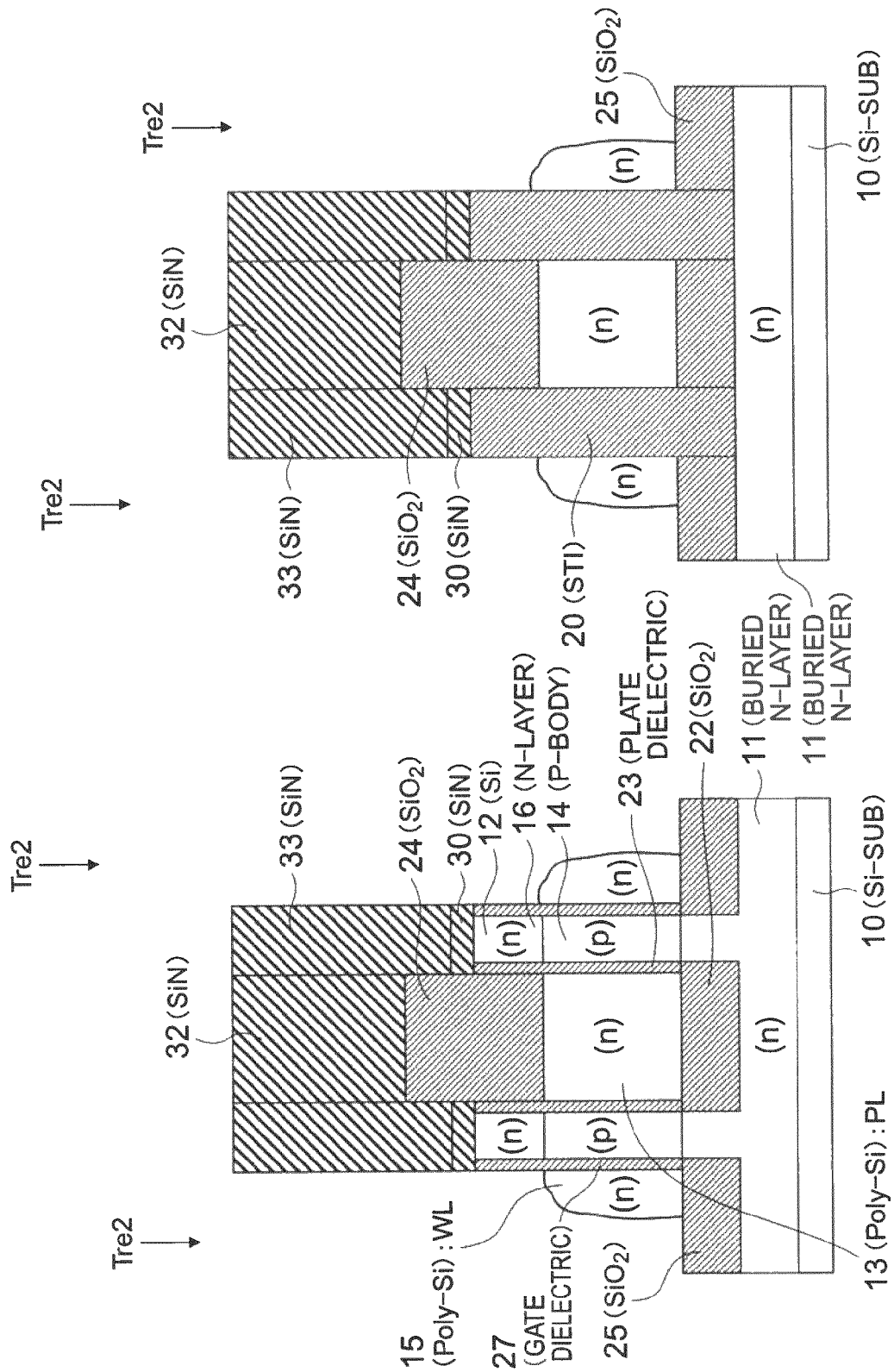

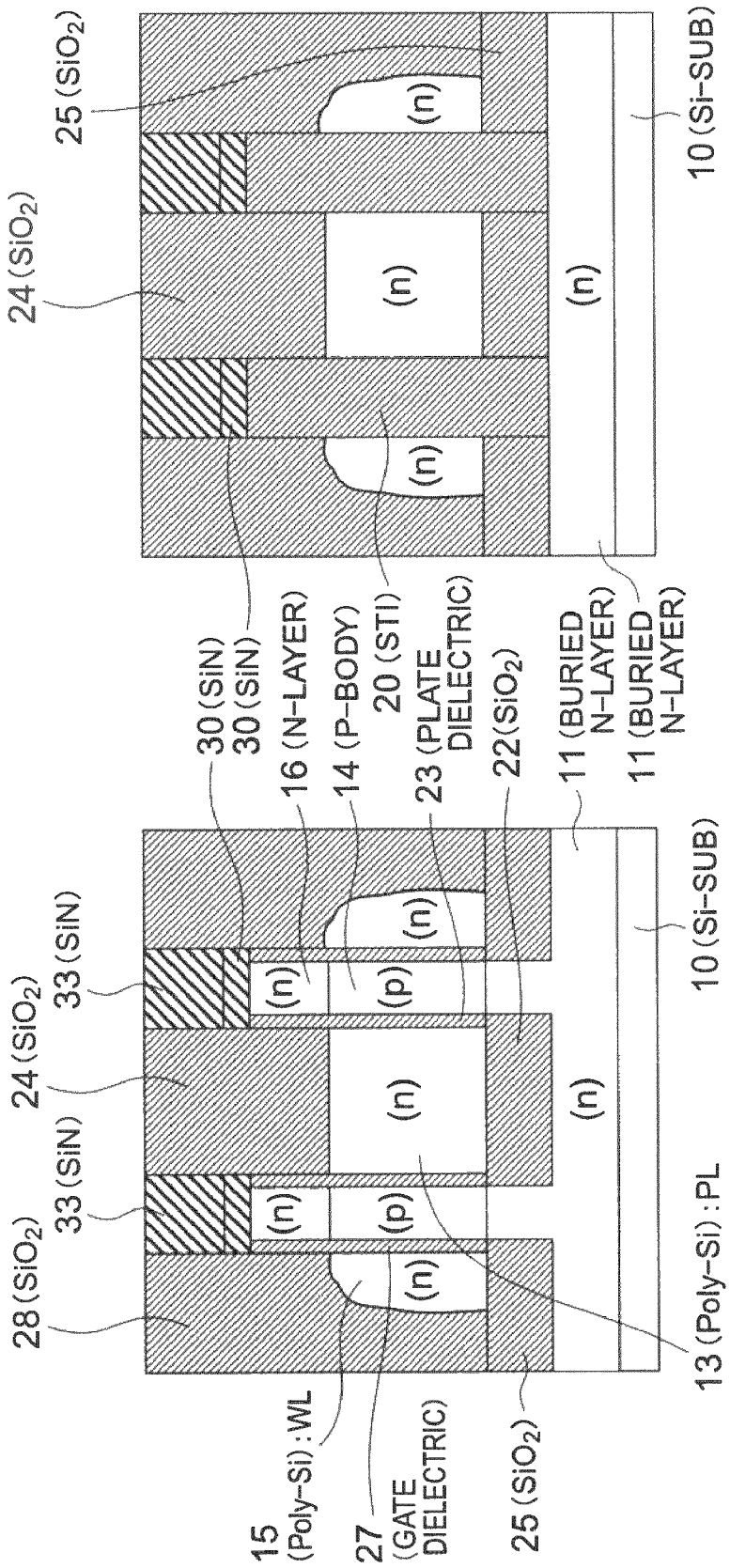

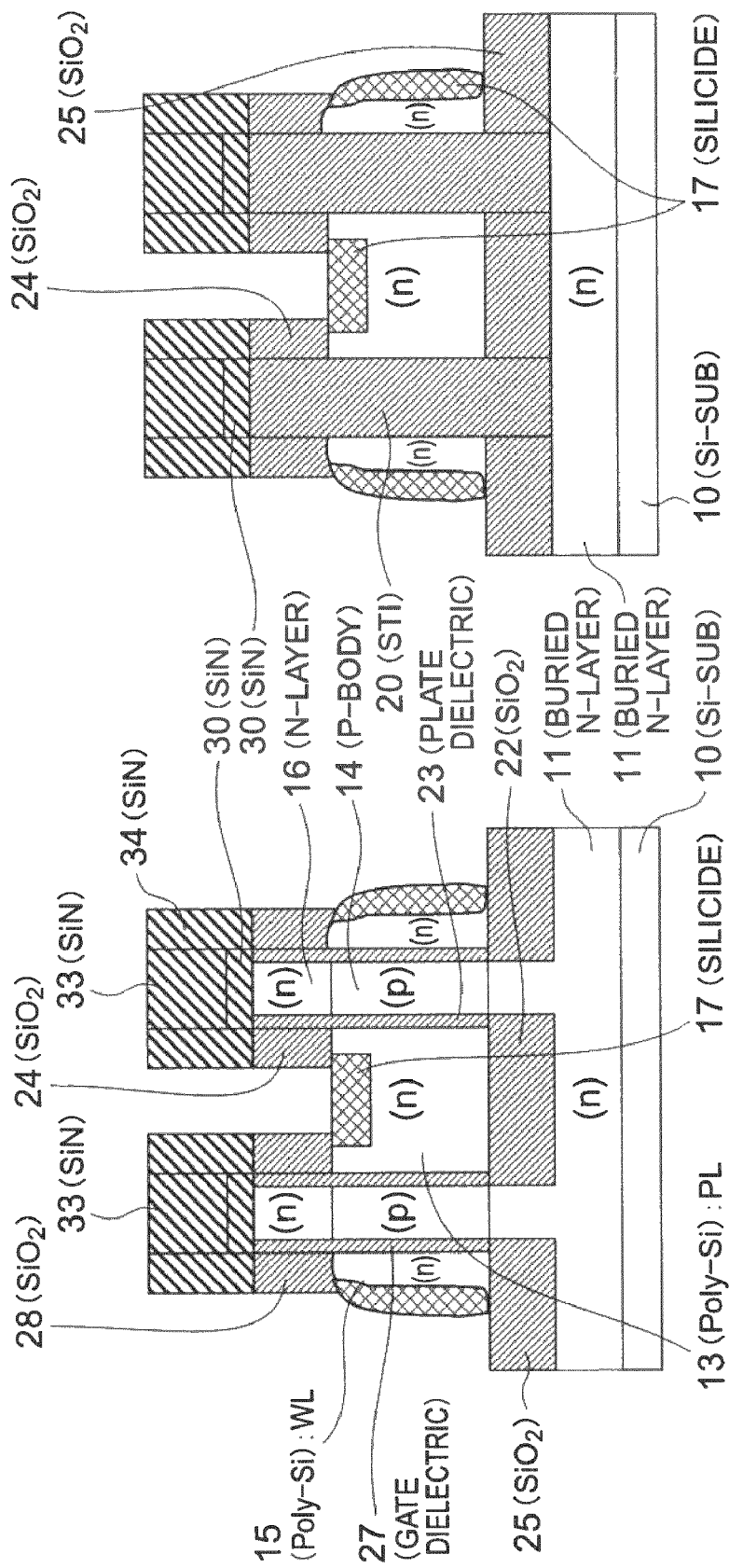

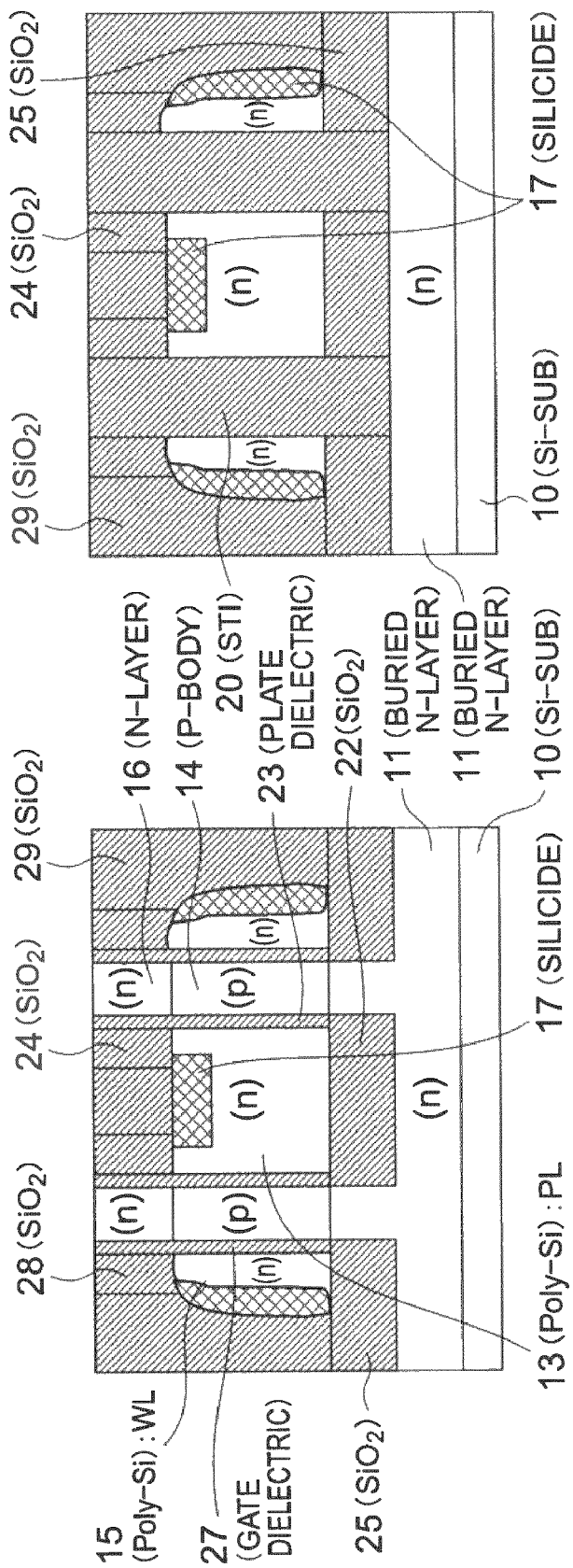

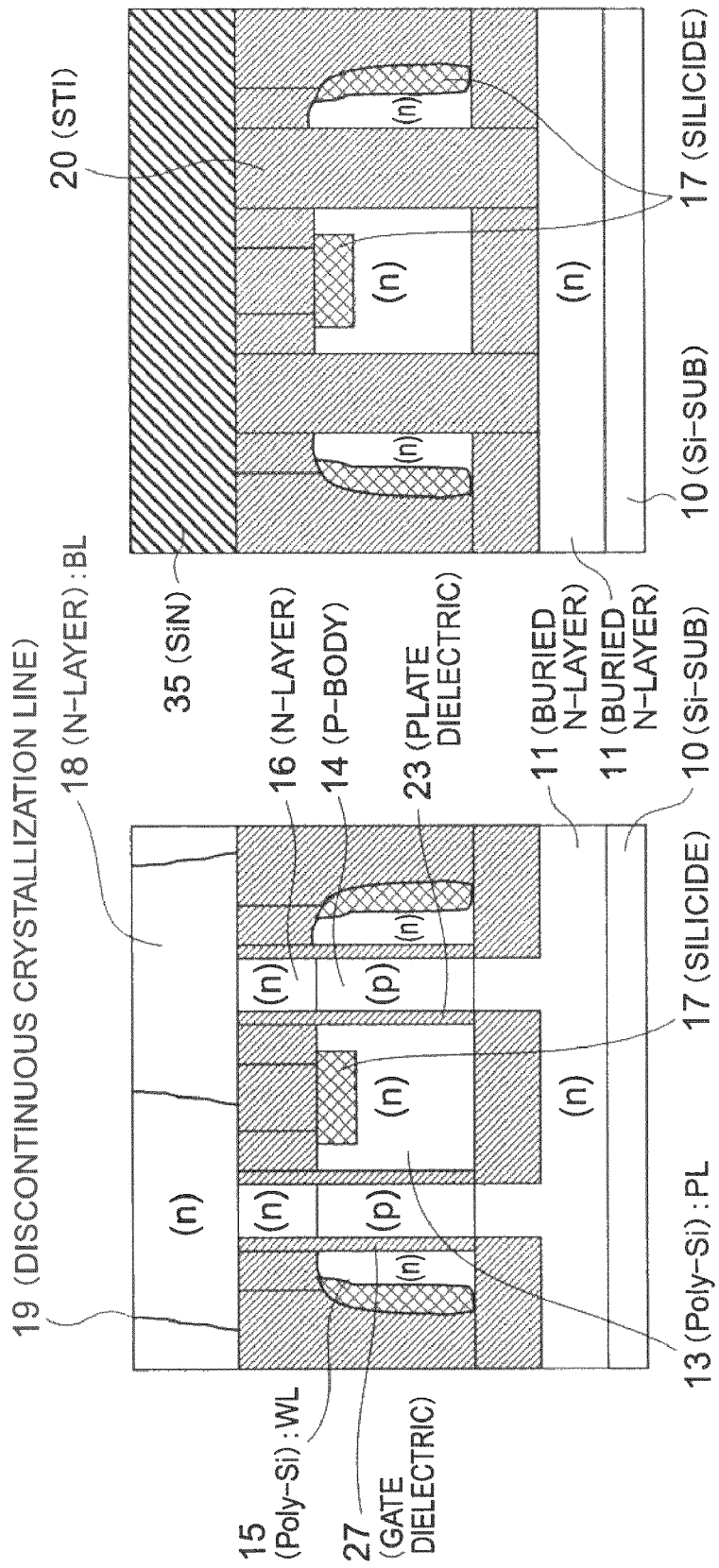

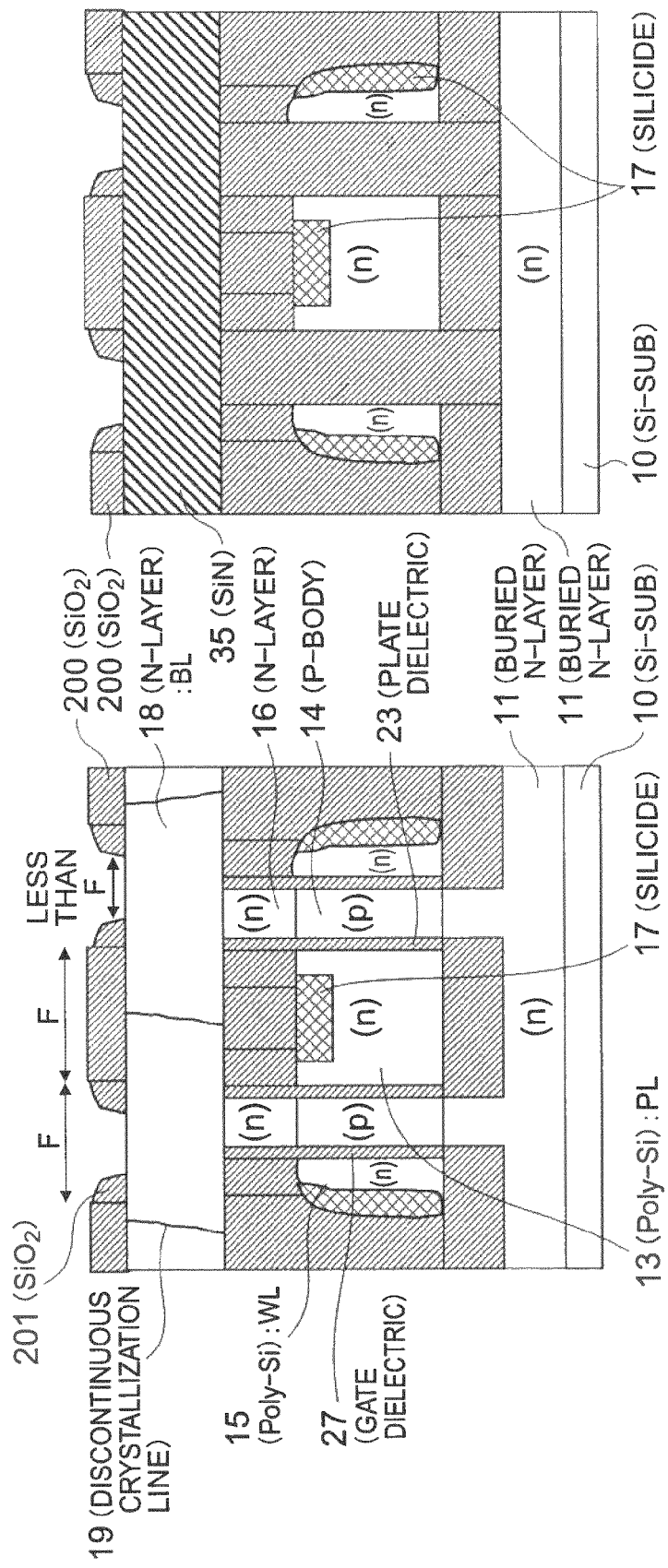

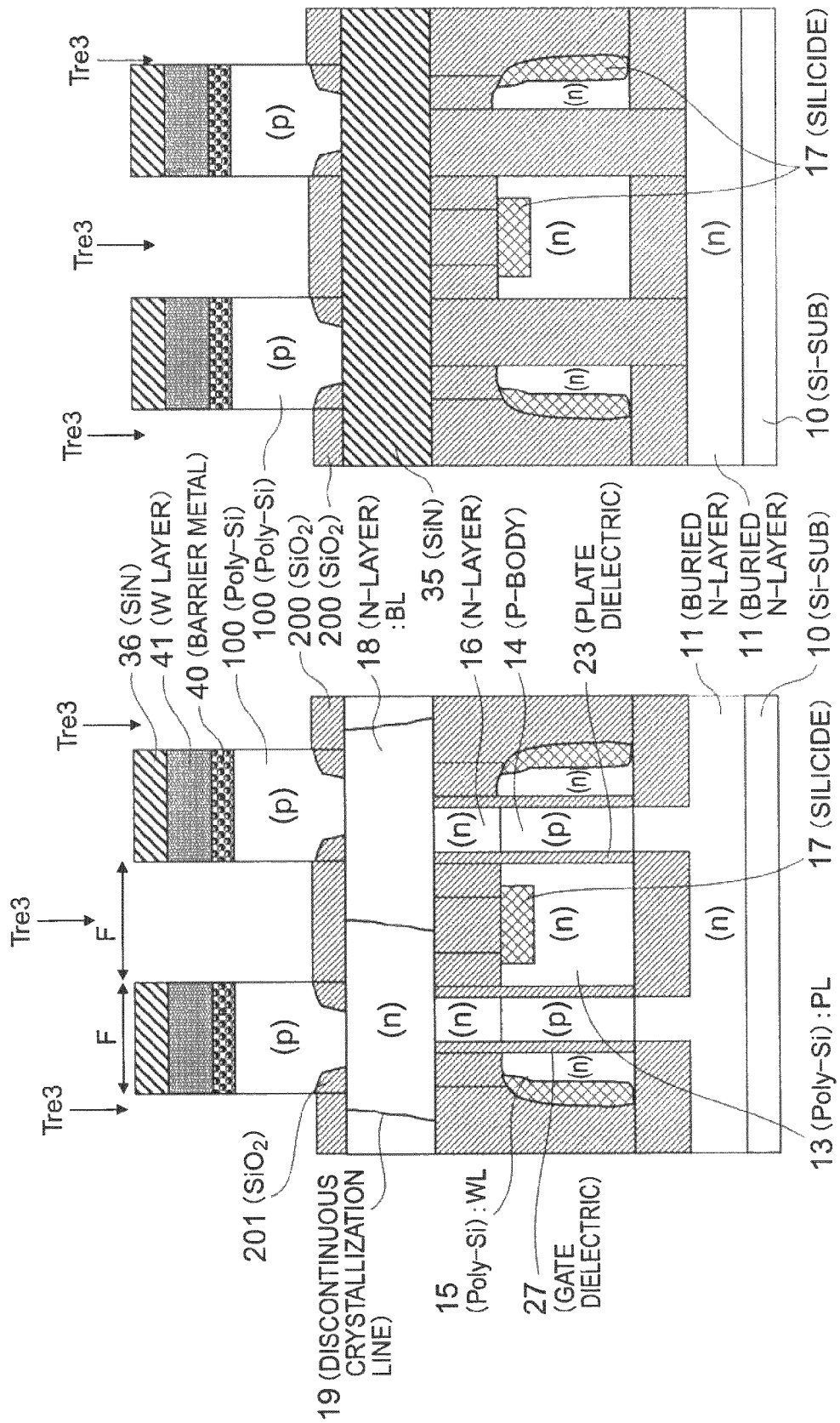

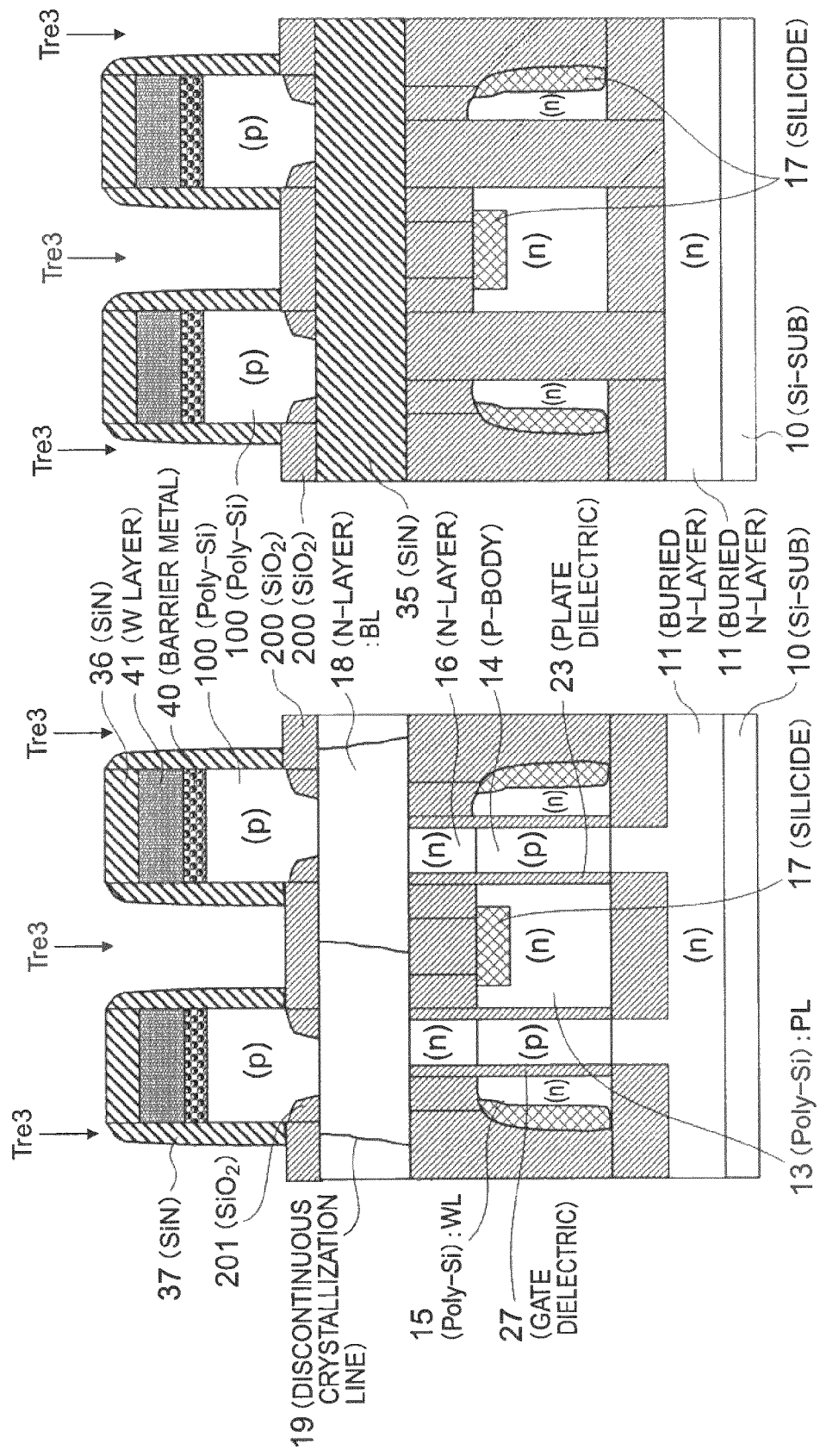

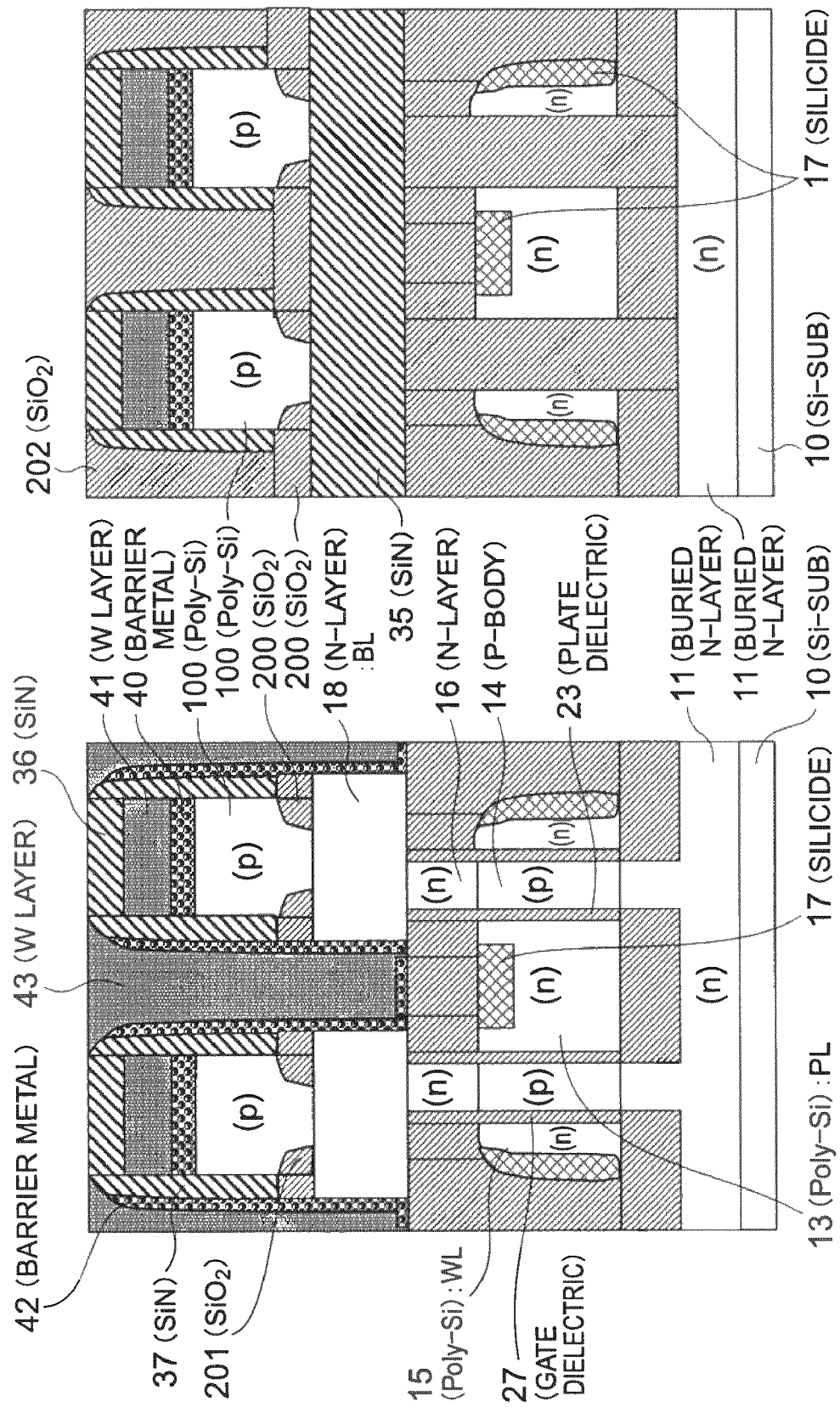

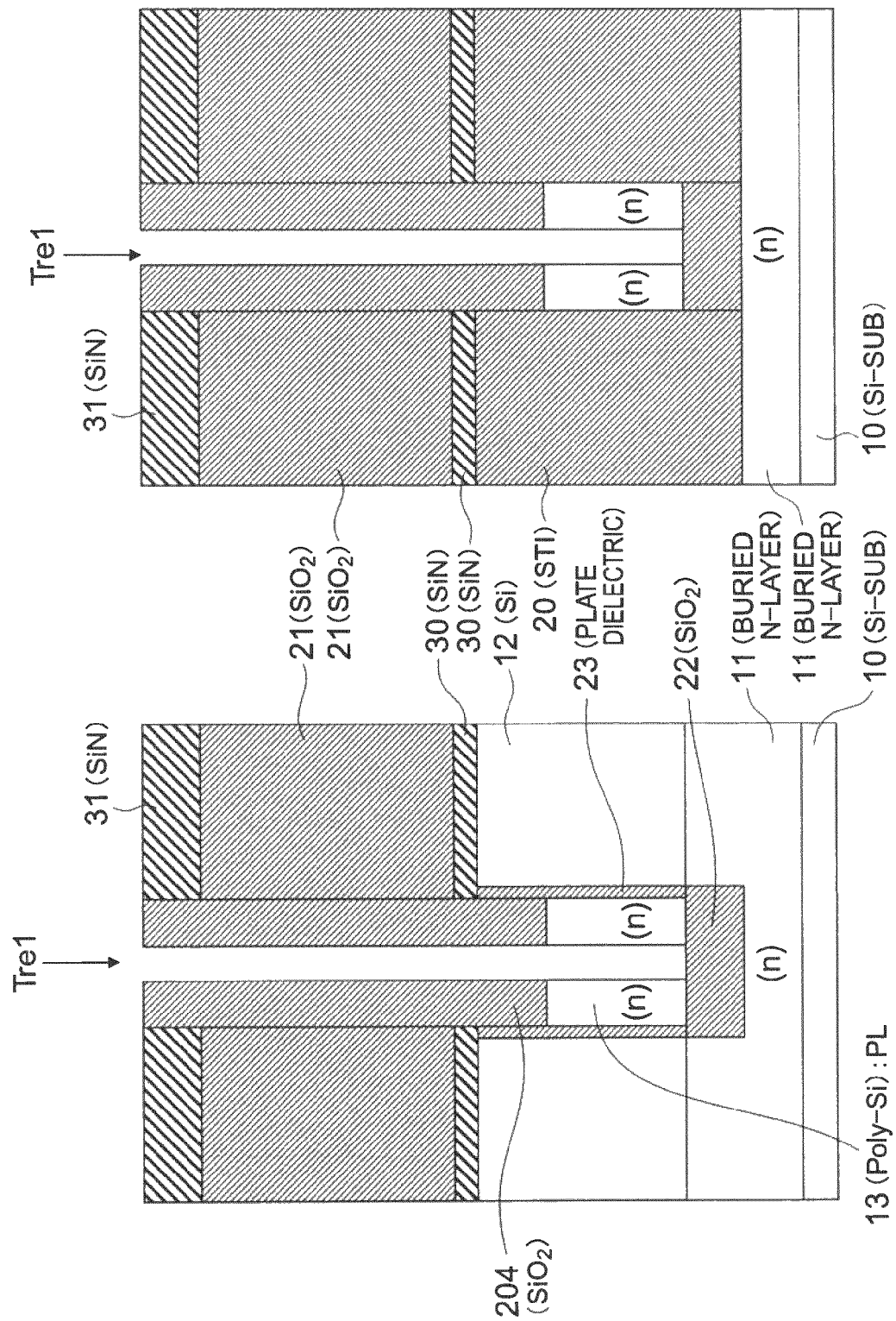

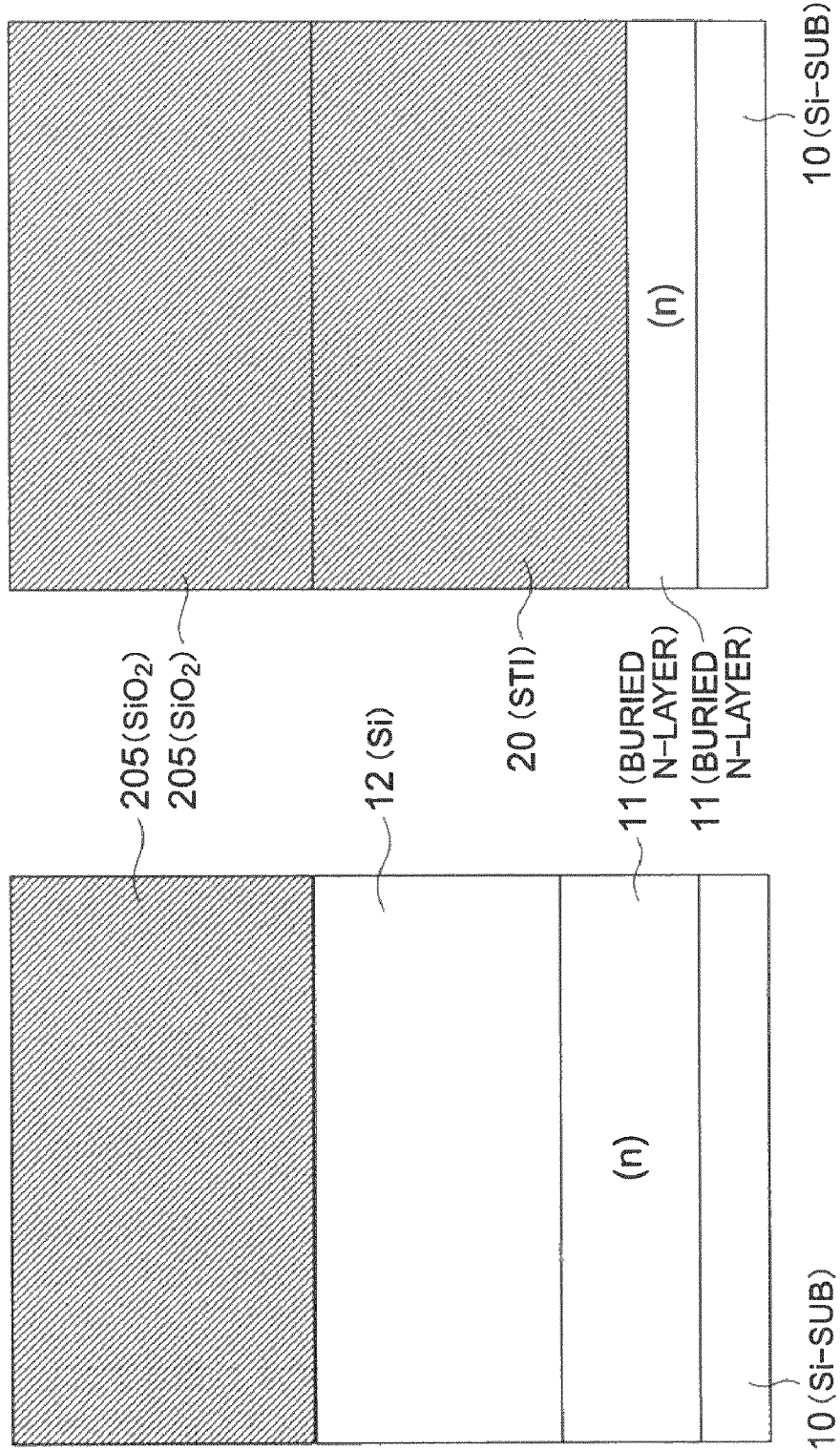

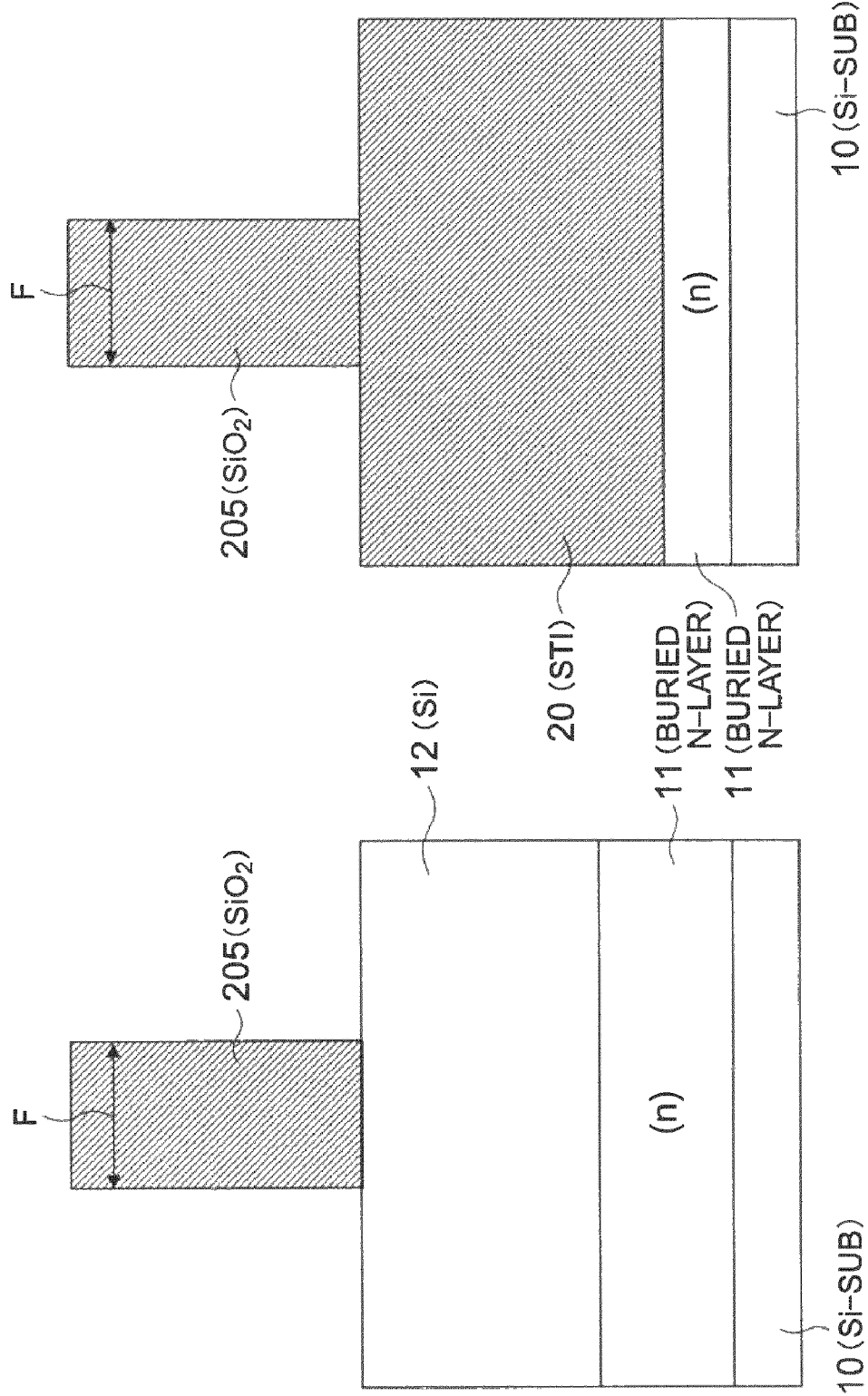

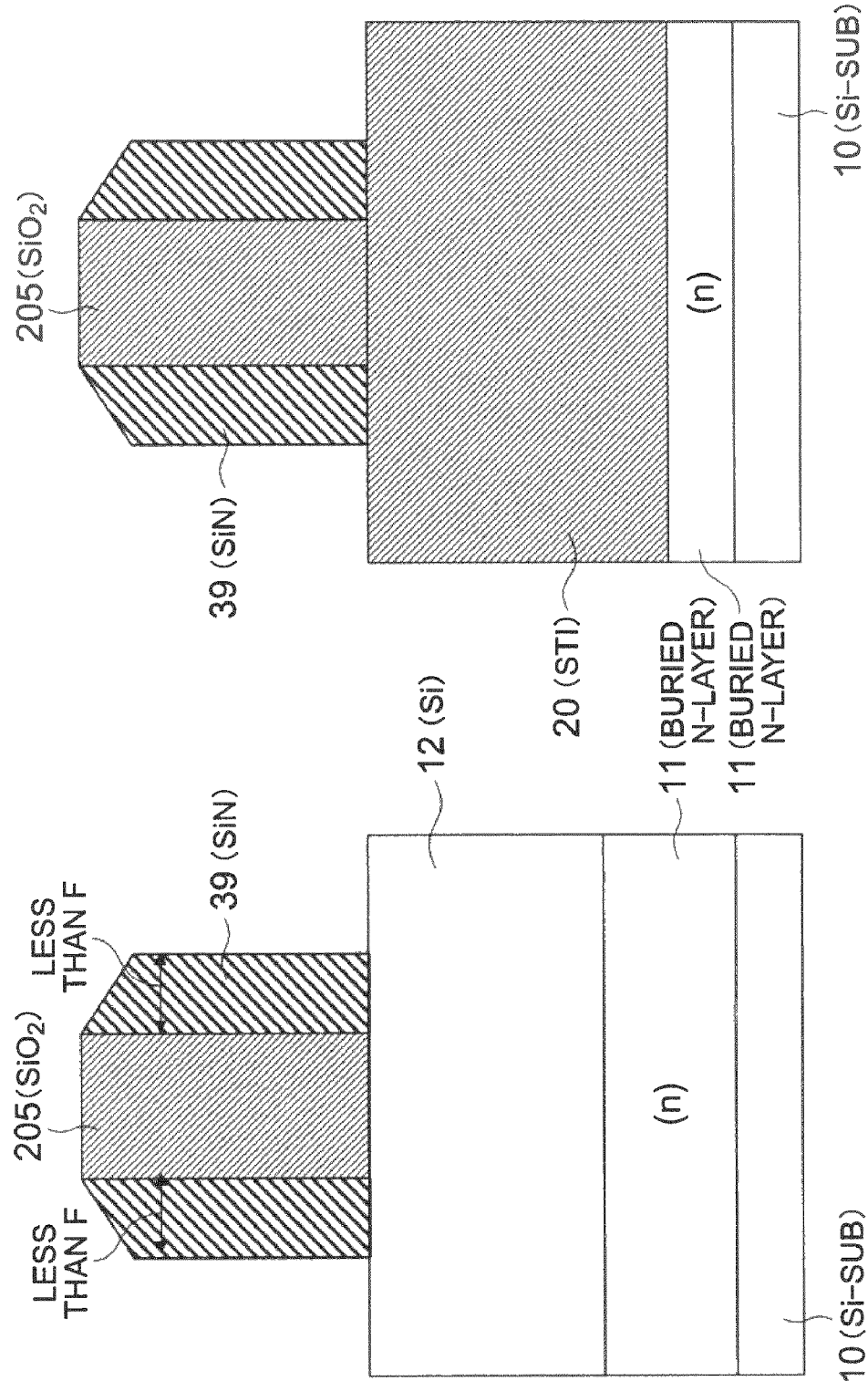

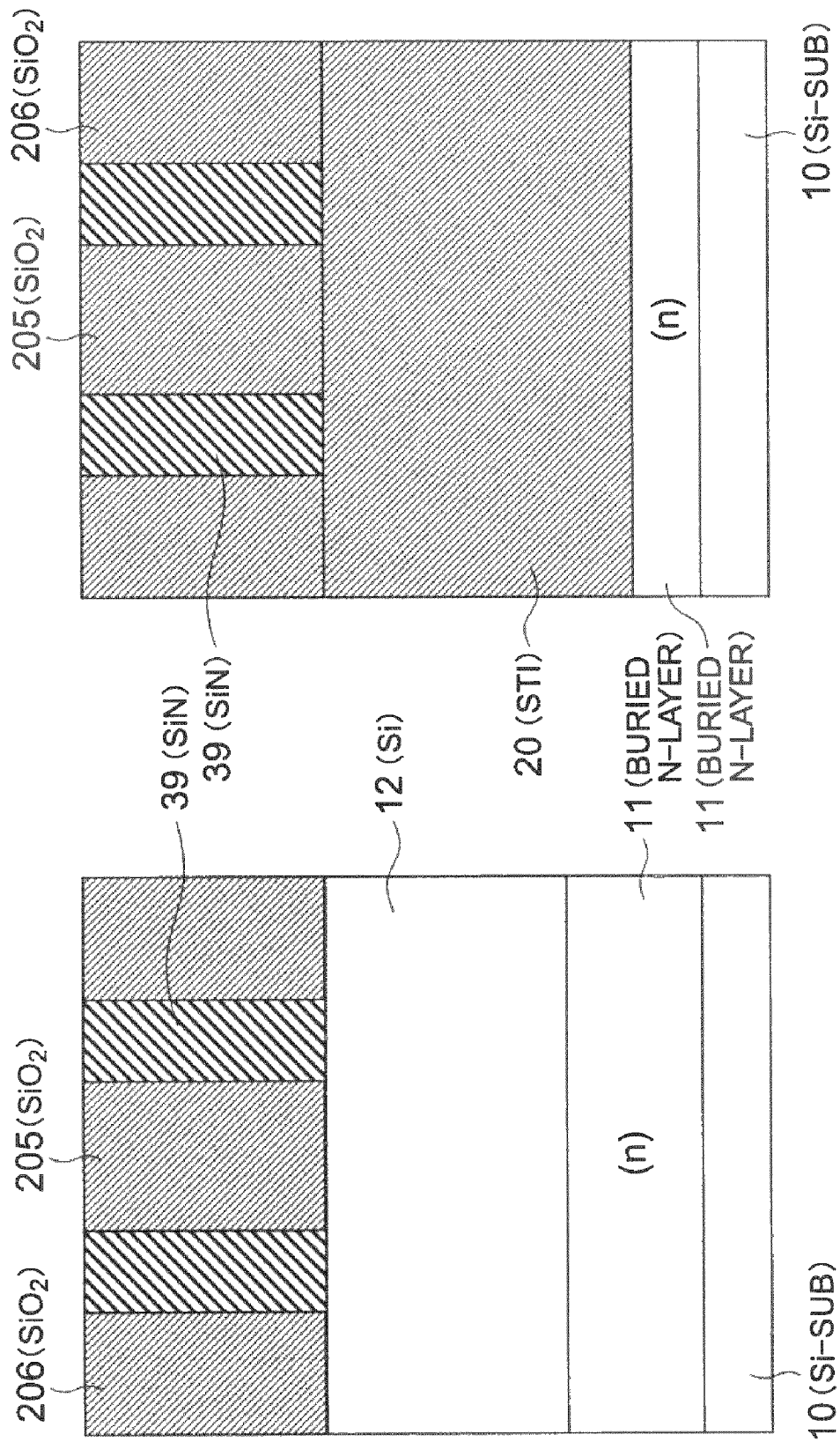

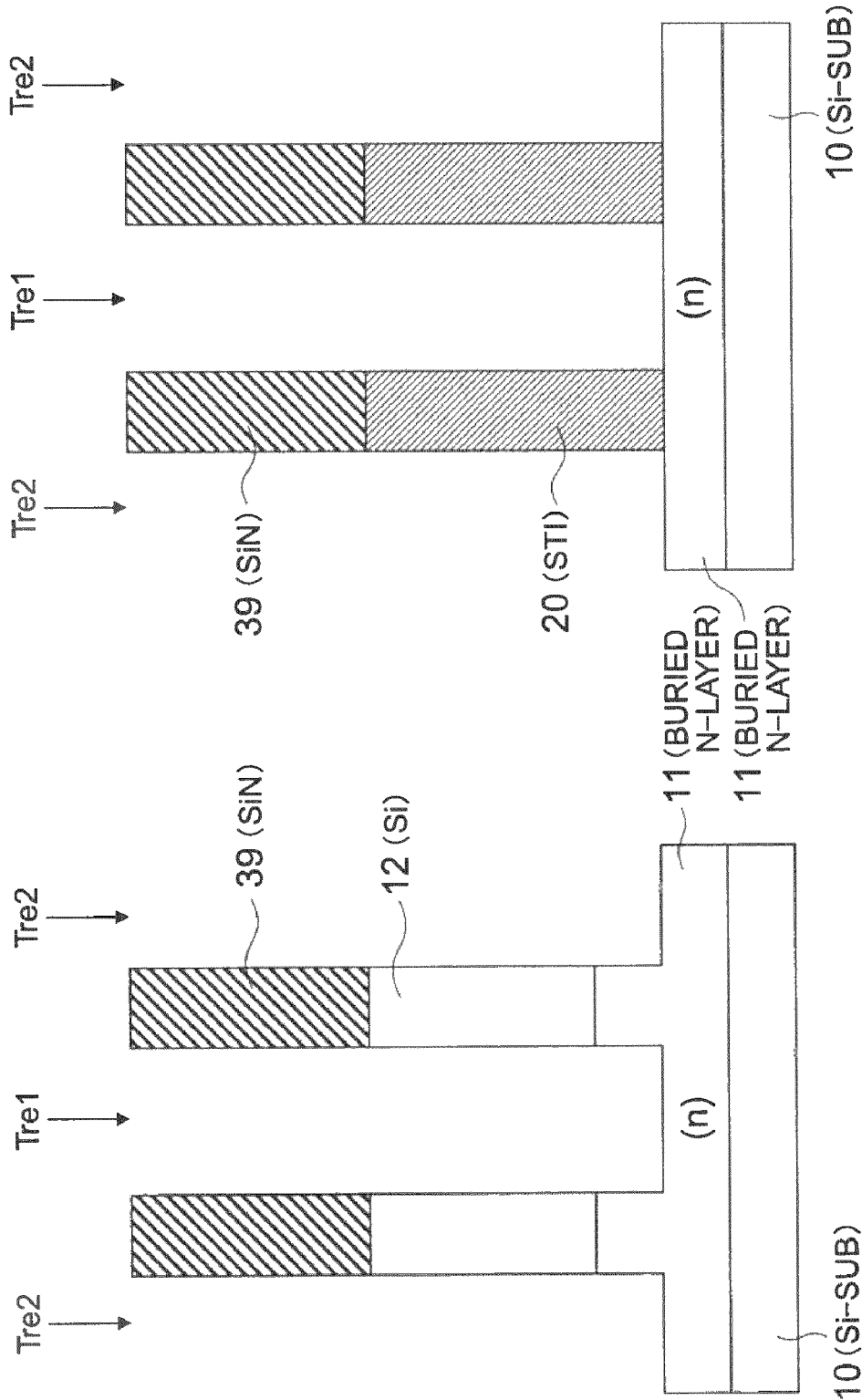

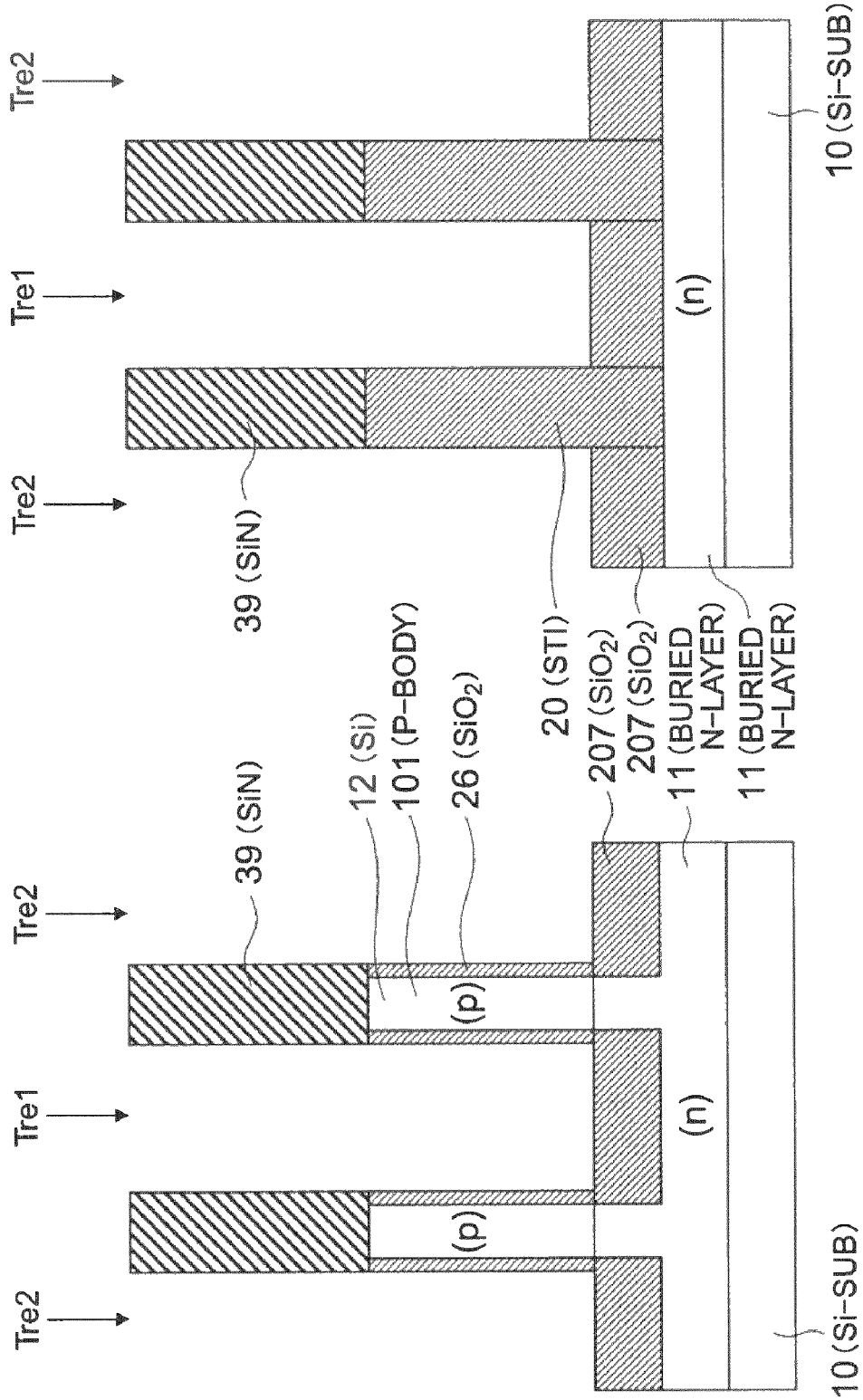

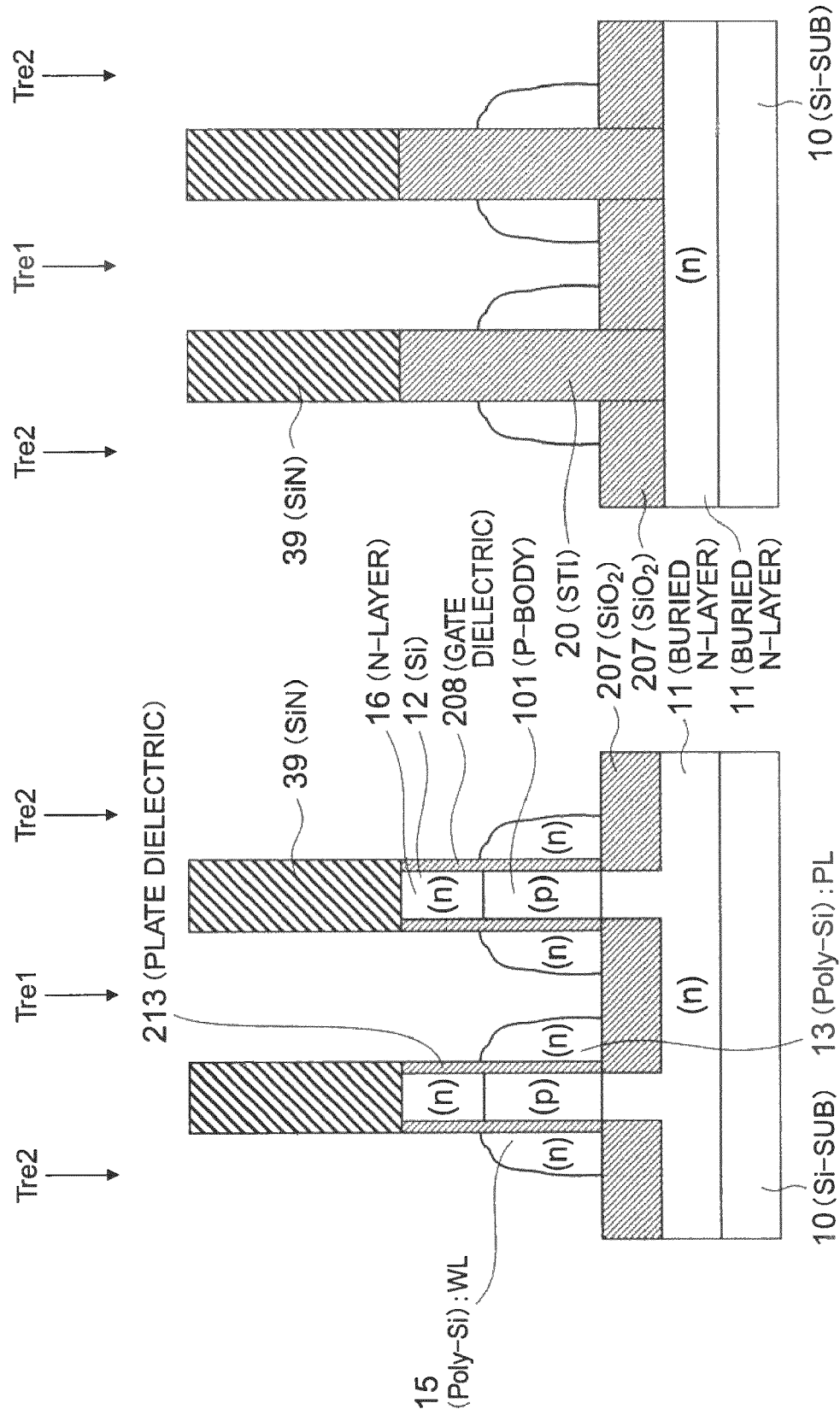

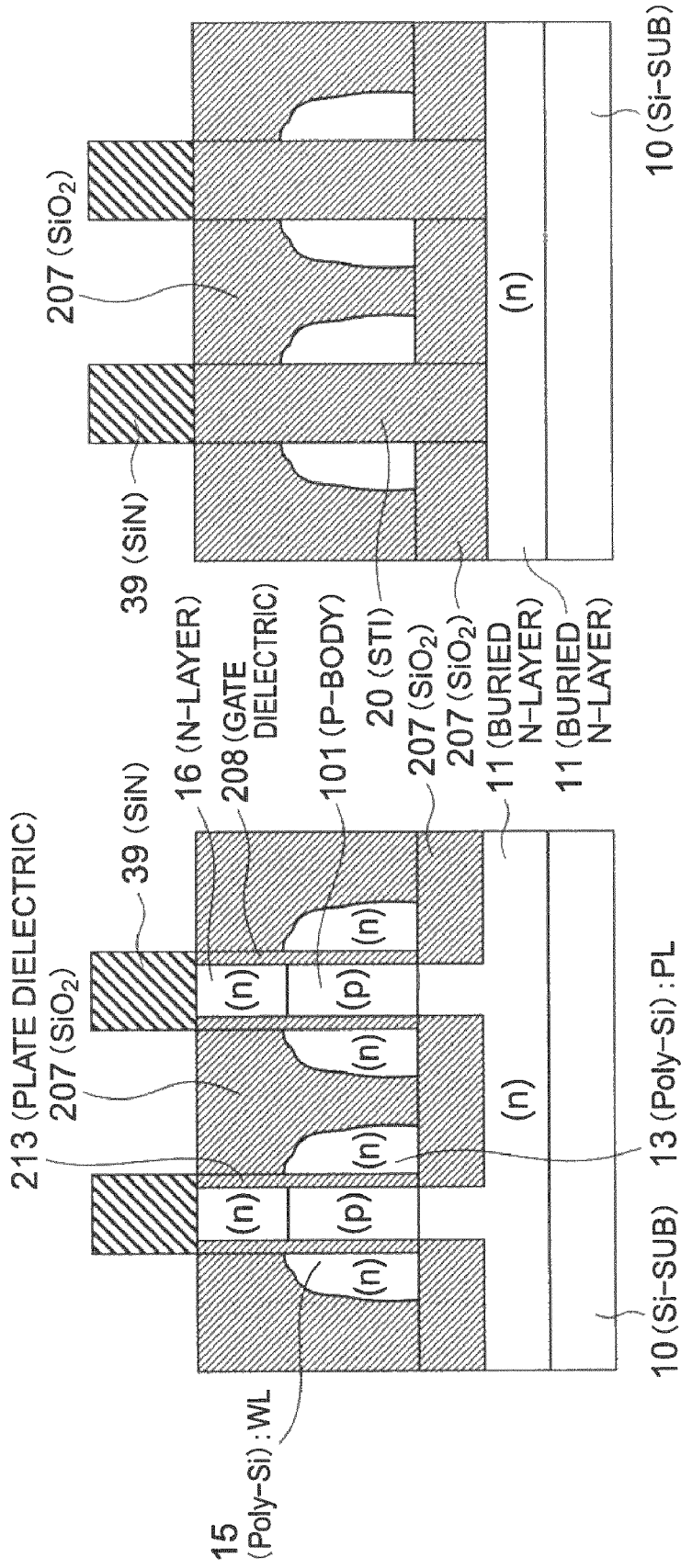

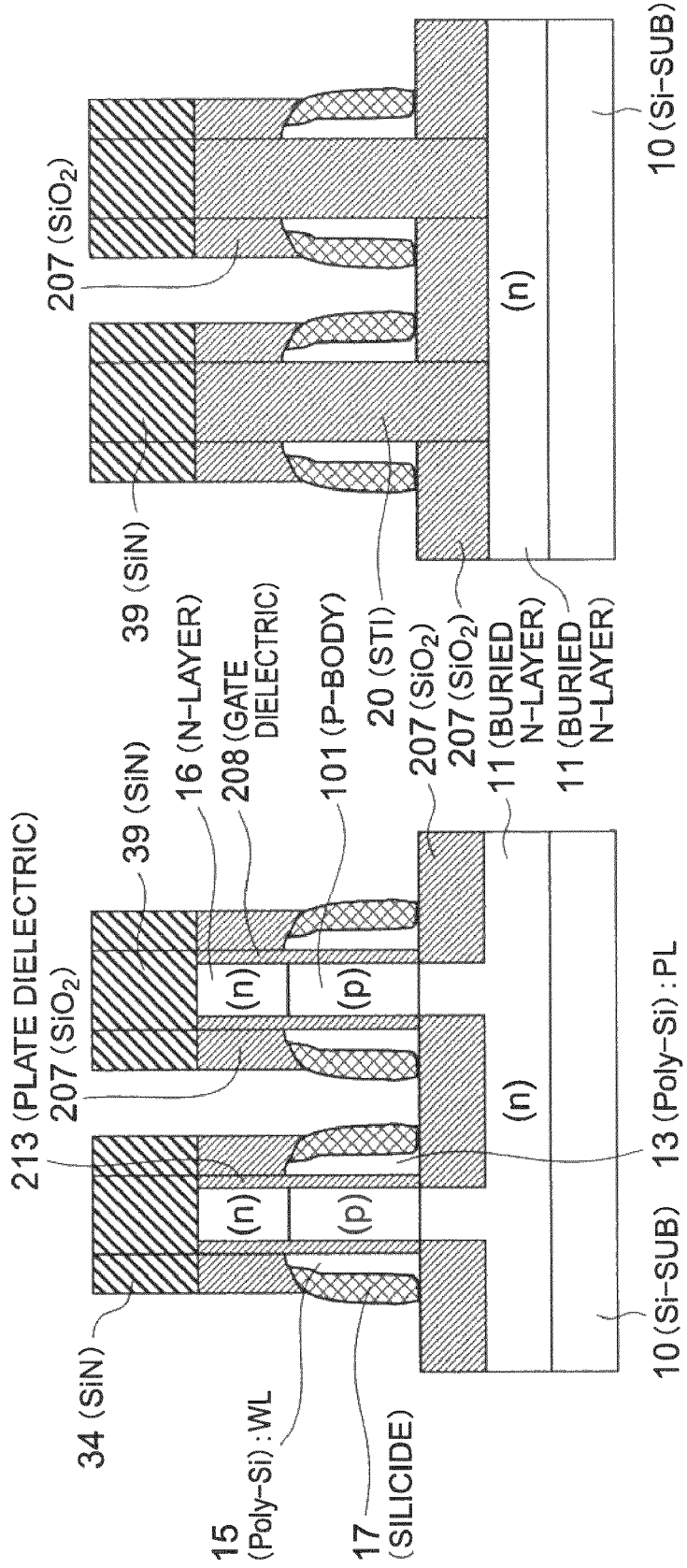

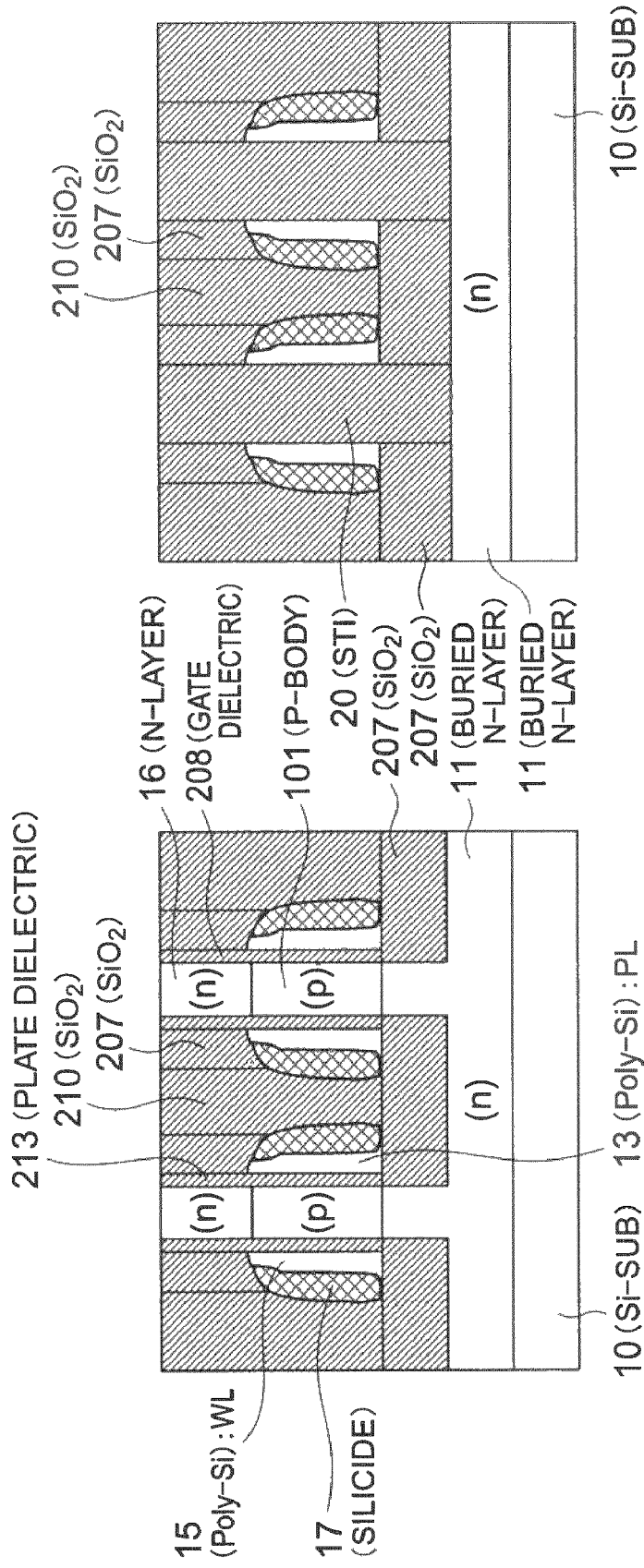

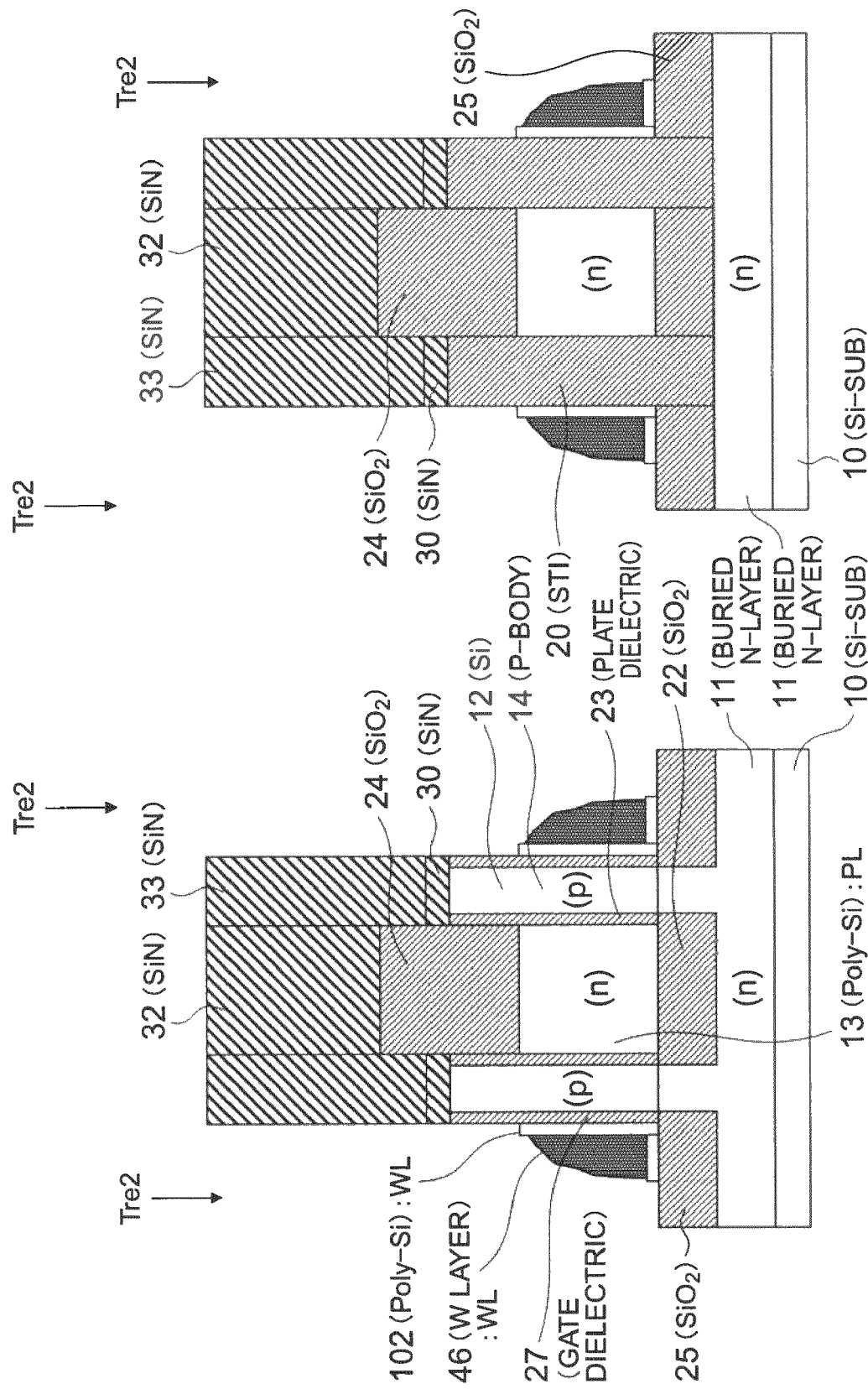

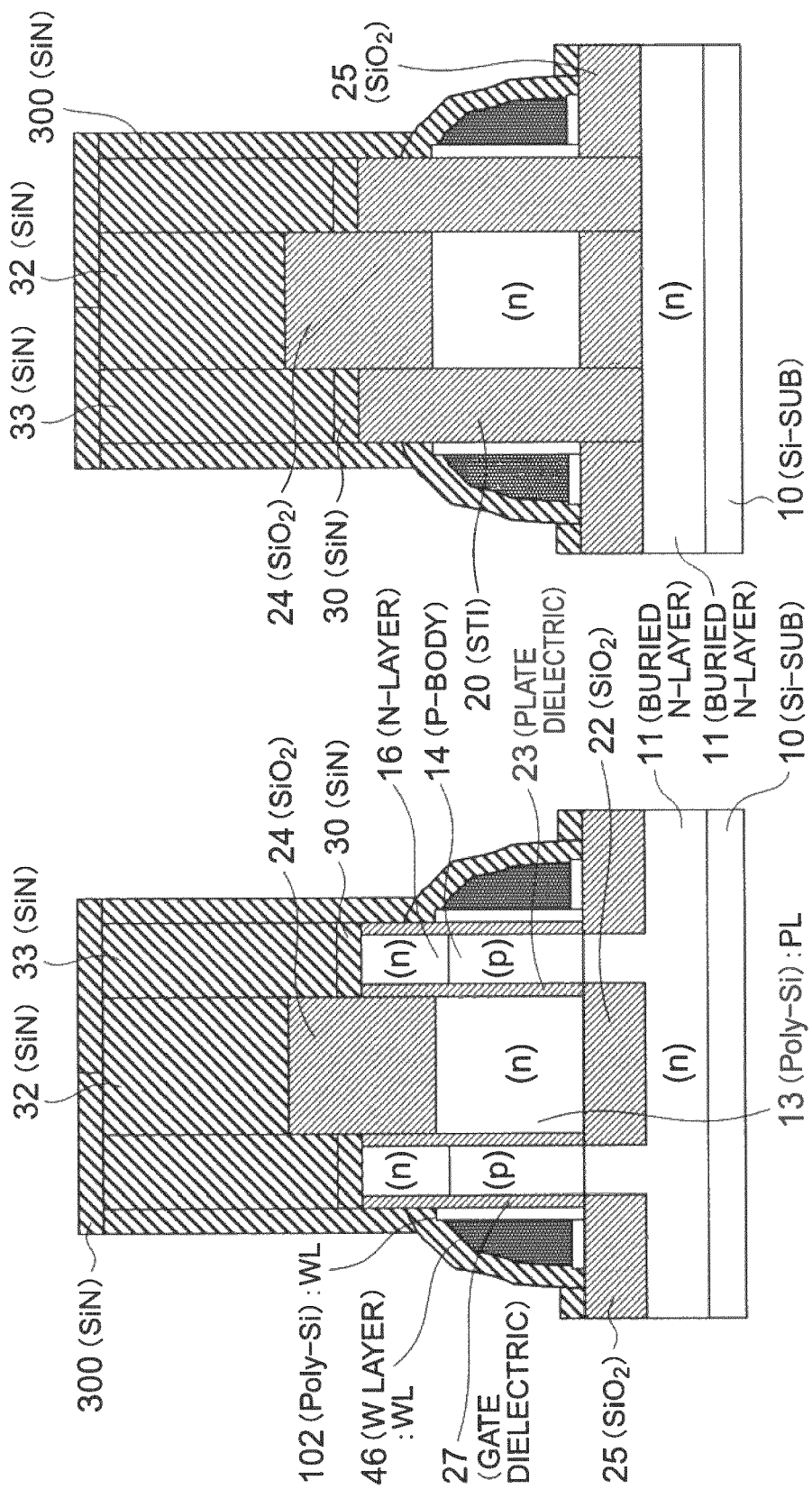

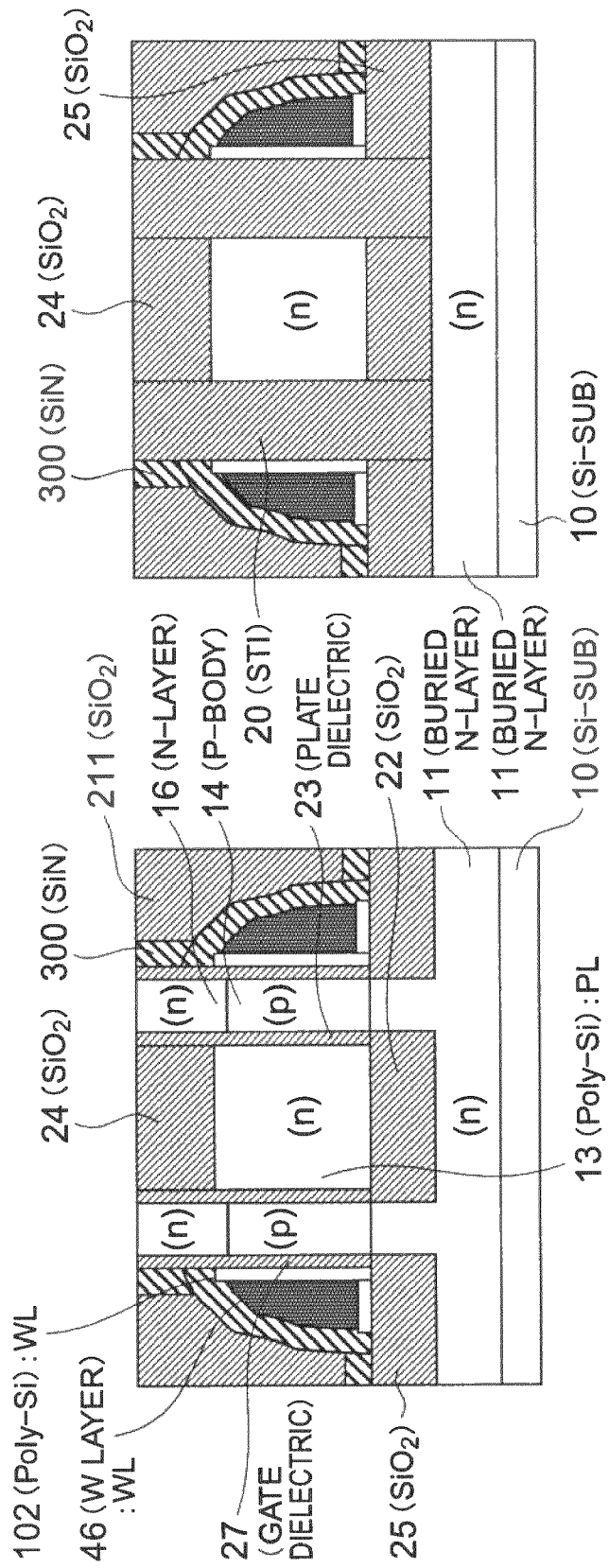

SEMICONDUCTOR MEMORY DEVICE AND MANUFACTURING METHOD THEREOF

CROSS-REFERENCE TO RELATED APPLICATION

This application is based upon and claims the benefit of priority from the prior Japanese Patent Applications No. 2008-193278, filed on Jul. 28, 2008, the entire contents of which are incorporated herein by reference.

BACKGROUND OF THE INVENTION

1. Field of the Invention

This invention relates to a semiconductor memory device and a manufacturing method thereof.

2. Related Art

Recently, FBCs (Floating Body Cells) have been expected to serve as memories alternative to 1T(Transistor)-1C(Capacitor) DRAMs. The FBC is provided with an FET (Field Effect Transistor) that has a floating body (hereinafter also, body) on an SOI (Silicon On Insulator) substrate, and stores therein data "1" or "0" depending on the number of majority carriers accumulated in the body. For example, when the number of majority carriers in the body is large, the data "1" is stored. When the number of majority carriers in the body is small, the data "0" is stored.

Bipolar writing is used as a method for writing data "1". According to the bipolar writing, a forward bias is applied to a PN junction between an emitter layer and a drain layer and majority carriers are charged in a channel body. The emitter layer has the opposite conductivity type to that of the drain layer and is adjacent to the drain layer. The bipolar writing enables the data "1" to be written in memory cells at higher speed as compared to writing based on an impact ionization current.

However, bipolar-write FBCs have a unit cell size of about 16 $F^2$ because emitter layers needs to be added. F indicates a size unit when the minimum pitch size of bit lines is 2 F and can be used as an indicator of the unit cell size regardless of the degree of downscaling. The unit cell size of ordinary FBCs without emitter layers is 4 $F^2$ to 6 $F^2$. Thus, the cell size of the bipolar-write FBC becomes an issue.

SUMMARY OF THE INVENTION

A semiconductor memory device according to an embodiment of the present invention comprises: bodies electrically floating and accumulate or discharge carriers to store therein data; sources, each of which is adjacent to one of a top surface and a bottom surface of one of the bodies; drains, each of which is adjacent to the other one of the top surface and the bottom surface of the one of the bodies; gate electrodes, each of which is adjacent to one side surface of the one of the bodies via a gate dielectric film; plates, each of which is adjacent to the other side surface of the one of the bodies via a plate dielectric film; first bit lines on the drains, the first bit lines including a semiconductor with a same conductivity type as that of the drains; and emitters on the semiconductor of the first bit lines, the emitters including a semiconductor with an opposite conductivity type to that of the semiconductor of the first bit lines, wherein
the emitters are stacked above the bodies and the drains.

A manufacturing method of a semiconductor memory device according to an embodiment of the present invention comprises: forming a buried layer in a semiconductor substrate; forming an isolation extending in a first direction and reaching the buried layer in the semiconductor substrate; forming first trenches extending in a second direction crossing the first direction and reaching the buried layer in the semiconductor substrate; forming plate dielectric films on inner side surfaces of the first trenches; forming plates within the first trenches so as to be isolated from the semiconductor substrate by the plate dielectric films; forming a second trench between the plates adjacent to each other in the first direction, so that the semiconductor substrate between one of the first trenches and the second trench is provided as a body layer, the second trench extending in the second direction and reaching the buried layer; forming a gate dielectric film on an inner side surface of the second trench; forming a gate electrode on the inner side surface of the second trench via the gate dielectric film; introducing impurities into the body layer by using the gate electrode as a mask to form a drain layer; burying an insulation film in the second trench; exposing top surfaces of the drain layers; forming first bit lines including semiconductors with a same conductivity type as that of the drain layer on the top surfaces of the drains; and forming emitters including semiconductors with an opposite conductivity type to that of the drain on the top surface of the first bit lines above the bodies and the drain layers.

A manufacturing method of a semiconductor memory device according to an embodiment of the present invention comprises: forming a buried layer in a semiconductor substrate; forming an isolation extending in a first direction and reaching the buried layer in the semiconductor substrate; forming first trenches and second trenches extending in a second direction crossing the first direction and reaching the buried layer in the semiconductor substrate, the semiconductor substrate between one of the first trenches and the second trench being provided as a body layer; forming plate dielectric films on inner side surfaces of the first trenches and simultaneously forming gate dielectric films on inner side surfaces of the second trenches; forming plates within the first trenches so as to be isolated from the semiconductor substrate by the plate dielectric films and simultaneously forming gate electrodes within the second trenches so as to be isolated from the semiconductor substrate by the gate dielectric films; introducing impurities into the body layer by using the gate electrodes or the plates as a mask to form a drain layer; burying insulation films in the first and the second trenches; exposing top surfaces of the drain layers; forming first bit lines including semiconductors with a same conductivity type as that of the drain layer on the top surfaces of the drains; and forming emitters including semiconductors with an opposite conductivity type to that of the drain on the top surface of the first bit lines above the bodies and the drain layers.

BRIEF DESCRIPTION OF THE DRAWINGS

FIGS. 6A to 28B are cross sections showing a manufacturing method of the FBC according to the first embodiment;

FIGS. 32A to 34B are cross sections showing a manufacturing method of the FBC according to the second embodiment;

FIGS. 37A to 50B are cross sections showing a manufacturing method of the FBC according to the third embodiment;

FIGS. 53A to 56B are cross sections showing a manufacturing method of the FBC according to the fourth embodiment;

FIGS. 59A to 62B are cross sections showing a manufacturing method of the FBC according to the fifth embodiment;

DETAILED DESCRIPTION OF THE INVENTION

Embodiments of the present invention will be explained below in detail with reference to the accompanying drawings. Note that the invention is not limited thereto.

First Embodiment

Figure 1:
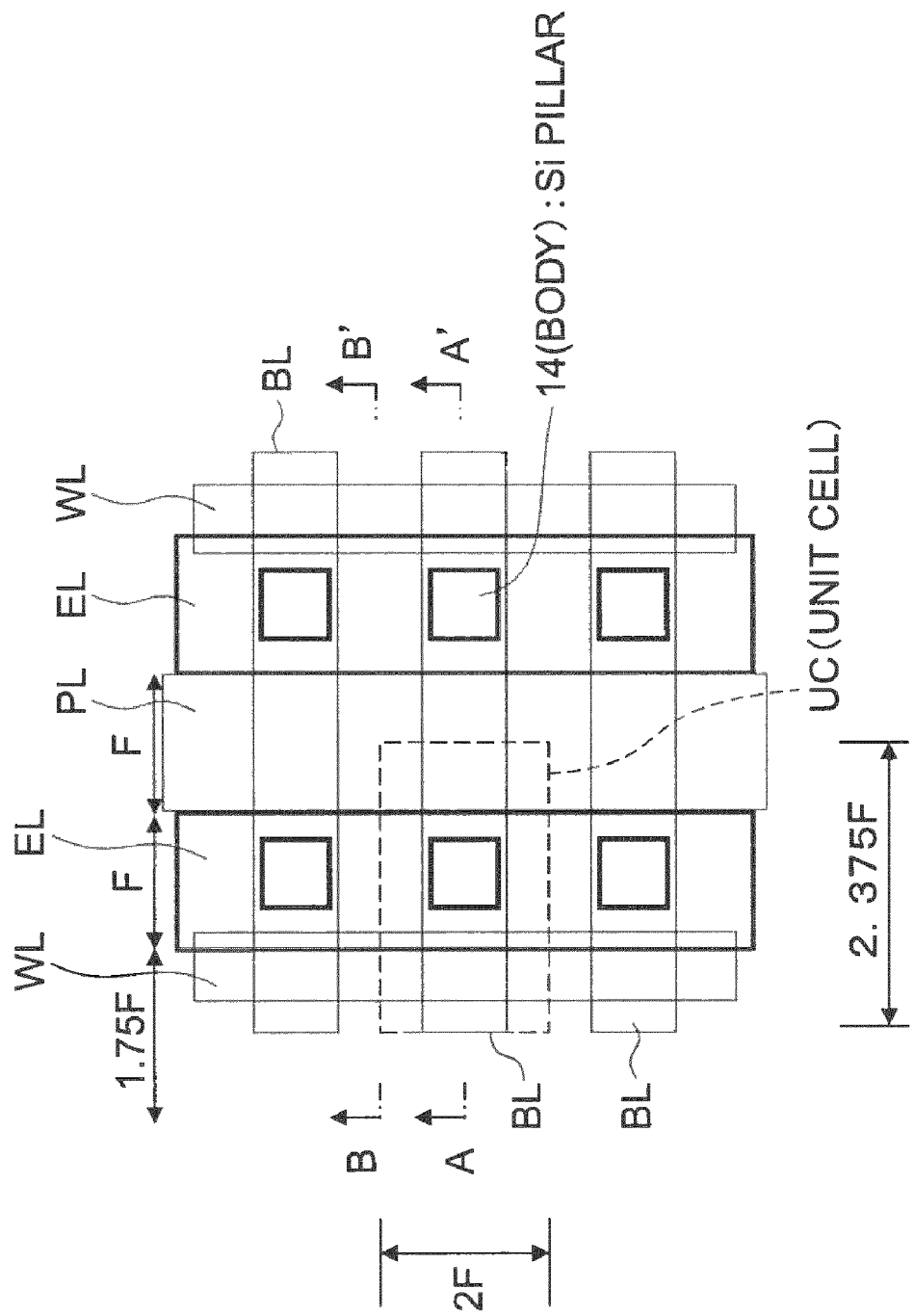
FIG. 1 is a plan view of a cell array area in a bipolar-write FBC according to a first embodiment of the present invention.
Figure 2:
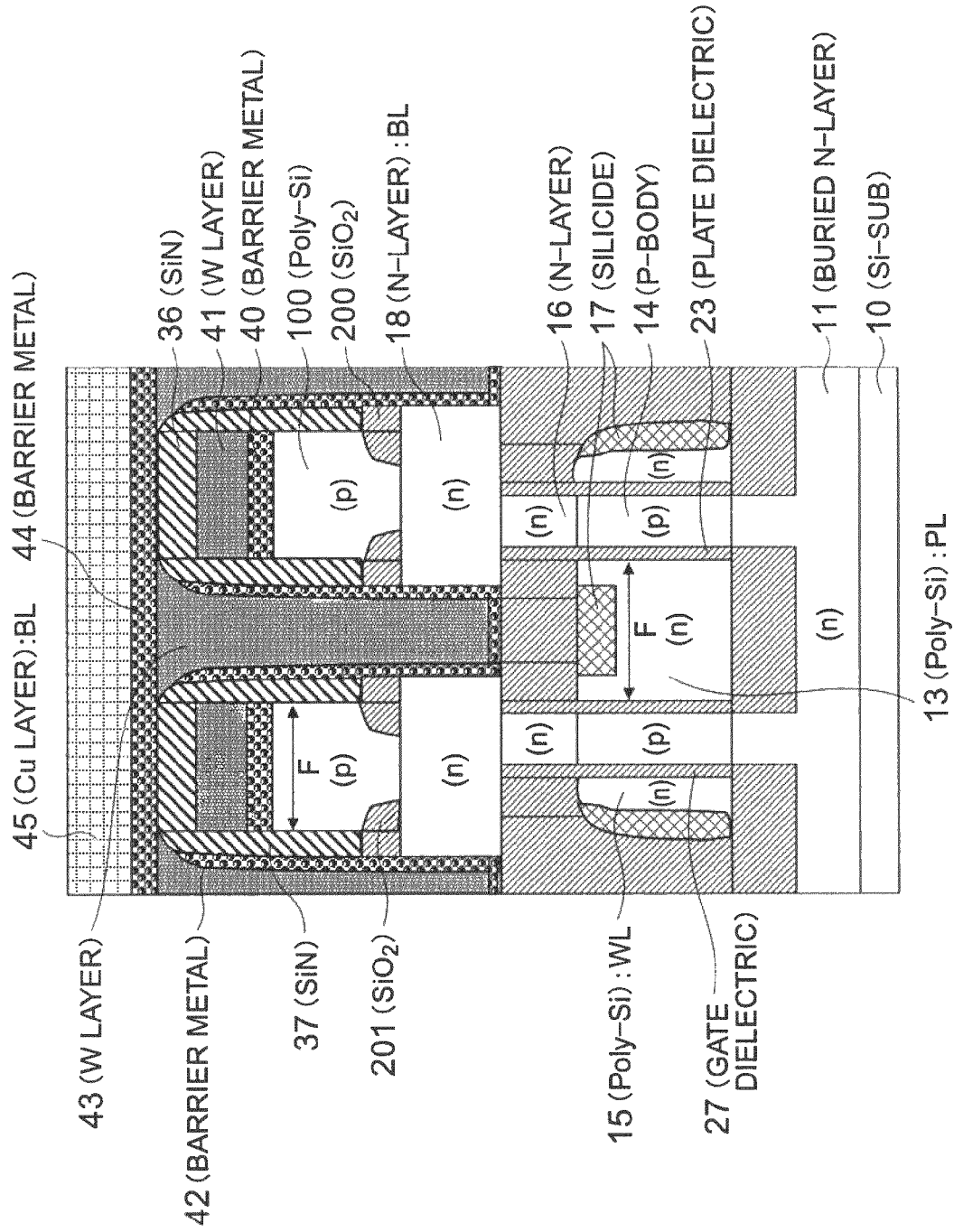
FIG. 2 is a cross-sectional view along a line A-A' shown in FIG. 1.
Figure 3:
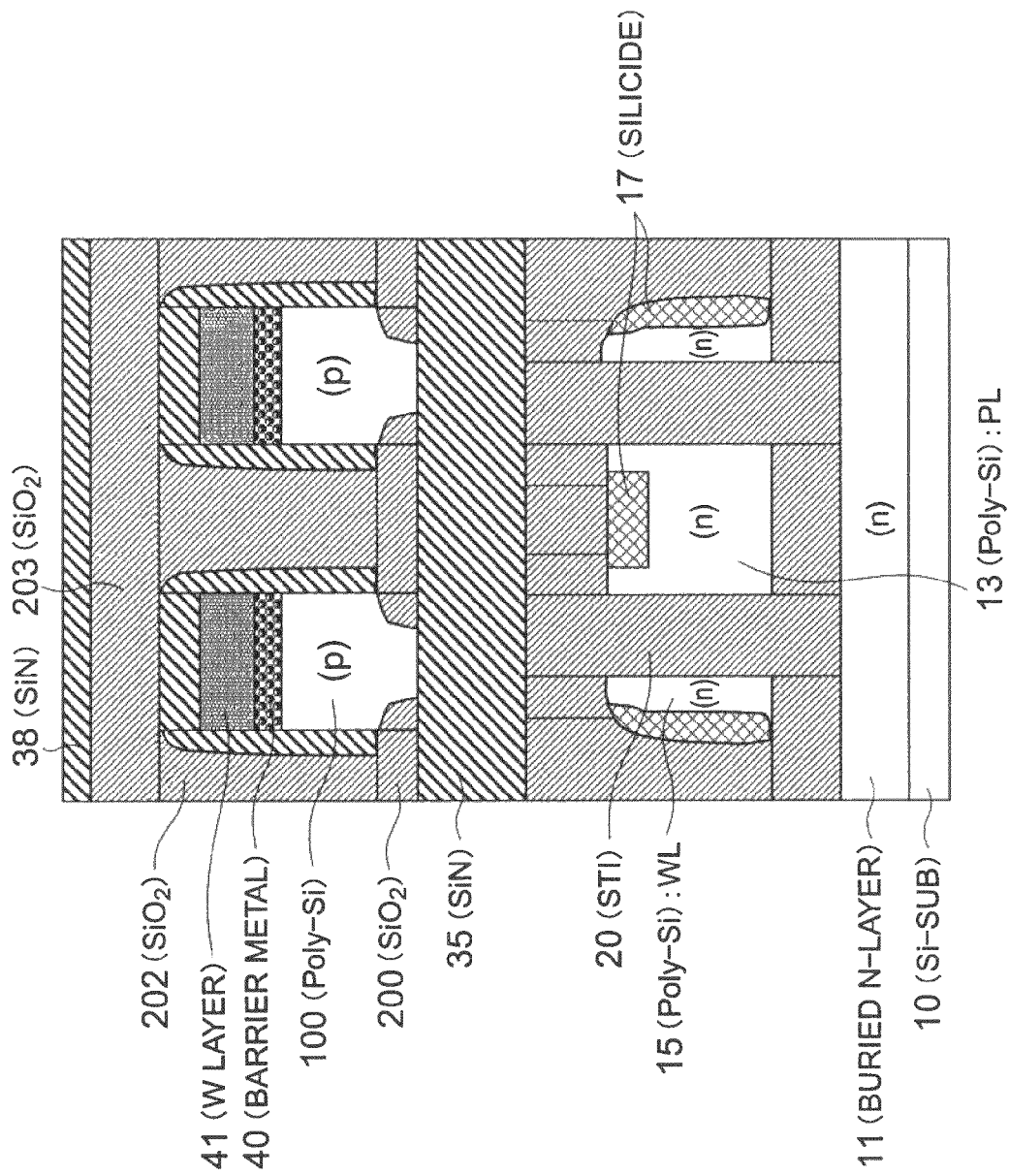
FIG. 3 is a cross-sectional view along a line B-B' shown in FIG. 1.

FIG. 1 is a plan view of a cell array area in a bipolar-write FBC according to a first embodiment of the present invention, FIG. 2 is a cross-sectional view along a line A-A' shown in FIG. 1, and FIG. 3 is a cross-sectional view along a line B-B' shown in FIG. 1.

A plurality of bit lines BL extend in a column direction serving as a first direction and are formed in a stripe shape on a plane. A plurality of word lines WL, a plurality of plate lines PL, and a plurality of emitter lines EL extend in a row direction serving as a second direction perpendicular to the column direction and are also formed in stripe shapes on the plane.

In the first embodiment, the emitter line EL is provided above a body 14 (silicon pillar) so as to overlap with the body 14 when seeing from above a substrate. The emitter line EL also overlaps with part of the word line WL. With this configuration, a unit cell UC of the first embodiment has a size of 4.75 $F^2$. This size is significantly smaller than those of conventional bipolar-write FBCs with reference to FIG. 1. As shown in FIG. 1, the column direction width of the emitter line EL and the plate line PL is indicated by F. To form a silicide 17 on a side surface of the word line WL, the distance between the emitter lines EL adjacent to each other on the word line WL side is set to 1.75 F.

FIG. 2 shows two memory cells adjacent to each other in the column direction. A buried N-layer 11 is formed on a silicon substrate 10. The buried N-layer 11 functions as a common source. The body 14 made of a P-type semiconductor is formed on the buried N-layer 11. The body 14 is electrically floating and accumulates or releases carriers to store therein data. Each memory cell includes one body 14. A bottom surface of the body 14 is adjacent to the buried N-layer 11. The buried N-layer 11 functions as the common source. An N-type drain 16 is adjacent to a top surface of the body 14.

The body 14 and the drain 16 have oblong shapes extending substantially in a vertical direction to the surface of the silicon substrate 10 in a cross-section cut in the column direction. The body 14 and the drain 16 are formed within a silicon pillar formed on the buried N-layer 11.

In the cross-section cut in the column direction, one side surface of the body 14 is adjacent to a word line (gate electrode) 15 with a gate dielectric film 27 interposed therebetween. The other side surface of the body 14 is adjacent to the plate line PL with a plate dielectric film 23 interposed therebetween. The memory cell of the first embodiment is thus configured by a double-gate MOS transistor. The word line 15 and the plate line PL are made of polysilicon. The plate line PL is shared by two memory cells adjacent to each other in the column direction. The cobalt silicide 17 is formed on the side surface of the word line WL and the top surface of the plate line PL to reduce a gate resistance and a plate resistance.

An N-type silicon layer 18 formed by selective epitaxial growth is provided on the N-type drain 16 with the same conductivity type to contact the same. The N-type silicon layer 18 is connected via a barrier metal 42, a tungsten plug 43, and a barrier metal 44 to a copper wire 45 extending in the column direction.

The tungsten plug 43 serving as a bit contact is provided between two emitter layers (100) adjacent to each other in the column direction and contacts the side surfaces of the silicon layer 18 while isolated from the emitter layer (100). A plurality of the silicon layers 18 are connected together intermittently in the column direction by the tungsten plug 43 to constitute a first bit line BL.

The copper wire 45 is provided above the first bit line BL and the emitter layer (100) so as to reduce a resistance of the first bit line BL. The copper wire 45 extends in the column direction like the first bit line BL and is arranged in a stripe shape on a plane. The copper wire 45 is connected via the tungsten plug 43 to the silicon layer 18 while isolated from the emitter layer (100). The copper wire 45 thus constitutes a second bit line BL. That is, a pair of one silicon layer 18 and one corresponding copper wire 45 functions as one bit line BL.

In the first embodiment, two silicon layers 18 of the memory cells adjacent to each other in the column direction (hereinafter also, adjacent cells) are physically separated by the barrier metal 42 and the tungsten plug 43. Thus, it is possible to prevent carriers from moving between the adjacent cells because of a junction serving as an obstacle between the silicon layer 18 and the barrier metal 42 or the tungsten plug 43. Meanwhile, the two silicon layers 18 of the adjacent cells are electrically connected to each other at a significantly low resistance with the copper wire 45 serving as the second bit line. If the moving of the carriers presents no problem, the silicon layers 18 of the adjacent cells can be physically connected.

The P-type polysilicon layer 100 is provided on the N-type silicon layer 18 so as to contact the same. The polysilicon layer 100 is electrically connected via a barrier metal 40 to a tungsten wire 41 provided on the barrier metal 40. The polysilicon layer 100 functions as an emitter layer. The barrier metal 40 is titanium, for example.

The tungsten wire 41 is provided in a stripe shape so as to extend in the row direction (vertical direction in FIG. 2). The tungsten wire 41 is provided to correspond to the word line WL and functions as the emitter line EL.

With reference to FIG. 3, an STI (Shallow Trench Isolation) 20 is formed between the plate line PL and the word line WL. Namely, the STI 20 is provided between two bodies adjacent to each other in the row direction and isolates one body from another. Thus, the body 14 does not appear in the cross-sectional view of FIG. 3.

A silicon nitride film SiN is provided between the two N-type silicon layers 18 adjacent to each other in the row direction to isolate one silicon layer 18 from another. Thus, the N-type silicon layer 18 also does not appear in the cross-sectional view of FIG. 3.

A silicon oxide film 203 and a silicon nitride film 38 are provided between the two copper wires 45 adjacent to each other in the row direction and between the two barrier metals 44 adjacent to each other in the row direction, respectively, to isolate them. Thus, the copper wire 45 and the barrier metal 44 also do not appear in the cross-sectional view of FIG. 3.

Because the word line WL, the plate line PL, the emitter layer (100), and the emitter line (40, 41) extend in the row direction, they appear in the cross-sectional view of FIG. 3.

In the first embodiment, the polysilicon layer 100 serving as the emitter layer and the tungsten wire 41 and the barrier metal 40 serving as the emitter line are provided on the body 14 and the drain 16. That is, as shown in FIG. 1, the emitter line EL is provided to overlap with the body 14 in the plan view. The emitter line EL also overlaps with part of the word line WL in the plan view. Accordingly, in the first embodiment, the area of the bipolar-write FBC can thus be reduced as compared to conventional ones.

The side surfaces of the emitter layer (100) and the top and side surfaces of the emitter line (40, 41) are covered with a silicon oxide film 200 and silicon nitride films 36 and 37. The bottom surface of the emitter layer (100) forms a PN junction with the N-type silicon layer 18 having the opposite conductivity type. Accordingly, the emitter layer and the emitter line are isolated from the copper wire 45 serving as the bit line BL, the barrier metals 44 and 42, and the tungsten plug 43 other than the PN junction with the N-type silicon layer 18. The barrier metal 42 is titanium nitride, for example.

According to the first embodiment, the tungsten plug 43 is buried in a contact hole determined in a self-aligned manner depending on the thickness of the silicon nitride film 37. Thus, even if the distances between the emitter lines and the emitter layers of the adjacent cells are less than 1 F, the tungsten plug 43 can pass through between the emitter lines and the emitter layers of the adjacent cells while maintaining the isolation from the emitter lines and the emitter layers. As a result, the area of the bipolar-write FBC can be made smaller than those of the conventional ones.

The plate line PL is shared by the adjacent cells in the first embodiment. Thus, the plate line PL is not operated at high speed during a usual operation. In this case, the silicide 17 does not necessarily need to be provided.

Because the word line WL (polysilicon 15) and the plate line PL (polysilicon 13) are manufactured separately, their materials and conductivity types can be different from each other. Because the gate dielectric film 27 and the plate dielectric film 23 are also manufactured separately, their materials and thicknesses can be different from each other.

An operation of the bipolar-write FBC according to the first embodiment is the same as that of a known bipolar-write FBC. For example, when data "1" is written in a memory cell, about −1.5V is applied to the word line WL, about −1V to the bit line BL, and 0V to the emitter line EL and a source line SL, respectively.

A forward bias is applied to the PN junction between the P-type emitter layer (100) and the N-type drain layer (18). This is equal to a fact that a forward bias is applied to a base-emitter junction of a PNP bipolar transistor formed of the P-type emitter layer (100), the N-type drain layer (18), and the P-type body 14.

Holes are thus implanted from the emitter layer (100) to the drain layer (18), which are equal to holes implanted in a base of the PNP bipolar transistor.

Some of the holes recombine in the drain layer (18) and the remaining holes reach the P-type body 14. According the operation of writing the data "1", the bipolar transistor formed of the P-type emitter layer (100), the N-type drain layer (18), and the P-type body 14 is turned on to implant holes in the body 14 of the FBC.

During the bipolar writing, adjustment of a voltage between the emitter line EL (40, 41) and the bit line BL (18, 45) enables a current (collector current) flowing in the body 14 to be increased easily. The collector current is larger than the impact ionization current. Thus, the data "1" can be written at high speed.

An operation of writing data "0" in the first embodiment is the same as those performed in usual FBCs not bipolar-write ones. For example, a forward bias is applied between the body 14 and the drain 16 to discharge holes in the body 14 to the drain 16. As a result, the "0" data is written. A data reading operation in the first embodiment can be also the same as those of the usual FBCs.

According to the first embodiment, the cell size can be reduced as compared to the conventional bipolar-write FBCs. Further, the data-"1" writing operation can be performed at higher speed than in the usual FBCs.

A manufacturing method of the FBC according to the first embodiment is described next.

Figure 4:
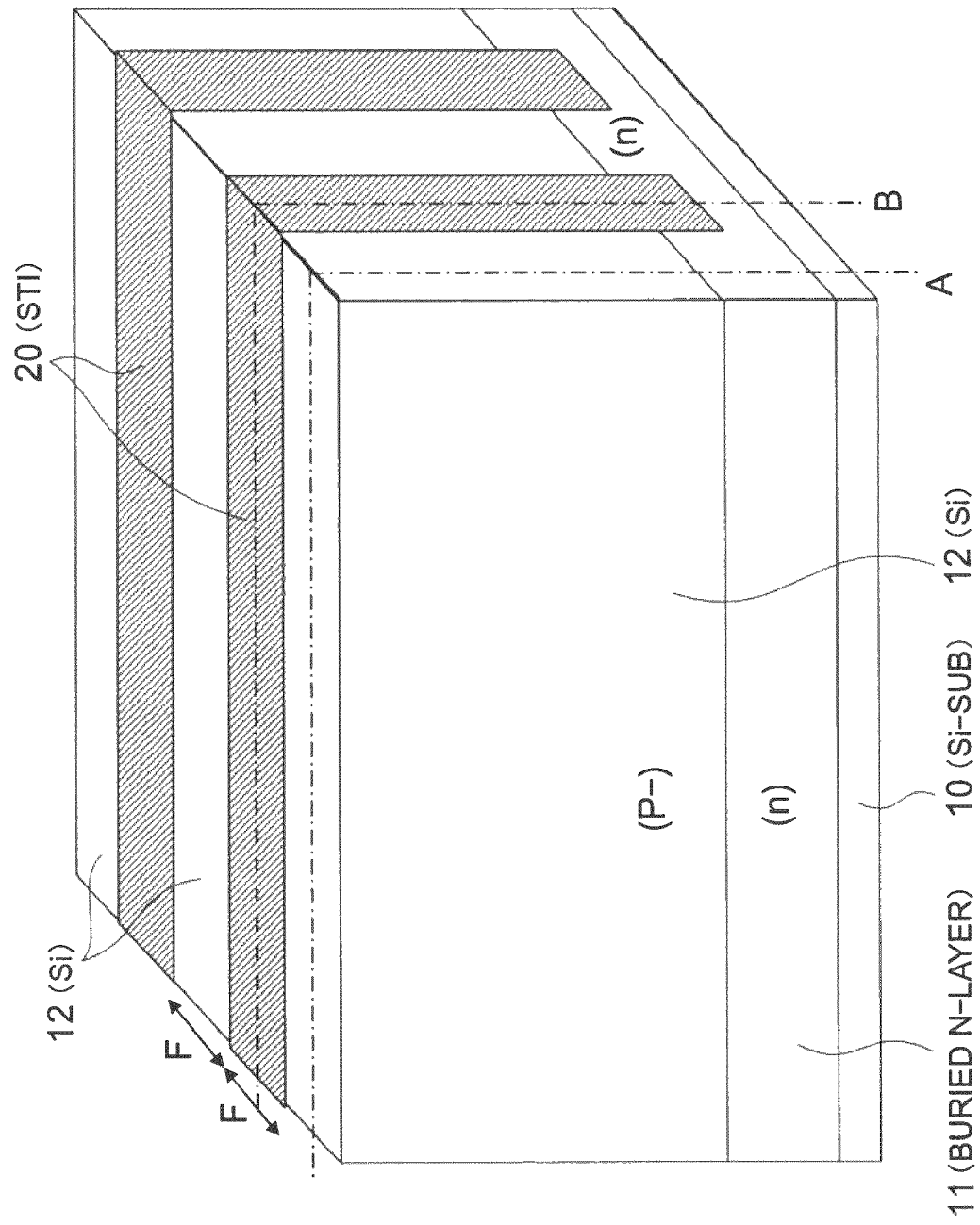
FIG. 4 is a perspective view showing a manufacturing method of the FBC according to the first embodiment.

The buried N-layer 11 is first formed within the P-type silicon substrate 10 by high-energy ion implantation or the like. A part of the substrate on the buried N-layer 11 is called "silicon layer 12" for convenience. The STI 20 is then formed so as to reach at least the buried N-layer 11. The STI 20 extends in the column direction and is formed in a stripe shape in a plan view. A configuration shown in FIG. 4 is thus obtained. The row direction widths of the STI 20 and the silicon layer 12 are set to F.

The drawings shown in FIGS. 5 to 28 attached with alphabetic character A are cross-sectional views along a line A of FIG. 4 in the respective steps. The drawings shown in FIGS. 5 to 28 attached with alphabetic character B are cross-sectional views along a line B of FIG. 4 in the respective steps.

Figure 5B:
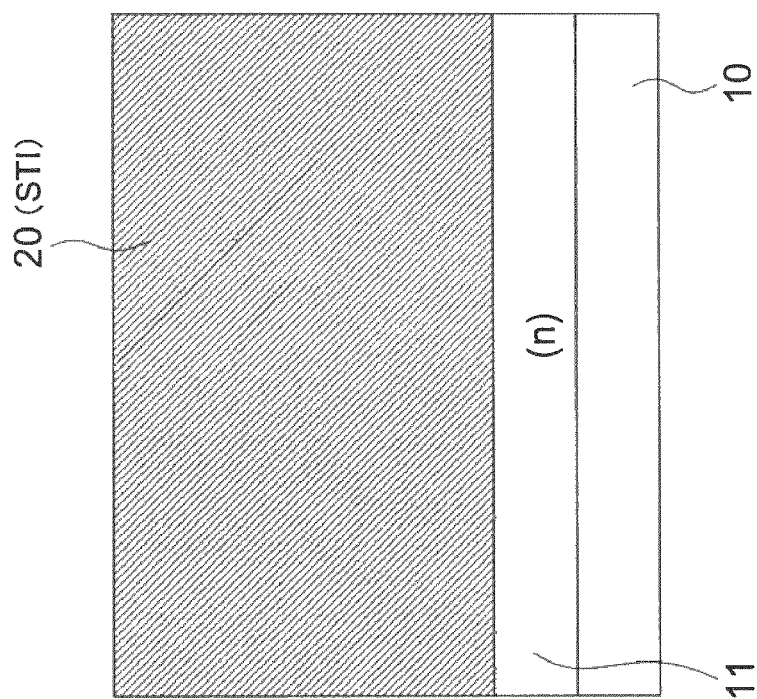
FIG. 5B shows the STI 20 serving as a device separation region.
Figure 5A:
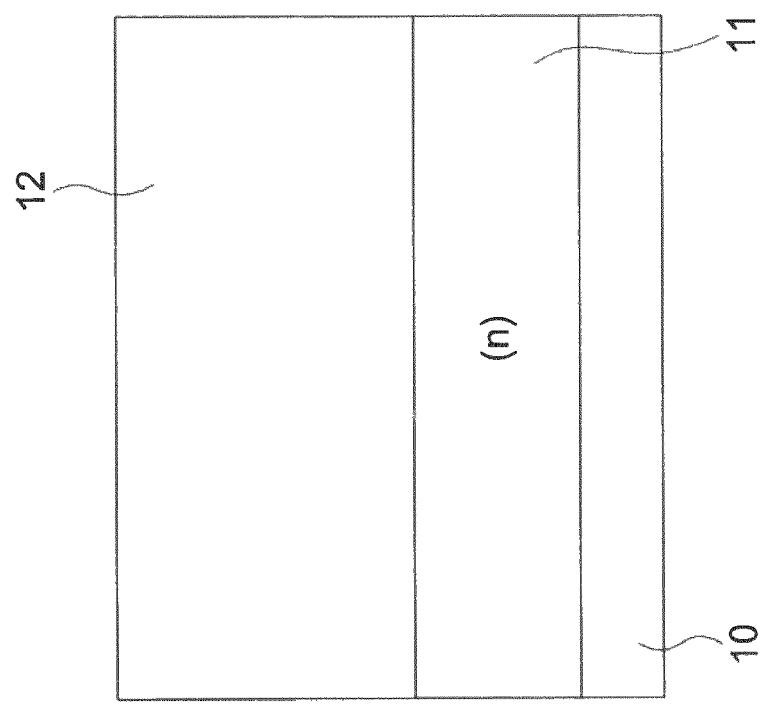
FIG. 5A shows the silicon layer 12 serving as an active area.

FIG. 5A shows the silicon layer 12 serving as an active area. FIG. 5B shows the STI 20 serving as a device separation region.

As shown in FIGS. 6A and 6B, a silicon nitride film 30, a silicon oxide film 21, and a silicon nitride film 31 serving as mask materials are then deposited in this order on the silicon layer 12. The mask materials are etched by lithography and RIE (Reactive Ion Etching), so that a first trench Tre1 is formed so as to reach the buried N-layer 11. The first trench Tre1 extends in the row direction so as to be perpendicular to the STI 20 in the plan view and is formed in a stripe shape. The depth of the first trench Tre1 can be about the same as that of the STI 20. Broken lines in FIGS. 6A and 6B show the original substrate surface (the surface of the silicon layer 12).

A silicon oxide film 22 is then filled in the first trench Tre1. Thereafter, the silicon oxide film 22 is etched back by RIE. As shown in FIGS. 7A and 7B, the silicon oxide film 22 serving as a bottom insulation film is formed at the bottom of the first trench Tre1. The silicon oxide film 22 is provided to isolate the plate line PL (13) from the buried N-layer 11. Therefore, the level of the top surface of the silicon oxide film 22 is adjusted to be near the boundary between the silicon layer 12 and the buried N-layer 11.

As shown in FIG. 8A, the plate dielectric film 23 is then formed on inner side surfaces of the first trench Tre1 (on the side surface of the silicon layer 12). The plate dielectric film 23 can be formed from desired materials by a thermal oxidation step or a deposition step. The polysilicon 13 is filled in the first trench Tre1 and etched back. Consequently, as shown in FIGS. 8A and 8B, the plate line PL (13) is formed so as to be isolated from the silicon layer 12 and the silicon substrate 10 with the insulation film 22 and the plate dielectric film 23.

The polysilicon 13 is deposited while doping N-type impurities. The top surface of the polysilicon 13 is at a higher level than that of the body 14 which will be formed later and at a lower level than that of the silicon layer 12. Positioning the top surface of the polysilicon 13 at a higher level than the top surface of the body 14 realizes increased coupling capacitance of the plate line PL and the body 14. Thus, the plate line PL can control potential of the body 14 efficiently. Positioning the top surface of the polysilicon 13 at a lower level than the top surface of the silicon layer 12 realizes decreased coupling capacitance of the plate line PL and the drain 16.

The conductivity type of the polysilicon 13 can be an N-type or a P-type. To implant impurities in the polysilicon 13, ion implantation can be used.

As shown in FIGS. 9A and 9B, a silicon oxide film 24 is then filled in the first trench Tre1 and etched back. The level of the top surface of the silicon oxide film 24 is higher than that of the silicon nitride film 30 by, for example, about 50 to 100 nm. This is because the silicide 17 is allowed to be formed on the plate line PL (13).

Figures 10A, 10B:
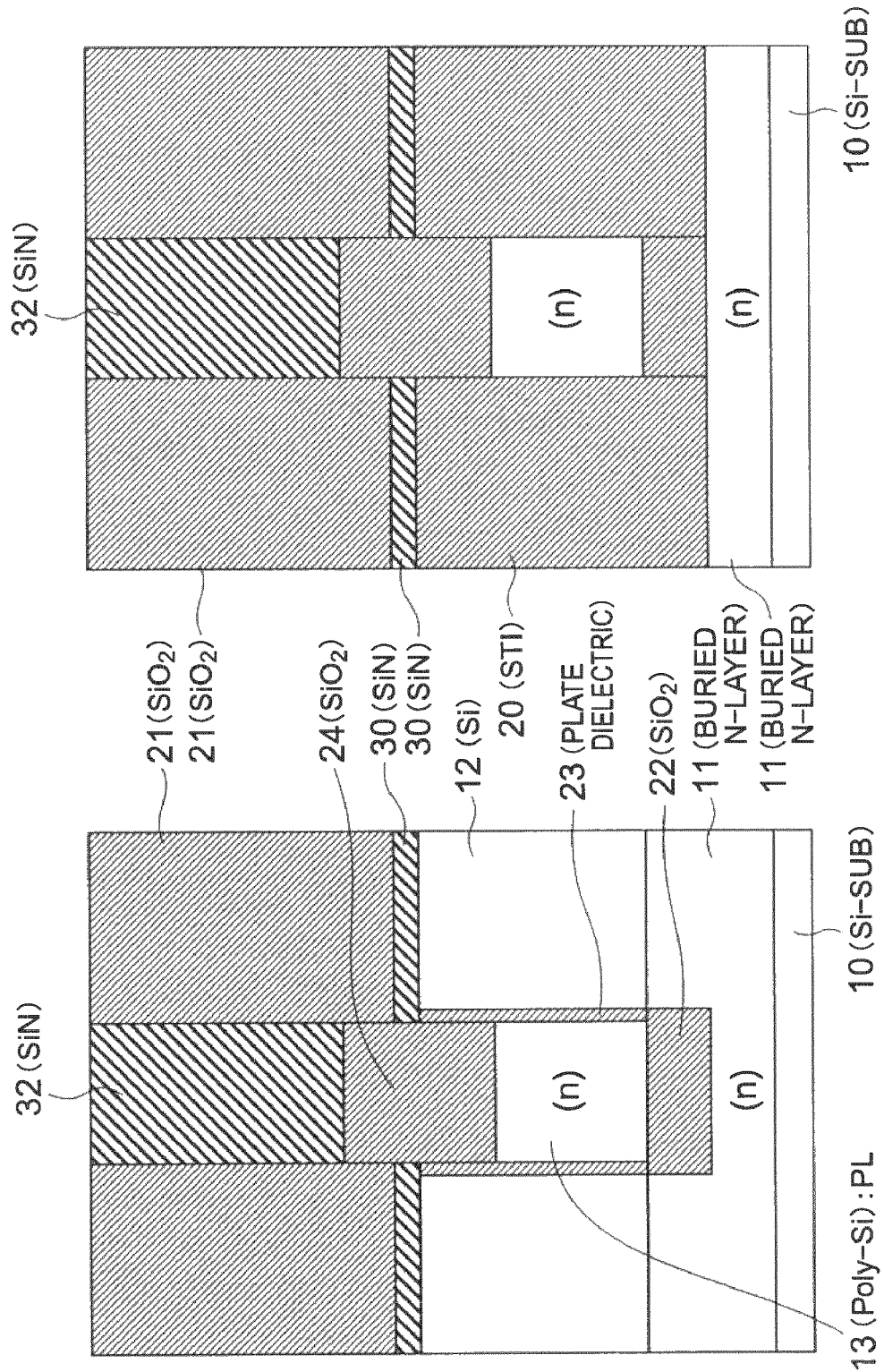

A silicon nitride film 32 is then buried in the first trench Tre1 using CVD (Chemical Vapor Deposition). The silicon nitride film 32 is then flattened by CMP (Chemical-Mechanical Polishing) to expose the surface of the silicon oxide film 21. A configuration shown in FIGS. 10A and 10B is thus obtained.

As shown in FIGS. 11A and 11B, the silicon oxide film 21 is then removed by RIE. Further, a silicon nitride film 33 is deposited on the silicon nitride films 32 and 30 by LPCVD (Low Pressure CVD) and anisotropically etched by RIE. As a result, as shown in FIGS. 12A and 12B, the silicon nitride film 33 remains on the side surfaces of the silicon nitride film 32 as a sidewall film.

As shown in FIGS. 13A and 13B, the silicon layer 12 and the STI 20 are anisotropically etched by RIE by using the silicon nitride films 32 and 33 as a mask. As a result, a second trench Tre2 that extends in the row direction and reaches the buried N-layer 11 is formed between two first trenches Tre1 adjacent to each other in the column direction. The depth of the second trench Tre2 can be the same as that of the first trench Tre1.

Accordingly, the silicon layer 12 is formed in a vertically-long fin shape between the first trench Tre1 and the second trench Tre2. The fin-shaped silicon layer 12 will become the body 14 and the drain 16 later. Namely, the distance between the first trench Tre1 and the second trench Tre2 (the thickness of the deposited silicon nitride film 33 in the column direction) determines substantially the column direction thickness of the body 14 and the drain 16.

Because the silicon nitride film 33 is formed as the sidewall film, the thickness of the deposited silicon nitride film 33 in the column direction can be set to be less than F as shown in FIG. 12A.

Although not shown, a large number of the fin-shaped silicon layers 12 are arranged in the column direction. The second trench Tre2 is thus formed between the not shown silicon layers 12.

A silicon oxide film 25 is filled within the second trench Tre2 and then etched back. As shown in FIGS. 14A and 14B, the insulation film 25 is thus formed at the bottom of the second trench Tre2. The level of the top surface of the insulation film 25 can be near the boundary between the silicon layer 12 and the buried N-layer 11, like the insulation film 22.

Figures 15A, 15B:
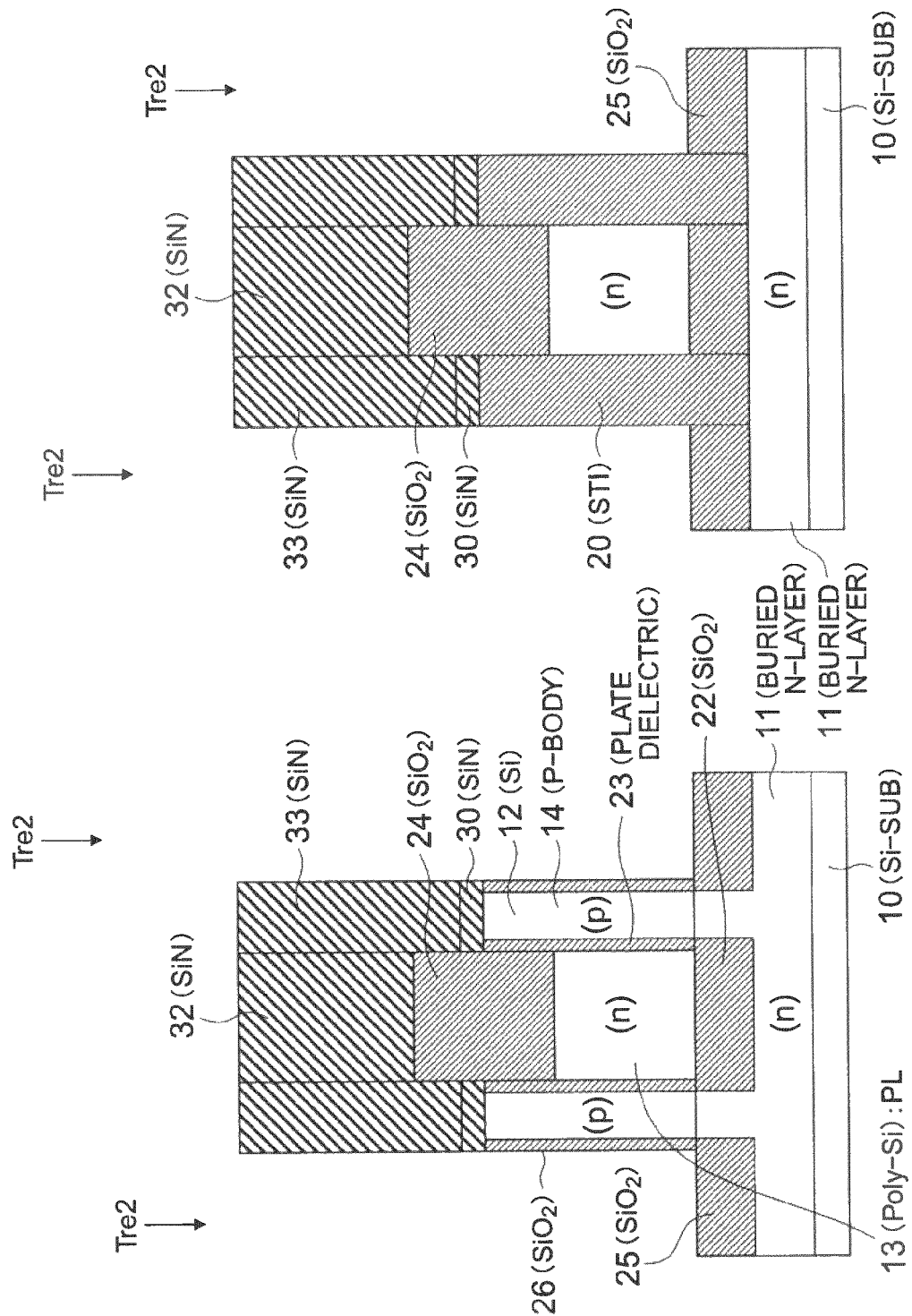

A sacrifice oxide film 26 is formed on the inner side surface of the second trench Tre2 (on the side surface of the silicon layer 12) and P-type impurities are then introduced into the silicon layer 12 by oblique ion implantation. The impurities are activated by a thermal process. Consequently, as shown in FIGS. 15A and 15B, the silicon layer 12 becomes P-doped silicon.

The sacrifice oxide film 26 is then removed and the gate dielectric film 27 is formed on the inner side surface of the second trench Tre2 (on the side surface of the silicon layer 12). Further, the polysilicon 15 is deposited while doping N-type impurities. The thickness of the polysilicon 15 is smaller than ½ of the opening width F of the second trench Tre2 in the column direction so that the second trench Tre2 is not buried completely. Anisotropic etching of the polysilicon 15 by RIE allows the polysilicon 15 to remain on the inner side surface of the second trench Tre2 with the gate dielectric film 27 interposed therebetween. The polysilicon 15 is formed so as to correspond to each of two corners at the bottom of the second trench Tre2. These two polysilicons 15 at the two corners are separated from each other in a column direction cross-section and extend in the row direction. The polysilicon 15 functions as the word line WL (gate electrode).

The plate line PL and the word line WL are formed in different steps in the first embodiment. The thickness and material of the plate dielectric film 23 can be thus made to be different from those of the gate dielectric film 27.

N-type impurities are introduced into the upper part of the silicon layer 12 by oblique ion implantation or the like by using the word line WL as a mask. At this time, the level of the top surface (tip) of the polysilicon 15 is a factor determining the boundary between the body 14 and the drain 16. Activation of the impurities forms the N-type drain 16 as shown in FIG. 16A.

The impurities are implanted in the polysilicon 15 during the deposition step. Alternatively, the impurities can be implanted at the same time when the impurities are introduced into the drain 16 to form the same.

While the impurities are introduced into the buried N-layer 11 (source) at an earlier step, the impurities can be introduced at the same time when the impurities are introduced into the drain 16 to form the same. In this case, ion implantation is performed upon the silicon oxide film 25 in a direction substantially vertical to its surface at the same time when the oblique ion implantation is performed upon the silicon layer 12. This causes the impurities to scatter within the silicon oxide film 25 in a substantially vertical direction to the ion implantation direction and to be introduced into the silicon substrate immediately under the body 14. As a result, an N-type source layer is formed immediately under the body 14 in a self-aligned manner (see 2005 IEEE International Electron Devices Meeting Technical Digest, p. 739).

As shown in FIGS. 17A and 17B, a silicon oxide film 28 is then filled in the second trench Tre2 and flattened by CMP. The silicon oxide film 28 and the silicon nitride film 32 are polished until the top surface of the silicon oxide film 24 is exposed. The silicon nitride film 32 is thus removed while keeping the silicon nitride film 33 remaining.

Figures 18A, 18B:
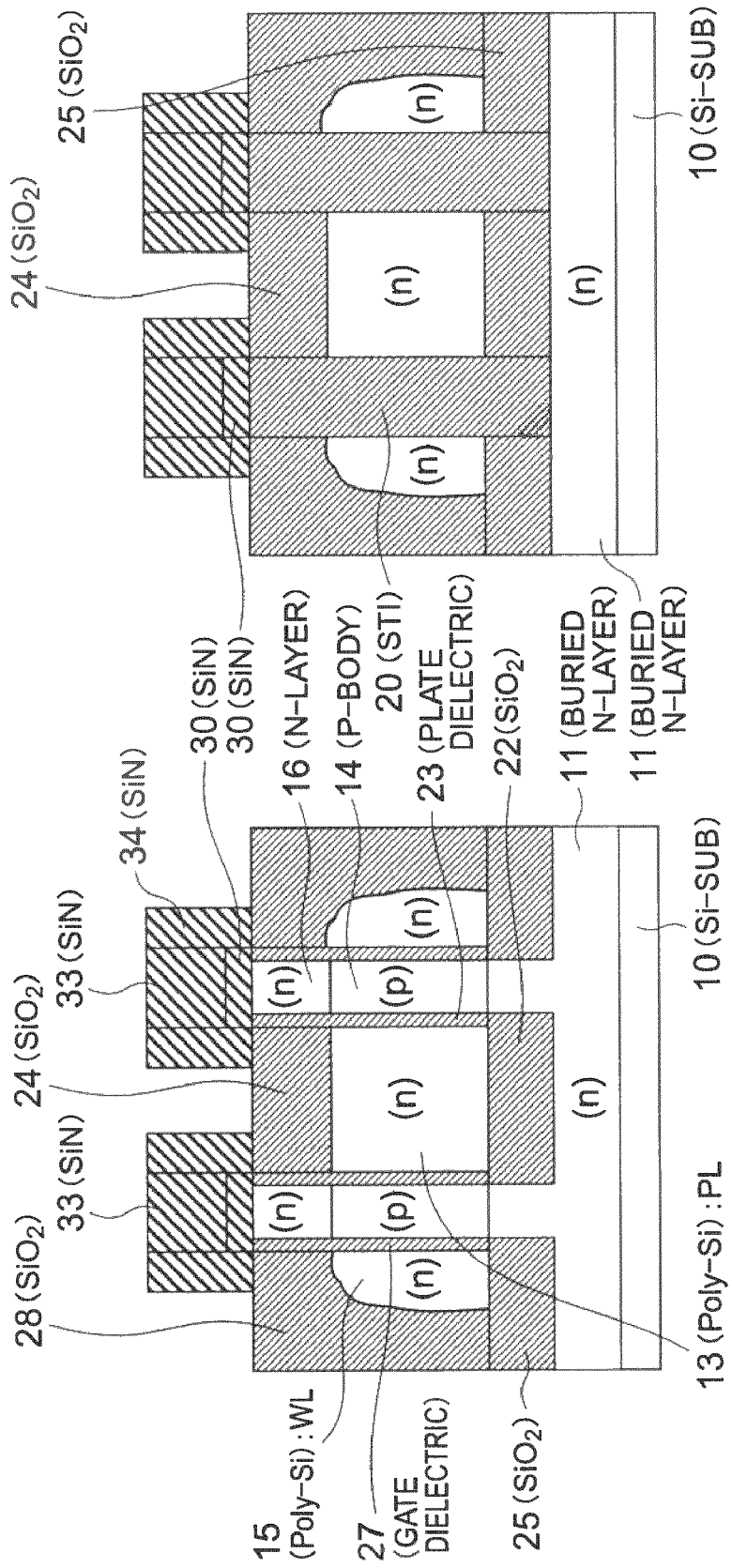

The silicon oxide films 28 and 24 are then etched back, so that the substantially entire side surfaces of the silicon nitride films 30 and 33 are exposed. A silicon nitride film 34 is further deposited on the silicon oxide films 28 and 24 and the silicon nitride films 33 and 30. The silicon nitride film 34 is then etched back. The silicon nitride film 34 thus remains on the side surfaces of the silicon nitride films 30 and 33 as a sidewall film. As a result, a configuration shown in FIGS. 18A and 18B is obtained. As will be described later, the thickness (the column direction width) of the deposited silicon nitride film 34 is desirably slightly smaller than the thickness (the column direction width) of the deposited polysilicon 15 so that the side surface of the polysilicon 15 is exposed.

Figures 19A, 19B:
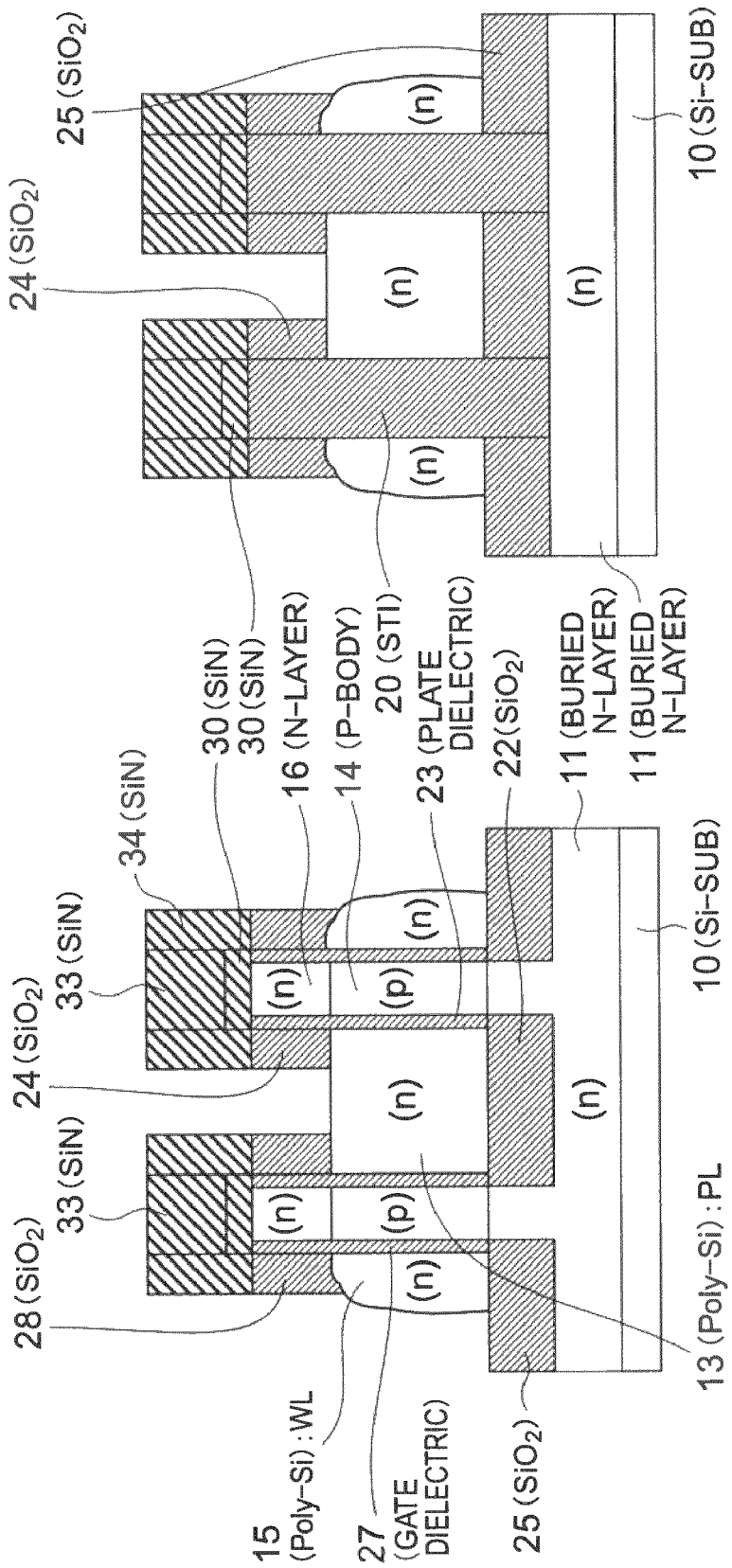

As shown in FIGS. 19A and 19B, the silicon oxide films 24 and 28 are then anisotropically etched by RIE with the silicon nitride films 33 and 34 used as a mask, so that the surfaces of the polysilicons 13 and 15 are exposed. Because the column direction thickness of the silicon nitride film 34 is slightly smaller than that of the polysilicon 15, only the side surface of the polysilicon 15 is exposed. The gate dielectric film 27 on the polysilicon 15 is covered by the silicon oxide film 28. Thus, process damage of the gate dielectric film 27 is suppressed and a gate-drain short is prevented.

As shown in FIGS. 20A and 20B, the silicide 17 is then formed on the surfaces of the polysilicons 13 and 15. The resistances of the word line WL and the plate line PL are thus reduced. The distance between the bodies 14 adjacent to each other on the side of the word line WL is 1.75 F, which is larger than the distance F between the bodies 14 adjacent to each other on the plate line PL side. The silicide 17 can thus be formed easily on the side surface of the polysilicon 15.

As shown in FIGS. 21A and 21B, a silicon oxide film 29 is then buried again in the second trench Tre2 and then flattened by CMP until the top surface of the drain 16 is exposed. At this time, the silicon nitride films 30, 33, and 34 are removed.

A silicon nitride film 35 is then deposited on the drain 16 and the silicon oxide films around the drain 16. The silicon nitride film 35 is patterned in a stripe by lithography and RIE so as to remain on the STI 20. A single crystal silicon 18 is formed on the active area by selective epitaxial growth by using the top surface of the exposed drain 16 as a seed. Discontinuous crystallization lines 19 are formed in the single crystal silicon 18. After the single crystal silicon 18 is flattened, a configuration shown in FIGS. 22A and 22B is obtained. N-type impurities are introduced into the single crystal silicon 18. The silicon layer 18 doped with the N-type impurities is hereinafter referred to as "N-type silicon layer 18".

The N-type silicon layer 18 functions as the base layer in the bipolar writing operation. Therefore, the impurity density of the N-type silicon layer 18 is preferably about $1 \times 10^{18}$ $cm^{-3}$, for example. To suppress punch-through, the thickness of the N-type silicon layer 18 is preferably about 50 to 100 nm.

As shown in FIGS. 23A and 23B, the silicon oxide film 200 is deposited on the silicon nitride film 35 and the N-type silicon layer 18. The silicon oxide film 200 above the body 14 is then removed by lithography and RIE. The distance between the silicon oxide films 200 adjacent to each other in the column direction is F. Thus, the silicon oxide film 200 is formed in a stripe shape to extend in the row direction.

A silicon oxide film 201 is further deposited on the silicon oxide film 200 and the N-type silicon layer 18 and then anisotropically etched by RIE. As a result, as shown in FIGS. 23A and 23B, the silicon oxide film 201 is formed on the side surface of the silicon oxide film 200 as a sidewall film. The distance between the silicon oxide films 201 adjacent to each other in the column direction (the width of the exposed N-type silicon layer 18) is smaller than F.

The doped polysilicon 100 containing P-type impurities with high concentration is then deposited on the N-type silicon layer 18 and the silicon oxide films 200 and 201. The barrier metal 40, the tungsten film 41, and the silicon nitride film 36 for reducing the resistance of the emitter wire are deposited in this order on the N-type silicon layer 18.

The N-type silicon layer 18, the barrier metal 40, the tungsten film 41, and the silicon nitride film 36 on the silicon oxide film 200 are etched by lithography and RIE. The N-type silicon layer 18, the barrier metal 40, the tungsten film 41, and the silicon nitride film 36 are formed in stripe shapes to extend in the row direction. As a result, as shown in FIGS. 24A and 24B, a configuration of a third trench Tre3 extending in the row direction to reach the silicon oxide film 200 is obtained. The distance between laminated films formed of the N-type silicon layer 18, the barrier metal 40, the tungsten film 41, and the silicon nitride film 36 adjacent to each other in the column direction is F. Namely, the column direction widths of the emitter layer and the emitter line are set to be the minimum size F.

The silicon oxide film 201 is formed to deal with misalignment in lithography when the third trench Tre3 is formed. Even if the misalignment in lithography occurs, the short between the contact plug (42, 43) to be described later and the emitter layer 100 can be prevented by the silicon oxide film 201.

A silicon nitride film is then deposited on the top and side surfaces of the laminated films formed of the N-type silicon layer 18, the barrier metal 40, the tungsten film 41, and the silicon nitride film 36 and anisotropically etched by RIE. Consequently, as shown in FIGS. 25A and 25B, the silicon nitride film 37 is formed on the side surfaces of the third trench Tre3.

Figures 26A, 26B:
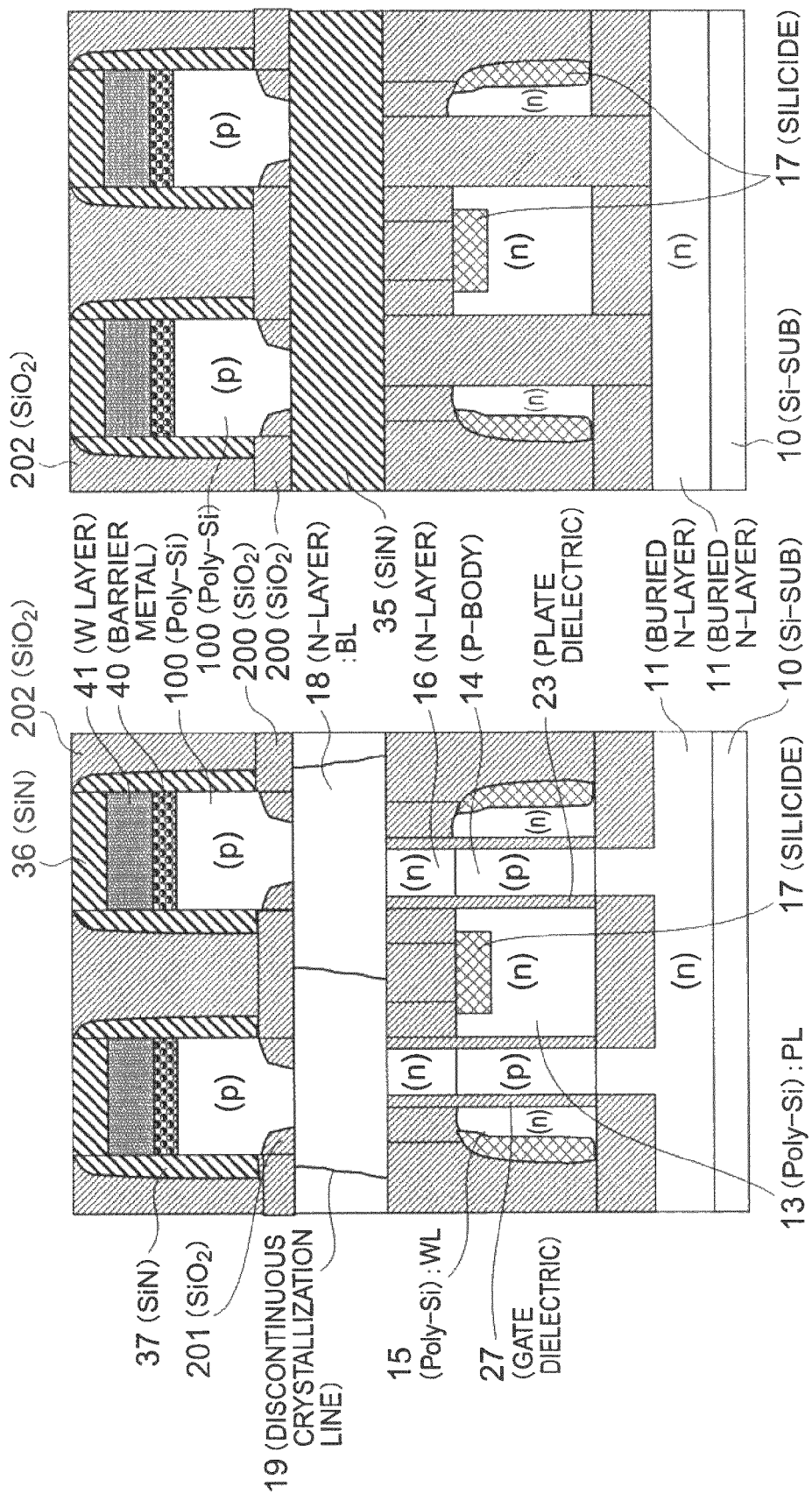

As shown in FIGS. 26A and 26B, a silicon oxide film 202 is then filled in the third trench Tre3 and flattened by CMP.

Figures 27A, 27B:
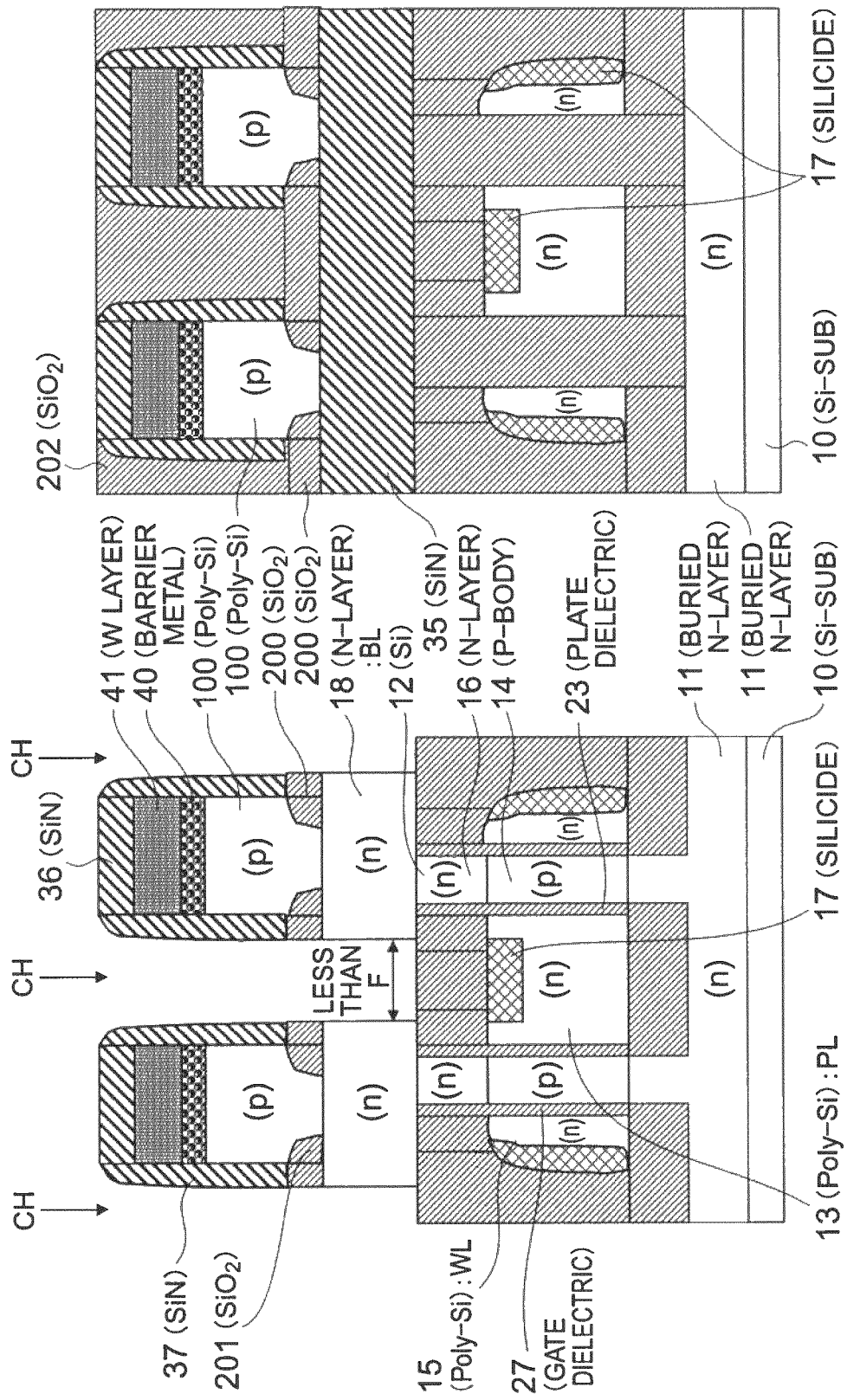

The silicon oxide film 202 on the active area is then removed by lithography and RIE while keeping the silicon oxide film 202 on the STI 20 remaining. The silicon oxide film 200 and the N-type silicon layer 18 are anisotropically etched by using the silicon oxide film 202 and the silicon nitride films 36 and 37 as a mask. As shown in FIGS. 27A and 27B, a contact hole CH reaching the N-type silicon layer 18 is thus formed. At this time, the emitter layer and the emitter line (the polysilicon 100, the barrier metal 40, and the tungsten film 41) are covered by the silicon nitride films 36 and 37 and the silicon oxide films 200 and 201. Thus, the contact hole CH is formed in a self-aligned manner to reach the N-type silicon layer 18 while maintaining the isolation from the emitter layer and the emitter line. Accordingly, the column direction width of the contact hole CH can be set to be less than F.

In the first embodiment, the contact hole CH passes through the N-type silicon layer 18. However, if moving of carriers between adjacent cells presents no problem as described above, the contact hole CH does not necessarily need to pass through the N-type silicon layer 18.

As shown in FIGS. 28A and 28B, the barrier metal 42 is then deposited on the bottom and side surfaces of the contact hole CH. Further, the tungsten film 43 is filled in the contact hole CH. The barrier metal 42 and the tungsten film 43 are flattened by CMP.

As shown in FIGS. 2 and 3, the silicon oxide film 203 and the silicon nitride film 38 are then deposited on the silicon nitride film 36, the tungsten film 43, and the silicon oxide film 202. The silicon oxide film 203 and the silicon nitride film 38 on the active area are removed by lithography and RIE while keeping the silicon oxide film 203 and the silicon nitride film 38 on the STI 20 remaining. The tungsten film 43 and the silicon nitride film 36 are thus exposed.

The barrier metal 44 and the copper wire layer 45 are provided on the exposed tungsten film 43 and silicon nitride film 36 on the active area. The barrier metal 44 is tantalum, for example. The copper wire 45 serving as the second bit line BL is thus formed to extend in the column direction in the active area. The copper wire layer 45 contacts the N-type silicon layer 18 through the barrier metals 44 and 42 and the tungsten film 43.

As described above, the contact plug (42, 43) serving as a bit line contact is formed in a self-aligned manner so as to have a width of the minimum size F or less. As a result, the size of the unit cell can be reduced as compared to the conventional ones.

According to the first embodiment, the emitter layer and the emitter line (100, 40, 41) can be formed above the body 14 and the drain 16 (on the N-type silicon layer 18 serving as the first bit line). The copper wire 45 serving as the second bit line can be further formed above the emitter layer and the emitter line (100, 40, 41). The body 14, the drain 16, the first bit line (18), the emitter layer, the emitter line (100, 40, 41), and the second bit line (45) are stacked in a vertical direction to the surface of the silicon substrate 10 in the first embodiment. Consequently, as shown in FIG. 1, the size of the unit cell can be reduced as compared to the conventional ones.

Second Embodiment

Figure 29:
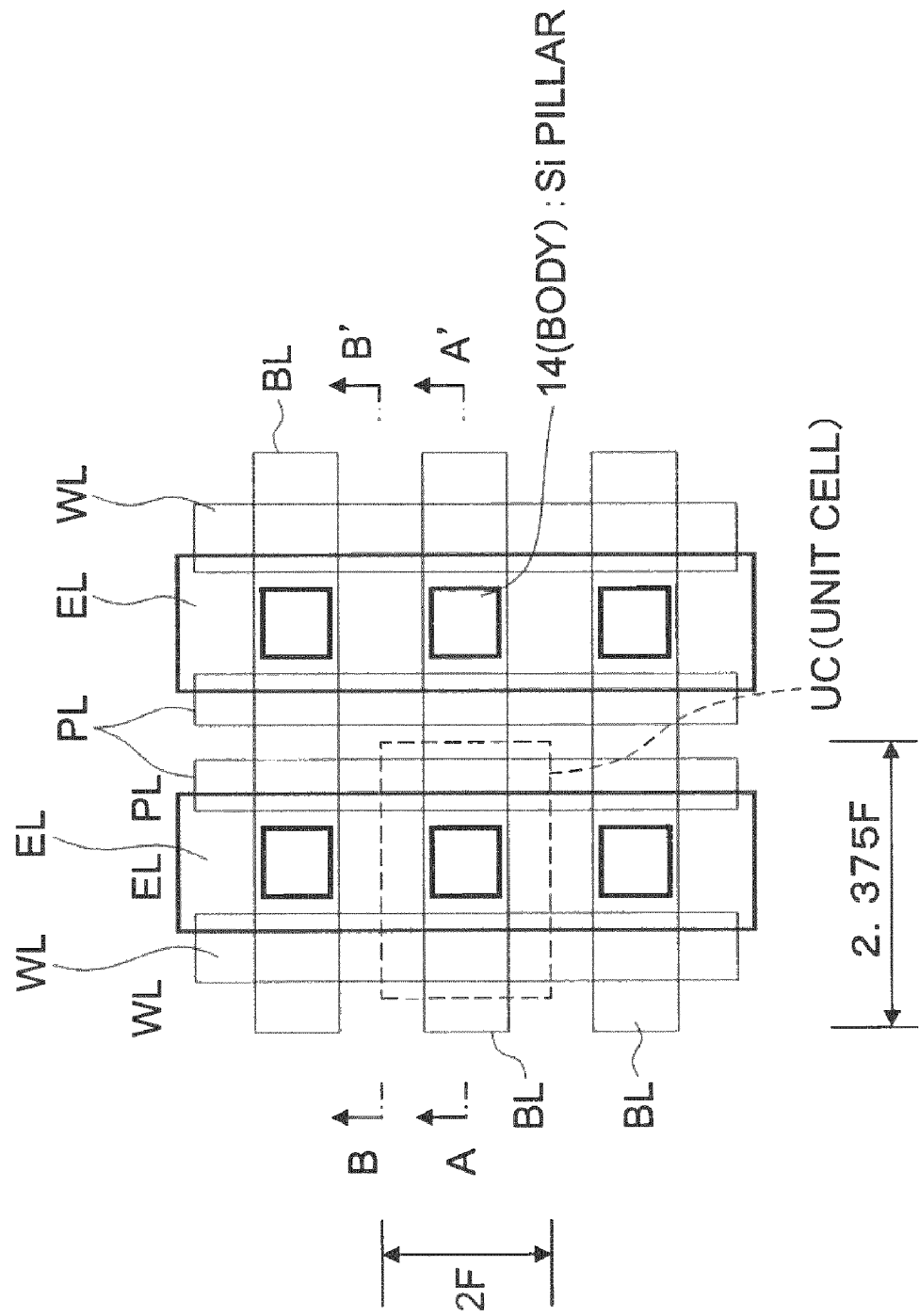
FIG. 29 is a plan view of configuration of a bipolar-write FBC according to a second embodiment of the present invention.

FIG. 29 is a plan view of configuration of a bipolar-write FBC according to a second embodiment of the present invention. The second embodiment is different from the first embodiment in that the plate lines PL correspond to the respective word lines WL and are separated and isolated in the respective rows. Other configurations of the second embodiment can be identical to those in the first embodiment. The size of a unit cell in the second embodiment is also the same as that in the first embodiment.

To make the side surface of the plate line PL be silicide, the distance between the bodies 14 adjacent to each other on the plate line PL side is preferably larger than F. In this case, the size of the unit cell in the second embodiment is larger than that of the first embodiment; however, the size can be adequately set to be equal to or less than 6 $F^2$.

Figure 30:
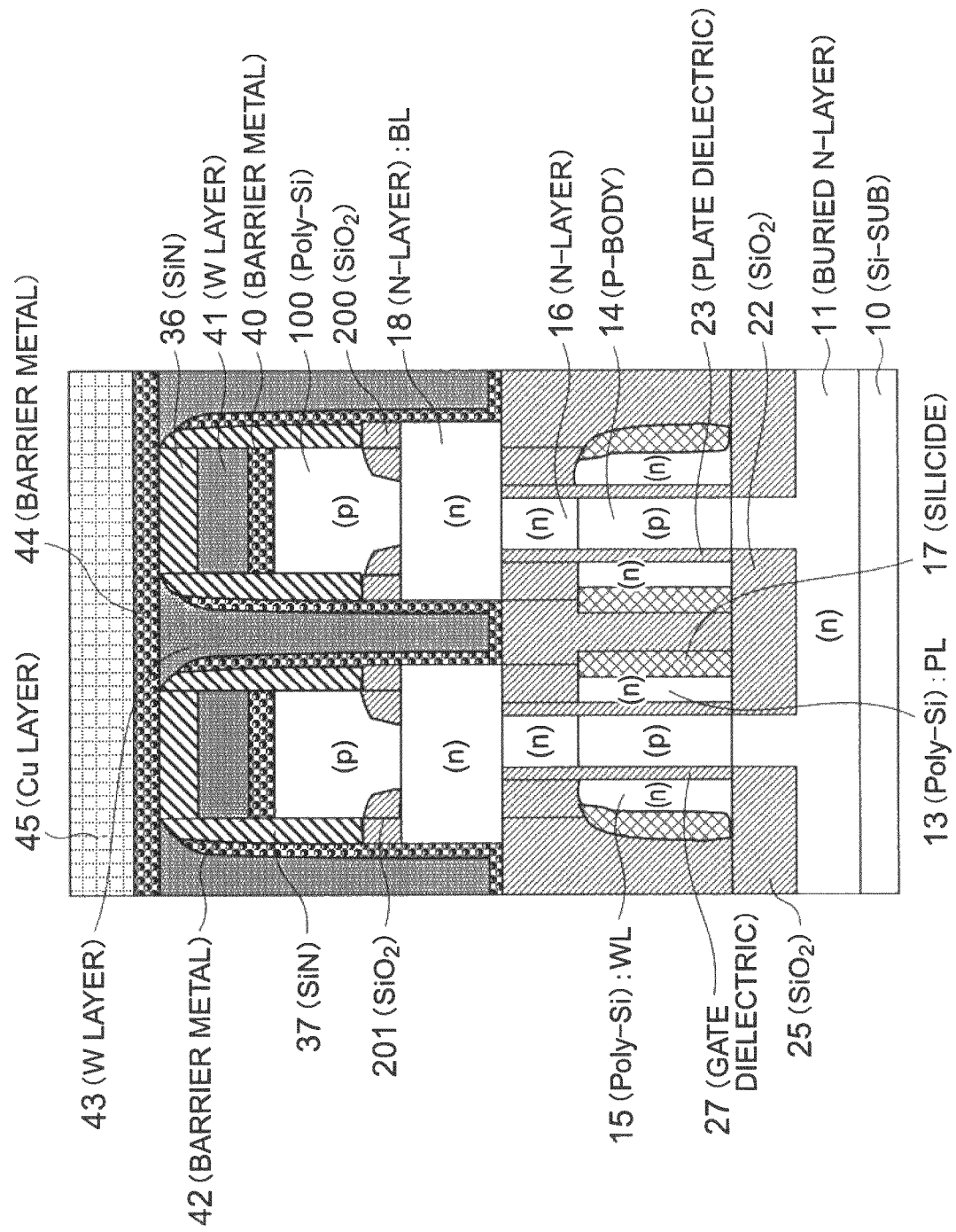
FIG. 30 is a cross-sectional view along a line A-A' shown in FIG. 29.
Figure 31:
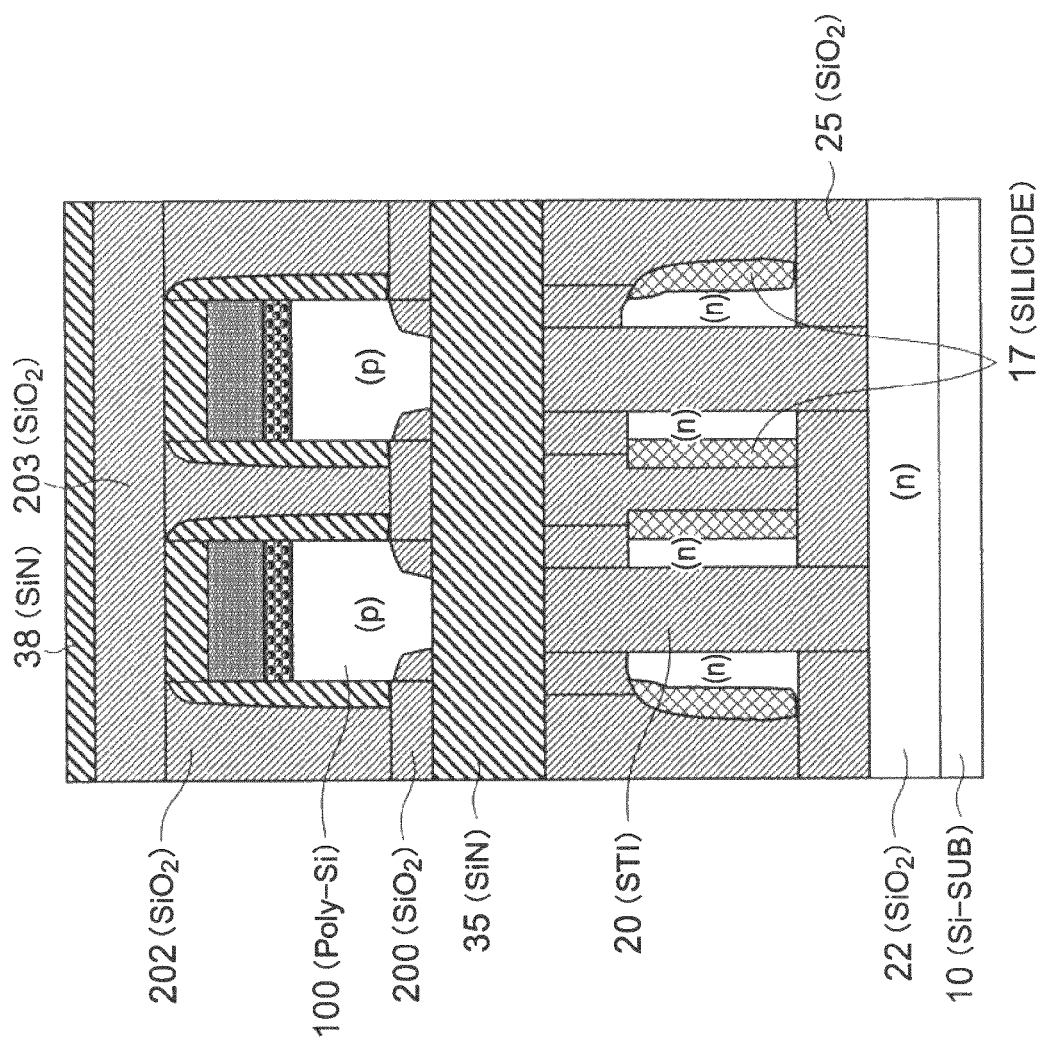
FIG. 31 is a cross-sectional view along a line B-B' shown in FIG. 29.

FIG. 30 is a cross-sectional view along a line A-A' shown in FIG. 29. FIG. 31 is a cross-sectional view along a line B-B' shown in FIG. 29. Two memory cells adjacent to each other in the column direction do not share the plate line PL but have separate plate lines PL corresponding to the respective cells. The silicide 17 is formed on the side surface of each of the plate lines PL.

According to the second embodiment, the plate line PL can be driven independently for each of the memory cells arranged in the row direction. As will be described later, the plate line PL is formed by a different step from that of the word line WL. Thus, the material and the thickness of the plate line PL can be made different from those of the word line WL. The second embodiment can achieve identical effects as those of the first embodiment.

Figures 33A, 33B:
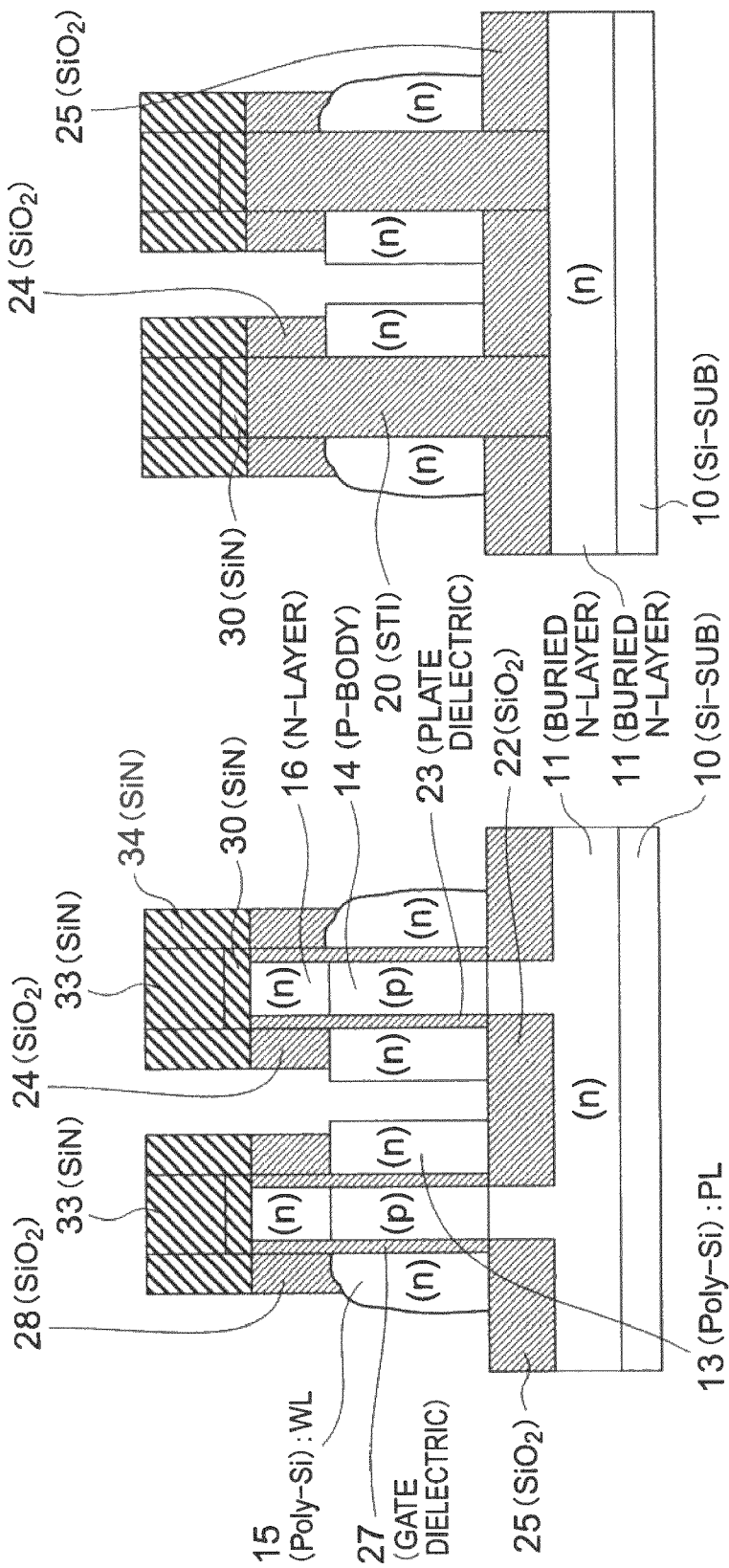
Figures 34A, 34B:
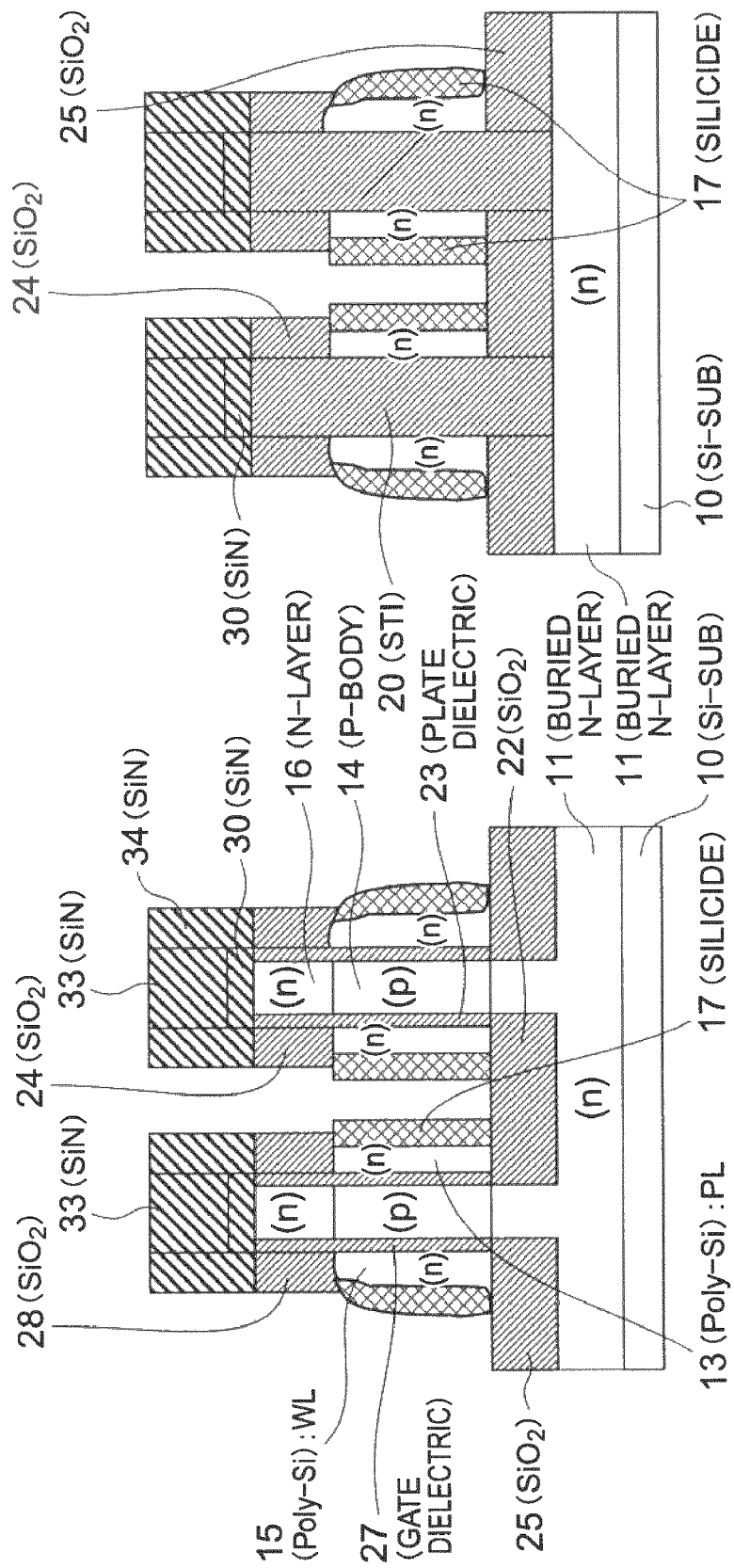

A manufacturing method of the FBC according to the second embodiment is described next. FIGS. 32A, 33A, and 34A correspond to cross-sections along the line A shown in FIG. 4 during the respective steps. FIGS. 32B, 33B, and 34B correspond to cross-sections along the line B shown in FIG. 4 during the respective steps.

After the steps described with reference to FIGS. 4 to 8B are performed, a silicon oxide film 204 is deposited on the inner wall of the first trench Tre1. The thickness of the deposited silicon oxide film 204 is preferably less than ½ of the column direction width F of the first trench Tre1 so that the opening of the first trench Tre1 is not closed.

The silicon oxide film 204 is etched back by RIE so as to cause the silicon oxide film 204 to remain on the inner side surfaces of the first trench Tre1. At this time, a part of the top surface of the polysilicon 13 (plate line PL) is exposed at the bottom of the first trench Tre1. As shown in FIGS. 32A and 32B, the polysilicon 13 is anisotropically etched by using the silicon oxide film 204 as a mask. As a result, one plate line PL in one trench Tre1 is divided into two in the column direction.

After the silicon oxide film 204 is removed, the steps described with reference to FIGS. 9A to 28B are performed. As a result, the bipolar-write FBC memory according to the second embodiment is completed.

While the silicide 17 is formed on the top surface of the plate line PL as shown in FIG. 20 according to the first embodiment, the silicide 17 is formed on the side surfaces of two separated plate lines PL as shown in FIGS. 33A to 34B according to the second embodiment. To sufficiently form the silicide 17 on the side surface of the plate line PL, the column direction thickness of the silicon nitride film 34 needs to be less than that of the polysilicon 13, as shown in FIG. 33A. Consequently, the entire side surface of the polysilicon 13 can be exposed.

Third Embodiment

Figure 35:
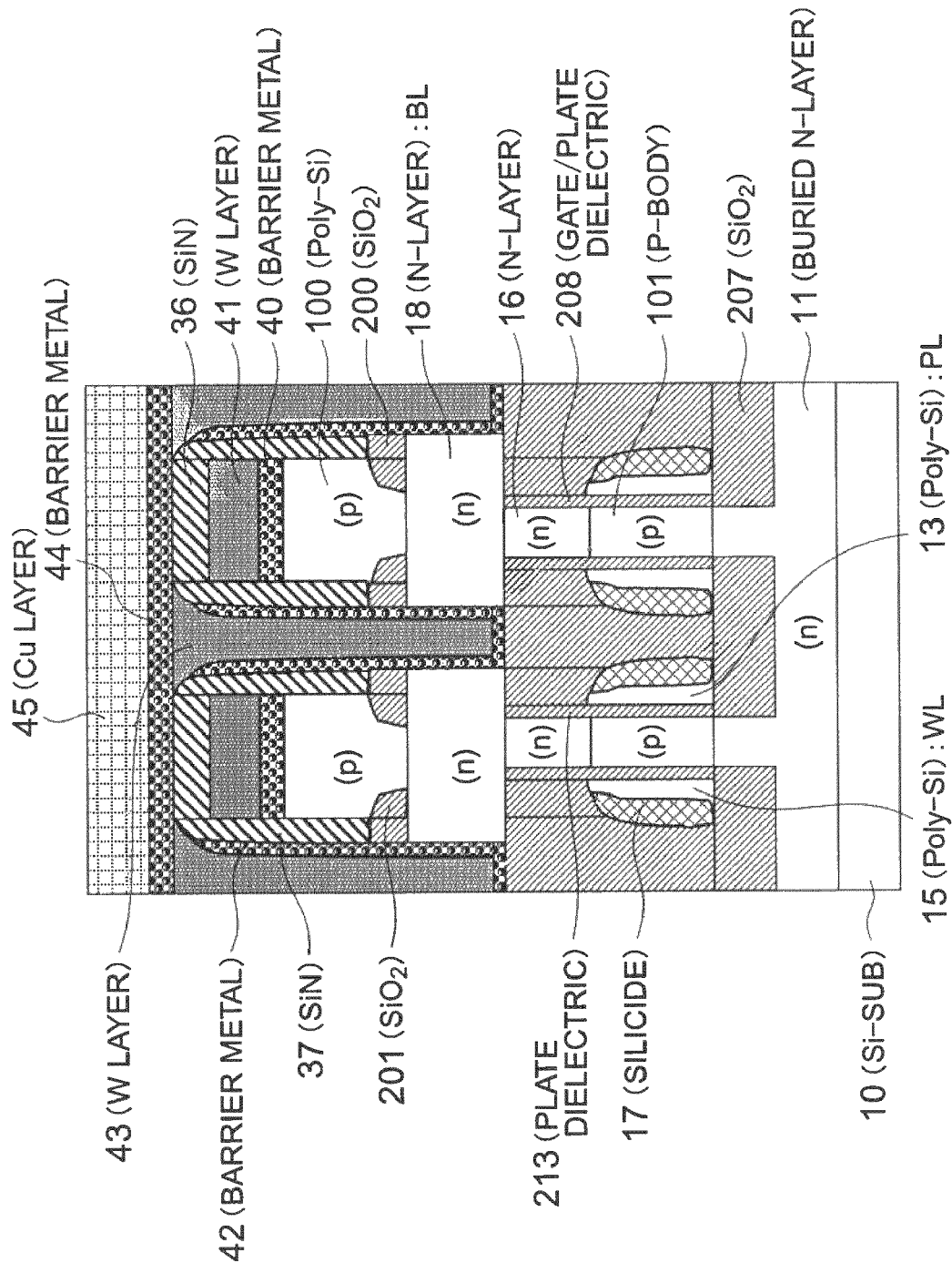
FIGS. 35 and 36 are cross-sectional views of configuration of a bipolar-write FBC according to a third embodiment of the present invention.
Figure 36:
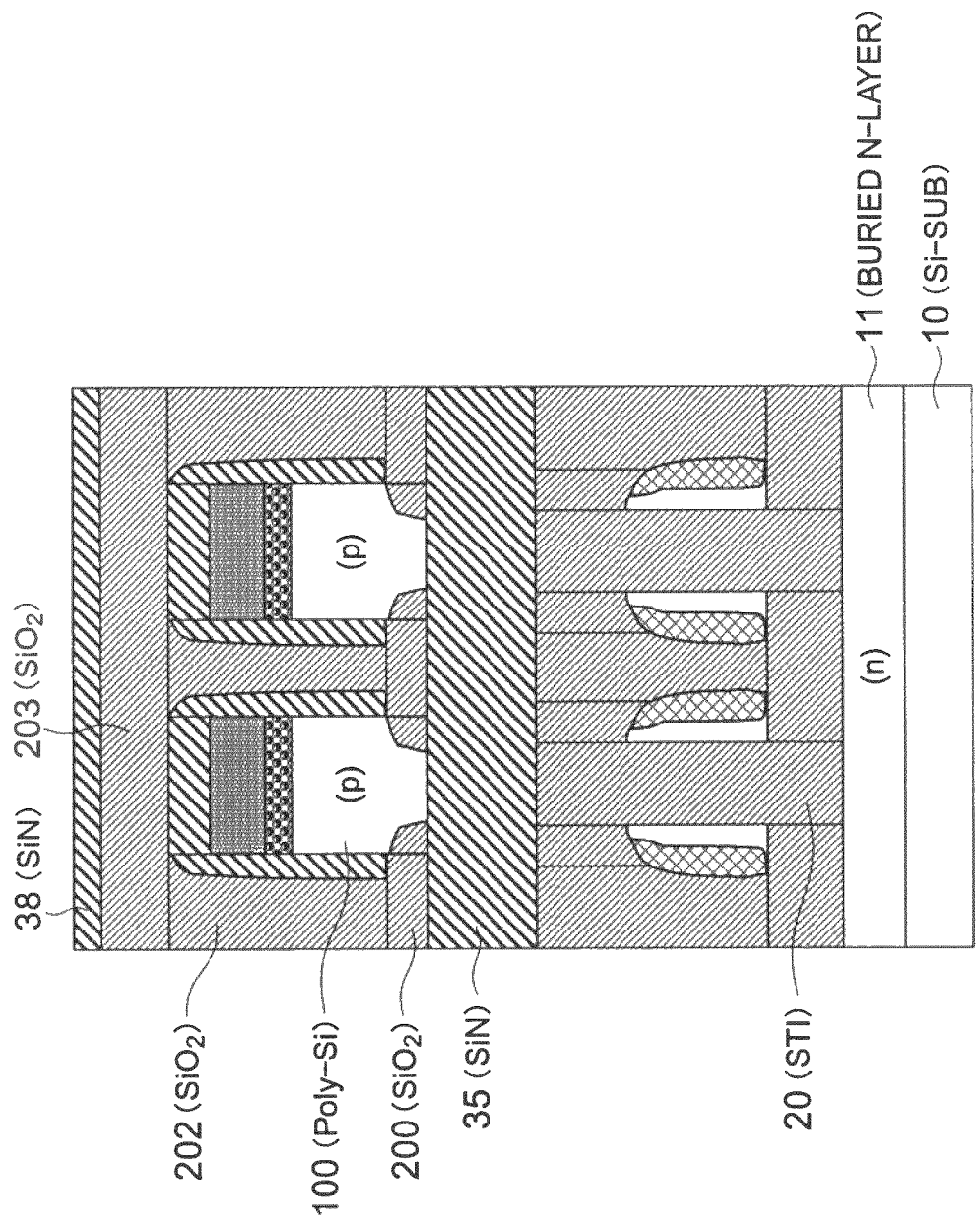

FIGS. 35 and 36 are cross-sectional views of configuration of a bipolar-write FBC according to a third embodiment of the present invention. Because a plan view of the third embodiment is the same as that of FIG. 29, it will be omitted. FIG. 35 corresponds to the cross-section along the line A-A' shown in FIG. 29. FIG. 36 corresponds to the cross-section along the line B-B' shown in FIG. 29.

In the third embodiment, the plate lines PL correspond to the respective word lines WL and are separated and isolated in the respective rows. Although the configuration of the third embodiment is the same as in the second embodiment, its manufacturing method is different. The size of the unit cell according to the third embodiment is the same as that in the second embodiment.

The third embodiment can achieve identical effects as those in the second embodiment. The plate line PL is formed at the same time when the word line WL is formed in the third embodiment. Thus, the material and the thickness of the plate line PL are substantially the same as those of the word line WL.

A manufacturing method of the FBC according to the third embodiment is described next. The drawings shown in FIGS. 37 to 50 attached with alphabetic character A correspond to cross-sections along the line A in FIG. 4 during the respective steps. The drawings shown in FIGS. 37 to 50 attached with alphabetic character B correspond to cross-sections along the line B in FIG. 4 during the respective steps.

After the steps shown in FIGS. 4 to 5B are performed, a silicon oxide film 205 is deposited on the silicon layer 12 and the STI 20 as shown in FIGS. 37A and 37B.

As shown in FIGS. 38A and 38B, the silicon oxide film 205 is then removed by lithography and RIE so as to remain only on the region where the first trench Tre1 will be formed. Thus, the silicon oxide film 205 is formed in a stripe shape to extend in the row direction. The column direction width of the silicon oxide film 205 is about F.

A silicon nitride film 39 is then deposited on the silicon oxide film 205, the silicon layer 12, and the STI 20. The silicon nitride film 39 is then etched back so as to remain on the side surfaces of the silicon oxide film 205 as sidewalls. The column direction width of the silicon nitride film 39 is set to be less than F.

A silicon oxide film 206 is deposited on the silicon layer 12, the STI 20, the silicon oxide film 205, and the silicon nitride film 39. The silicon oxide film 206 is then flattened by CMP, so that the top surface of the silicon nitride film 39 is exposed. A configuration shown in FIGS. 40A and 40B is thus obtained.

Next, the silicon oxide films 205 and 206 are removed by RIE. Further, parts of the silicon layer 12, the STI 20, and the buried N-layer 11 are anisotropically etched by using the silicon nitride film 39 as a mask. As a result, as shown in FIGS. 41A and 41B, the first trench Tre1 is formed in the region where the plate line PL is to be formed, and the second trench Tre2 is formed in the region where the word line WL is to be formed. The depths of the first and second trenches Tre1 and Tre2 are set to reach the buried N-layer 11. The depths of the first and second trenches Tre1 and Tre2 can be about the same as that of the STI 20.

The silicon layer 12 between the first trench Tre1 and the second Tre2 is the region where the body 14 and the drain 16 will be formed later. The column direction width of the silicon layer 12 depends on the column direction width of the silicon nitride film 39 and is less than F in this example.

A silicon oxide film 207 is filled in the first and second trenches Tre1 and Tre2 and then flattened by CMP. Subsequently, the silicon oxide film 207 is etched back by RIE so as to remain at the bottoms of the first and second trenches Tre1 and Tre2. The level of the top surface of the silicon oxide film 207 is adjusted to be near the boundary between the silicon layer 12 and the buried N-layer 11. As a result, a configuration shown in FIGS. 42A and 42B is obtained.

After the sacrifice oxide film 26 is formed on the side surfaces of the silicon layer 12, P-type impurities are introduced into the silicon layer 12 by oblique ion implantation. The thermal process activates the impurities.

The sacrifice oxide film 26 is then removed and a plate dielectric film 213 is formed on the inner side surfaces of the first trench Tre1. A gate dielectric film 208 is formed on the inner side surface of the second trench Tre2.

Figures 43A, 43B:
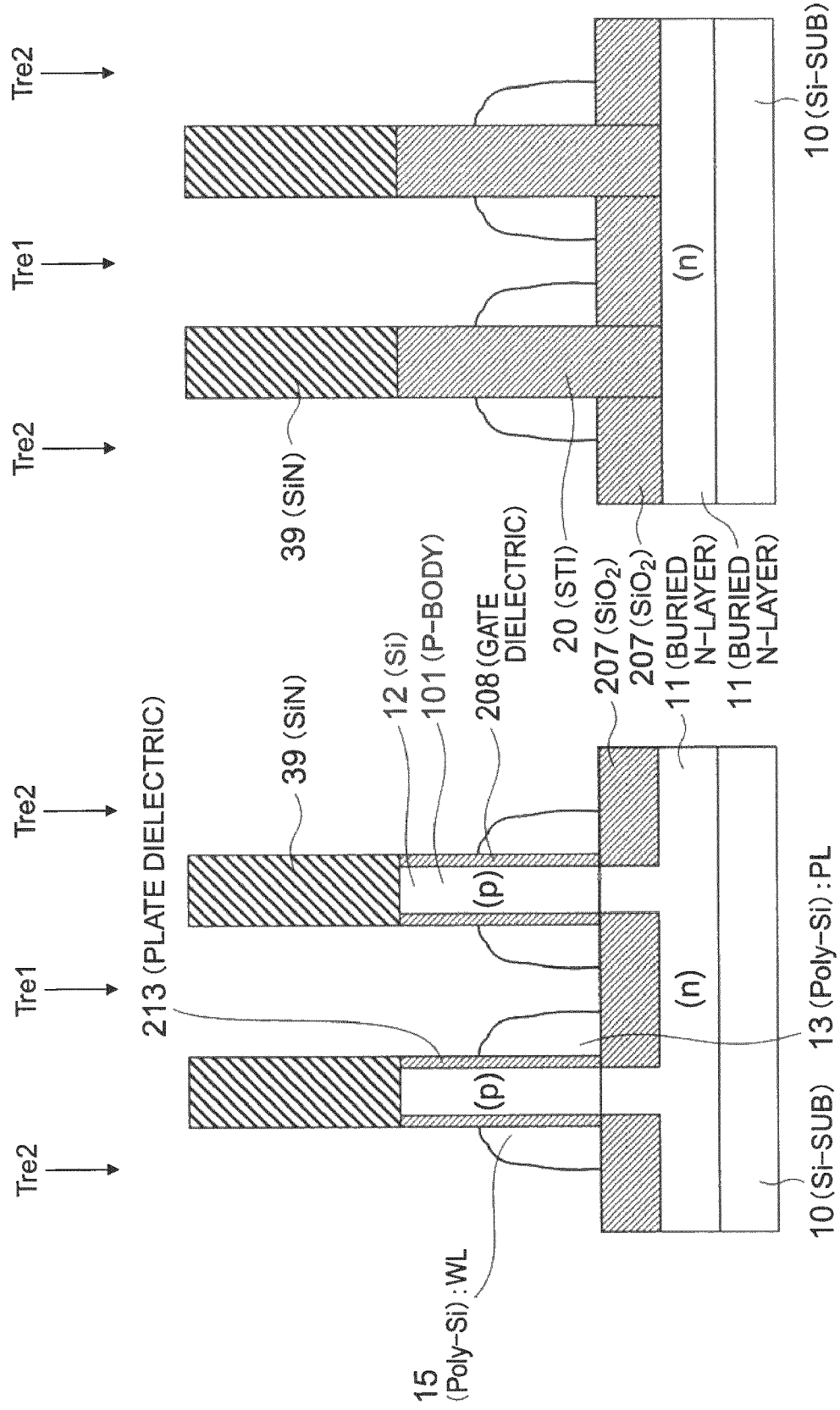

Polysilicon is then deposited while N-type impurities being doped therein. The thickness of the polysilicon is smaller than ½ of the column direction width F of the openings of the first and second trenches Tre1 and Tre2 so that the first and second trenches Tre1 and Tre2 are not buried completely. The polysilicon is then anisotropically etched by RIE, so that the polysilicon 13 remains on the inner side surfaces of the first trench Tre1 with the plate dielectric film 213 interposed therebetween as shown in FIGS. 43A and 43B. The polysilicon 15 remains on the inner side surface of the second trench Tre2 with the gate dielectric film 208 interposed therebetween. The polysilicons 13 and 15 are formed so as to correspond to the corners at the bottoms of the first and second trenches Tre1 and Tre2, respectively. The polysilicons 13 and 15 at the respective corners are separated from each other in the column direction cross-section.

The polysilicon 13 within the first trench Tre1 functions as the plate line PL. The polysilicon 15 within the second trench Tre2 functions as the word line WL (gate electrode). As described above, the plate line PL and the word line WL are formed simultaneously in the third embodiment. Thus, the material, conductivity type, and thickness of the polysilicon 13 are the same as those of the polysilicon 15. Further, the material and thickness of the plate dielectric film 213 are the same as those of the gate dielectric film 208. However, because the plate dielectric film 213 and the gate dielectric film 208 are formed simultaneously and the plate line PL and the word line WL are also formed simultaneously, the manufacturing process of the third embodiment can be simplified.

N-type impurities are introduced into the top of the silicon layer 12 by oblique ion implantation or the like using the word line WL or the plate line PL as a mask. At this time, the level of the top surface (tip) of the polysilicon 13 or 15 is a factor determining the boundary between the body 14 and the drain 16. Activation of the impurities allows the N-type drain 16 to be formed as shown in FIG. 44A.

While impurities are introduced into the polysilicon 15 during the deposition step, the impurities can be alternatively introduced at the same time when impurities are introduced into the drain 16 at the time of forming the drain 16, as in the first embodiment. While impurities are introduced into the buried N-layer 11 (source) during an earlier step, the impurities can be alternatively introduced at the same time when impurities are introduced into the drain 16 at the time of forming the drain 16 (see Non-Patent Document 1).

Figures 45A, 45B:
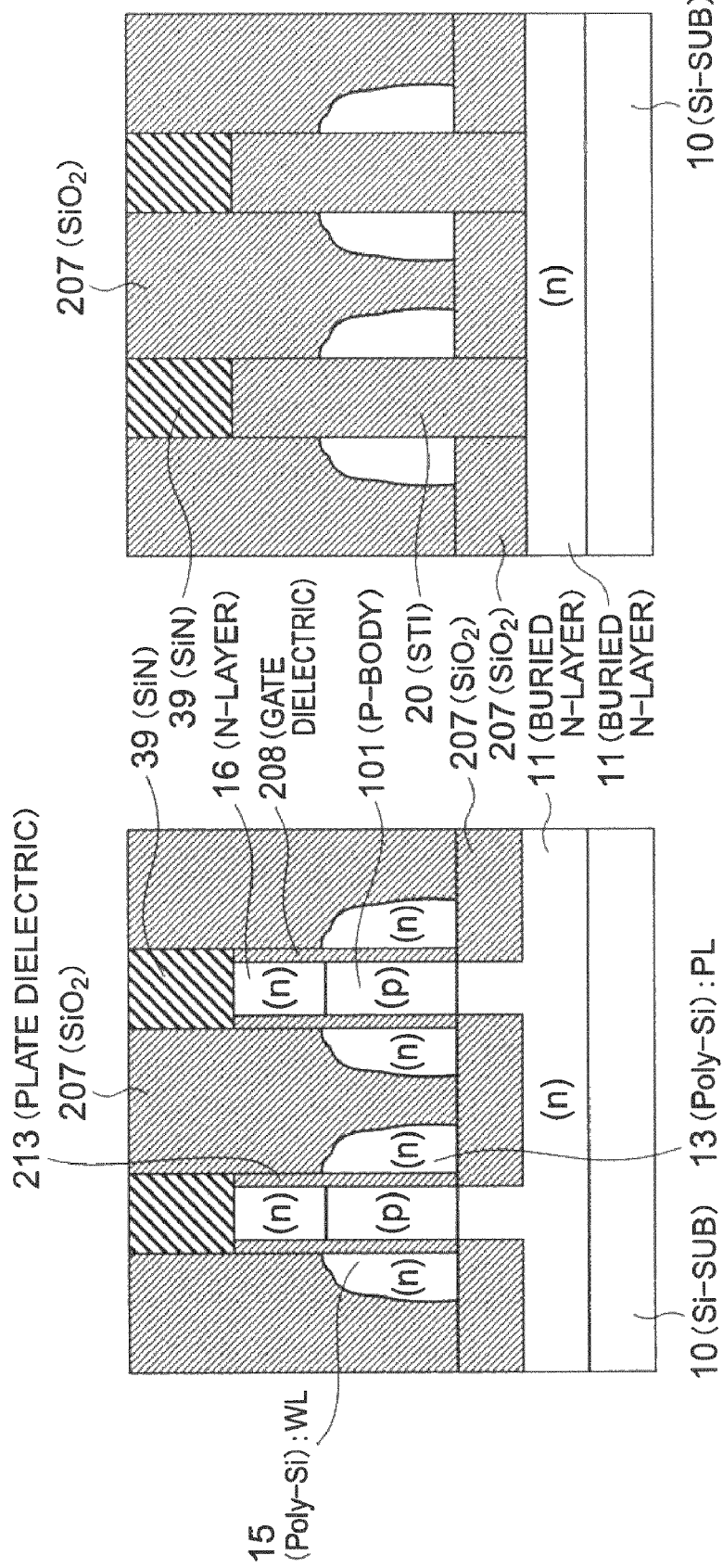

As shown in FIGS. 45A and 45B, the silicon oxide film 207 is then buried in the first and second trenches Tre1 and Tre2 and its top surface is flattened by CMP.

As shown in FIGS. 46A and 46B, the silicon oxide film 207 is etched back so that the entire top and side surfaces of the silicon nitride film 39 are exposed.

Figures 47A, 47B:
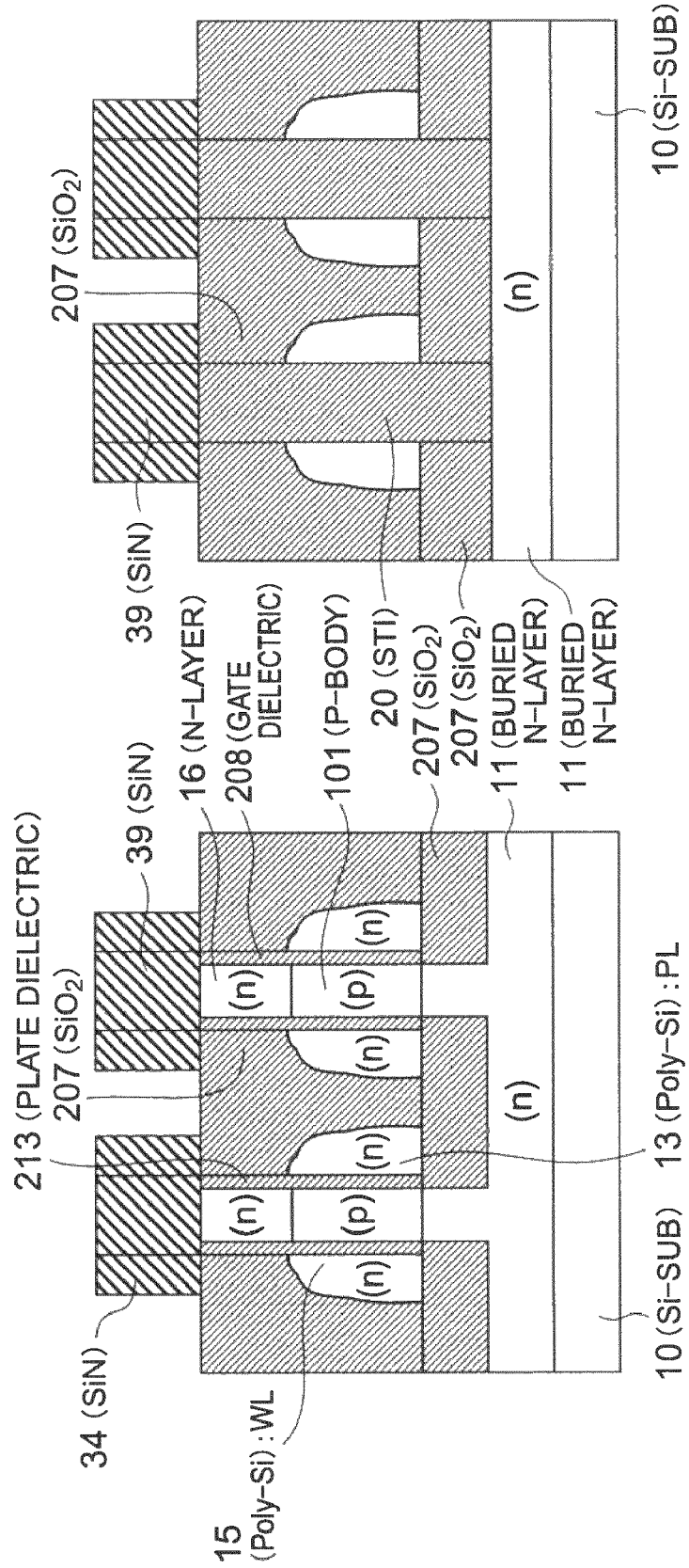

The silicon nitride film 34 is deposited on the silicon oxide film 207 and the silicon nitride film 39 and then etched back. The silicon nitride film 34 thus remains on the side surfaces of the silicon nitride film 39 as a sidewall film. As a result, a configuration shown in FIGS. 47A and 47B is obtained. The thickness of the deposited silicon nitride film 34 is desirably slightly smaller than that of the polysilicon 15 so that the side surfaces of the word line WL and the plate line PL are exposed.

Figures 48A, 48B:
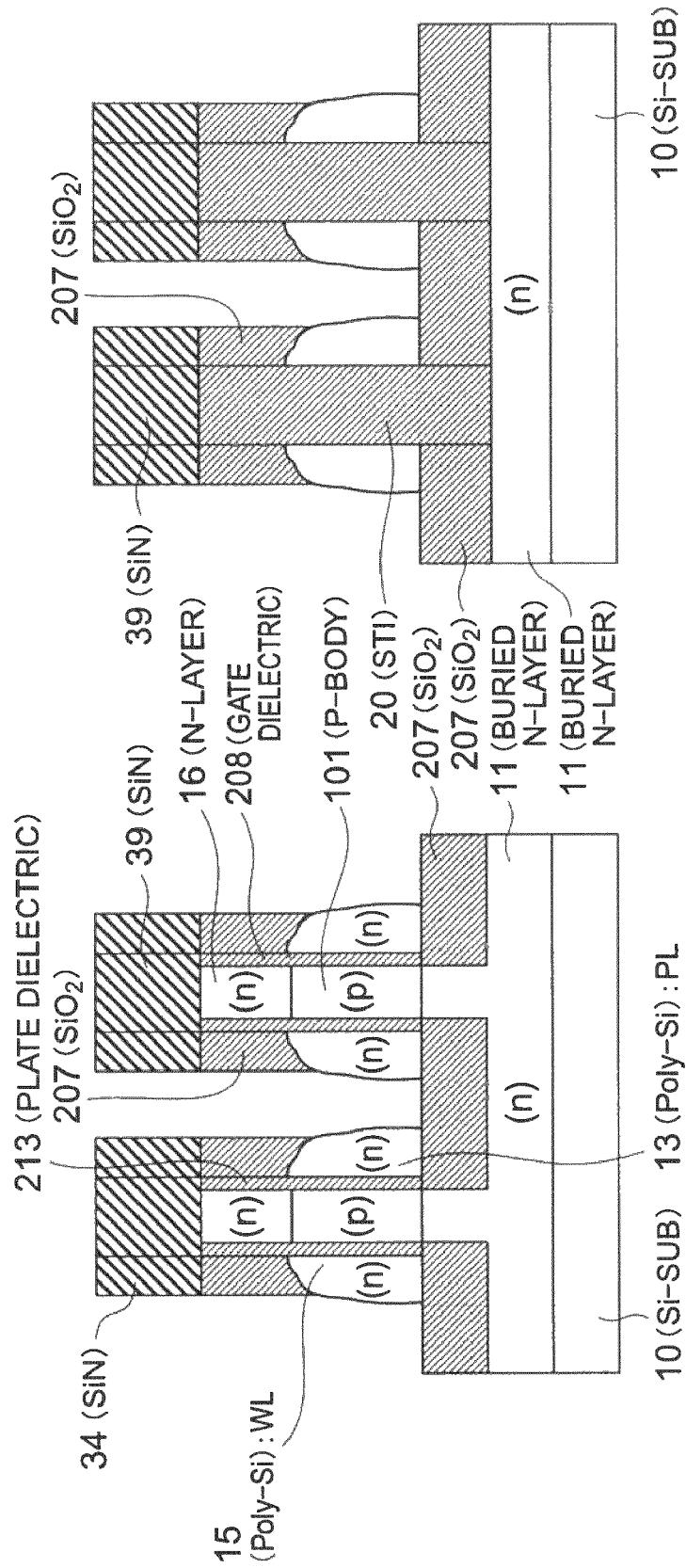

As shown in FIGS. 48A and 48B, the silicon oxide film 207 is anisotropically etched by RIE by using the silicon nitride films 39 and 34 as a mask, so that the surfaces of the polysilicons 13 and 15 are exposed. Because the column direction thickness of the silicon nitride film 34 is slightly smaller than that of the polysilicon 15, only the side surface of the polysilicon 15 is exposed. The gate dielectric film 208 and the plate dielectric film 213 are covered by the silicon oxide film 207. Accordingly, process damage of the gate dielectric film 208 and the plate dielectric film 213 is suppressed and the gate-drain short is prevented.

As shown in FIGS. 49A and 49B, the suicide 17 is then formed on the side surfaces of the polysilicons 13 and 15. As a result, the resistances of the word line WL and the plate line PL are reduced.

As shown in FIGS. 50A and 50B, the silicon oxide film 210 is then buried again in the first and second trenches Tre1 and Tre2, and the silicon oxide film 29 is flattened by CMP until the top surface of the drain 16 is exposed. The silicon nitride films 39 and 34 are removed at this time.

After the steps described with reference to FIGS. 22A to 28B, the FBC memory of the third embodiment is completed.

The gate dielectric film 208 and the plate dielectric film 213 are formed simultaneously in the same step in the third embodiment. Further, the word line WL and the plate line PL are also formed simultaneously in the same step. Therefore, the manufacturing process is simplified. The third embodiment can further achieve the effects of the second embodiment.

Fourth Embodiment

Figure 51:
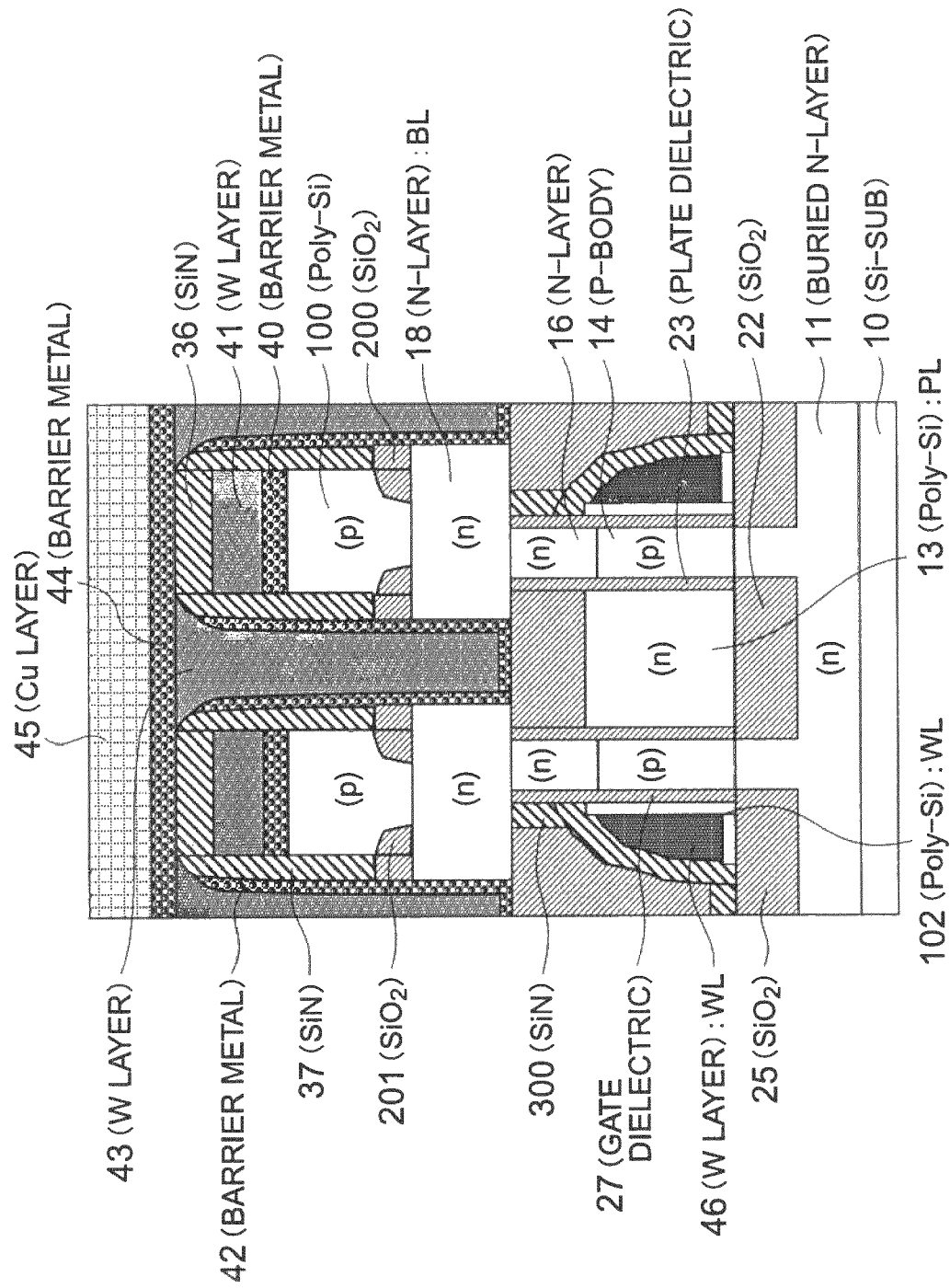
FIG. 51 corresponds to the cross-section along the line A-A' in FIG. 1.
Figure 52:
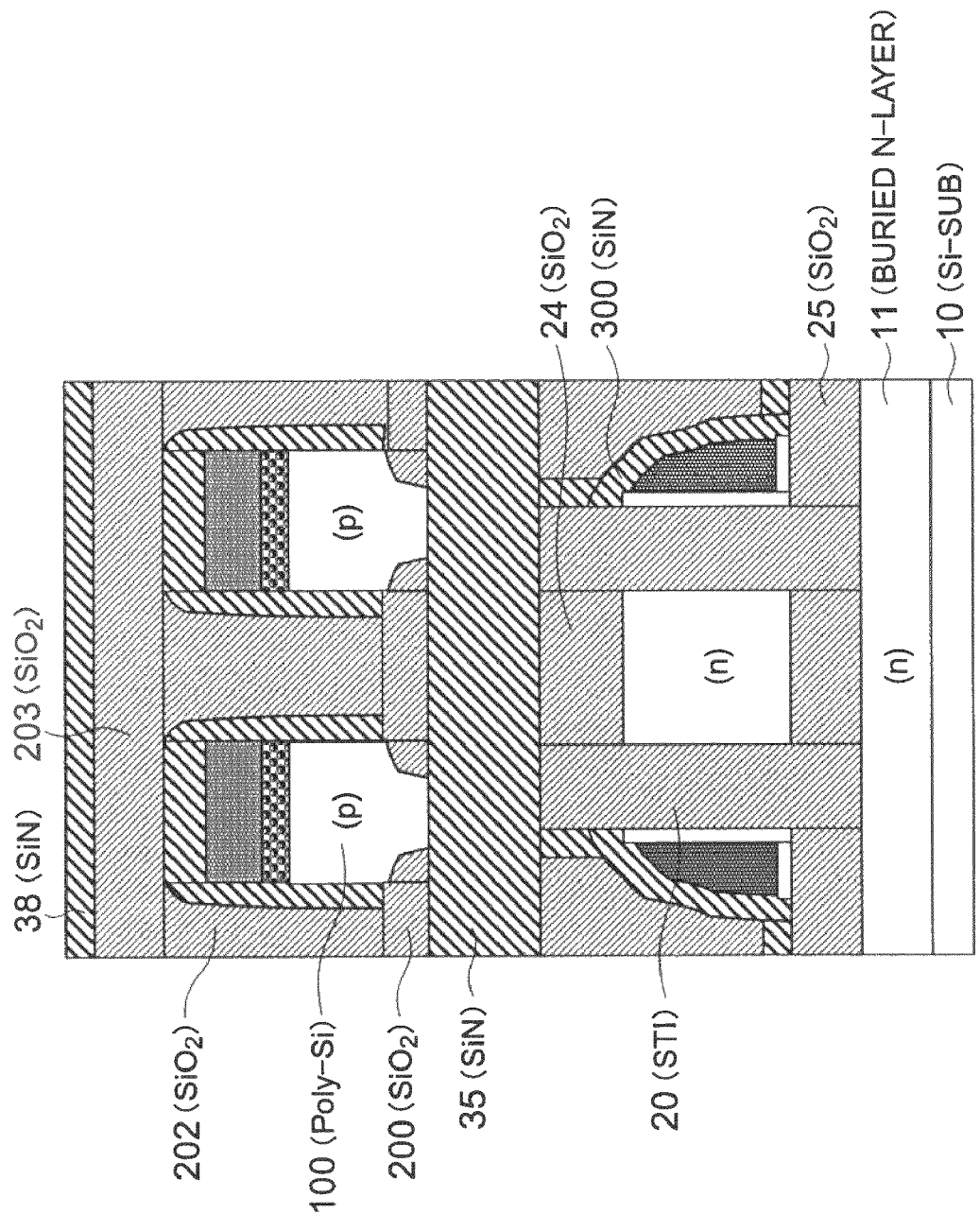
FIG. 52 corresponds to the cross-section along the line B-B' in FIG. 1.

FIGS. 51 and 52 are cross-sectional views of configuration of a bipolar-write FBC according to a fourth embodiment of the present invention. Because a plan view in the fourth embodiment is the same as that in FIG. 1, it will be omitted. FIG. 51 corresponds to the cross-section along the line A-A' in FIG. 1. FIG. 52 corresponds to the cross-section along the line B-B' in FIG. 1.

The fourth embodiment is different from the first embodiment in that the word line WL is formed of a polysilicon 102 and a metal wire 46. Other configurations of the fourth embodiment can be identical as those in the first embodiment. The size of a unit cell in the fourth embodiment is the same as that in the first embodiment.

The polysilicon 102 is provided on one side surface of the body 14 with the gate dielectric film 27 interposed therebetween. The polysilicon film 102 is also provided on the silicon oxide film 25. The metal wire 46 is provided on the polysilicon film 102. The metal wire 46 is made of tungsten, for example. The resistance of the word line WL is thus reduced significantly. A silicon nitride film 300 is provided so as to cover the metal wire 46 and the polysilicon film 102.

A manufacturing method of the FBC according to the fourth embodiment is described next. FIGS. 53A, 54A, 55A, and 56A correspond to cross-sections along the line A in FIG. 4 during the respective steps. FIGS. 53B, 54B, 55B, and 56B correspond to cross-sections along the line B in FIG. 4 during the respective steps.

After the steps shown in FIGS. 4 to 15, the sacrifice oxide film 26 is removed. The gate dielectric film 27 is then formed. As shown in FIGS. 53A and 53B, the polysilicon film 102 and the tungsten film 46 are deposited on the gate dielectric film 27, the silicon oxide film 25, and the silicon nitride films 32 and 33.

For example, the polysilicon film 102 is deposited while doping N-type impurities. The thickness of the deposited polysilicon film 102 is, for example 5 to 10 nm. The metal wire 46, for example, a tungsten film is then deposited by selective growth LPCVD.

The sum of thicknesses of the deposited polysilicon film 102 and tungsten film 46 is less than ½ of the column direction width F of the second trench Tre2 so that the opening of the second trench Tre2 is not closed by the polysilicon film 102 and the tungsten film 46.

The tungsten film 46 is then anisotropically etched by RIE. The tungsten film 46 thus remains on the inner side surface of the second trench Tre2. The tungsten film 46 remains so as to correspond to each of the corners at the bottom of the second trench Tre2. The tungsten films 46 at the respective corners are separated from each other in the column direction cross-section. The level of the top of the tungsten film 46 is adjusted like the level of the top of the polysilicon 15 in the first embodiment.

The polysilicon film 102 is etched by using the tungsten film 46 as a mask. A configuration shown in FIGS. 53A and 53B is thus obtained.

Figures 54A, 54B:
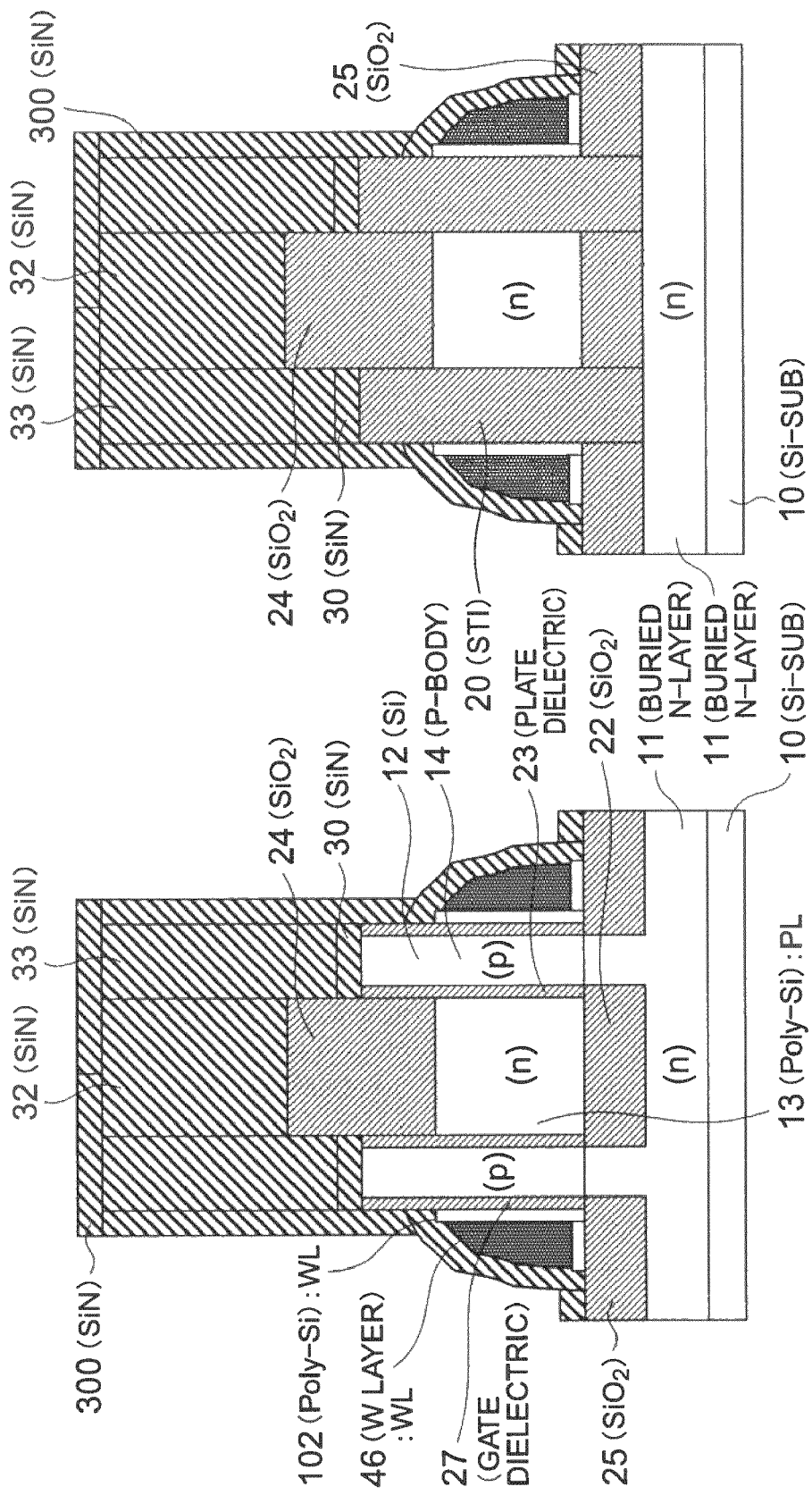

The silicon nitride film 300 is then deposited on the configuration shown in FIGS. 53A and 53B. As shown in FIGS. 54A and 54B, the tungsten film 46, the polysilicon film 102, and the gate dielectric film 27 are covered by the silicon nitride film 300 serving as cap material. The silicon nitride film 300 is provided to suppress oxidization of the tungsten film 46 during a subsequent thermal step.

As in the first embodiment, N-type impurities are introduced into the top of the silicon layer 12 by oblique ion implantation using the word line WL as a mask. As shown in FIG. 55A, the drain 16 is thus formed.

A silicon oxide film 211 is buried in the second trench Tre2 and then flattened by CMP until the top surface of the drain 16 is exposed. The silicon nitride films 30, 32, and 33 are removed at this time. As a result, a configuration shown in FIGS. 56A and 56B is obtained.

After the steps described with reference to FIGS. 22A to 28B, the FBC memory of the fourth embodiment is completed.

Because the word line WL includes the metal wire 46, its resistance is sufficiently low. Further, because the plate line PL is shared by memory cells adjacent to each other in the column direction, it is not operated at high speed during a usual operation. Therefore, according to the fourth embodiment, the word line WL and the plate line PL do not need to be provided with the silicide 17, the manufacturing process can be simplified.

Fifth Embodiment

Figure 57:
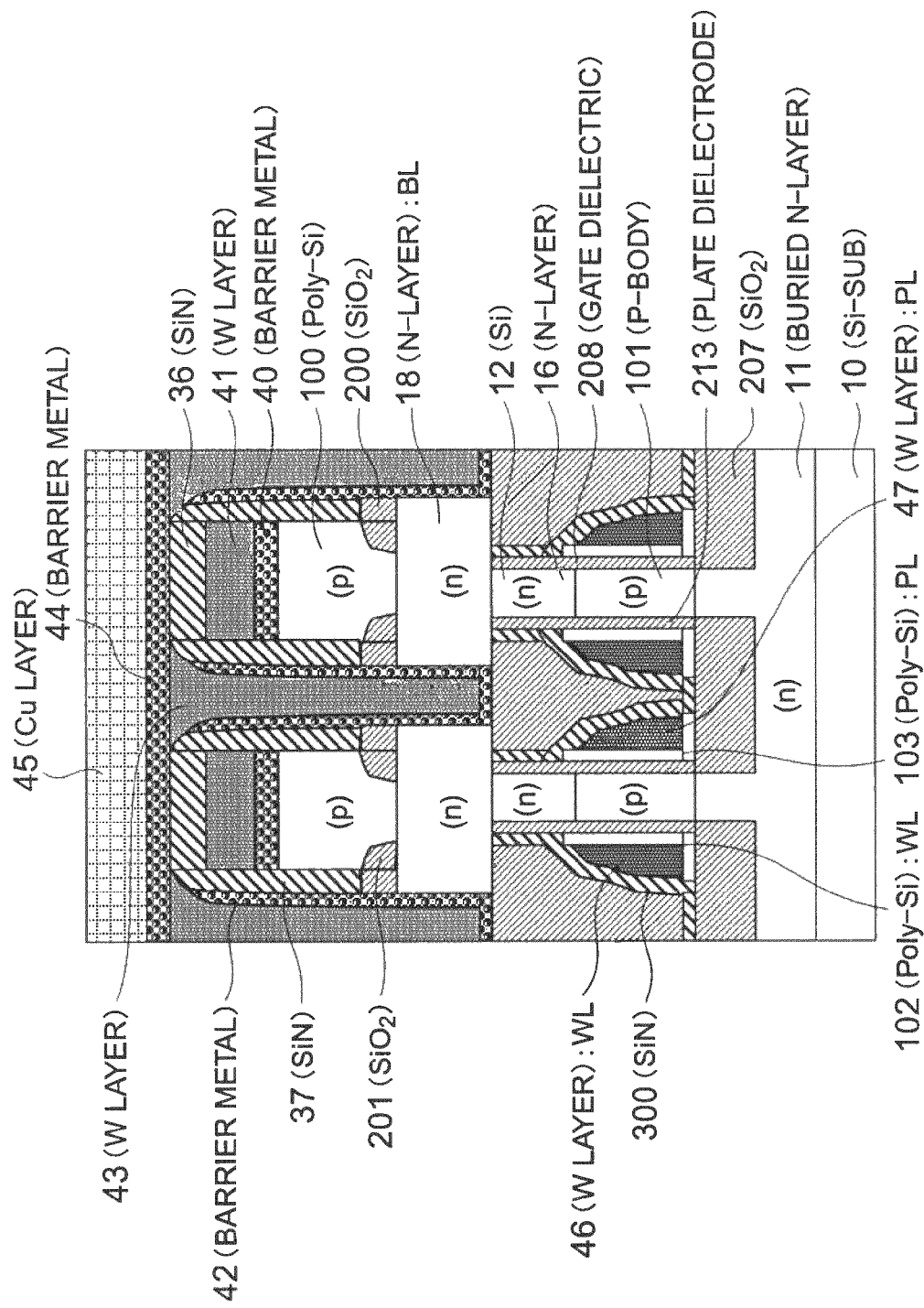
FIGS. 57 and 58 are cross-sectional views of configuration of a bipolar-write FBC according to a fifth embodiment of the present invention.
Figure 58:
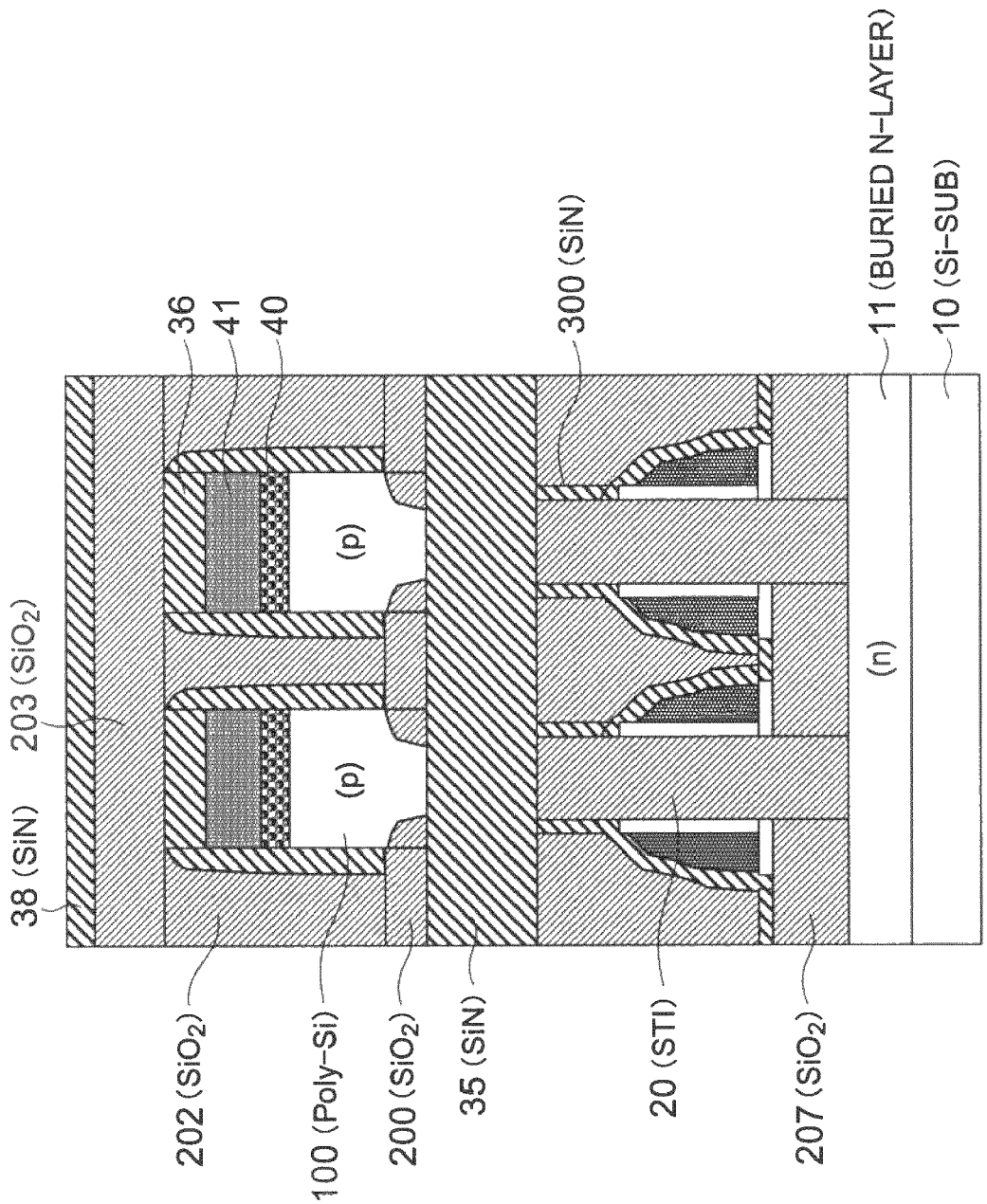

FIGS. 57 and 58 are cross-sectional views of configuration of a bipolar-write FBC according to a fifth embodiment of the present invention. Because a plan view in the fifth embodiment is the same as that of FIG. 29, it will be omitted. FIG. 57 corresponds to the cross-section along the line A-A' in FIG. 29. FIG. 58 corresponds to the cross-section along the line B-B' in FIG. 29.

The fifth embodiment is different from the third embodiment in that the word line WL and the plate line PL are formed of polysilicons (102, 103) and metal films (46, 47), respectively. Other configurations of the fifth embodiment can be the same as those in the third embodiment. The size of a unit cell in the fifth embodiment is the same as that in the third embodiment.

The polysilicon 102 is provided on one side surface of the body 14 with the gate dielectric film 208 interposed therebetween. The other side surface of the body 14 is provided with the polysilicon 103 with the plate dielectric film 213 interposed therebetween. The polysilicon films 102 and 103 are also provided on the silicon oxide film 207. The metal wires 46 and 47 are provided on the polysilicon films 102 and 103, respectively. The metal wires 46 and 47 are made of tungsten, for example. Thus, the resistances of the word line WL and the plate line PL are reduced significantly. The silicon nitride film 300 is provided so as to cover the metal wires 46 and 47 and the polysilicon films 102 and 103.

A manufacturing method of the FBC according to the fifth embodiment is described next. FIGS. 59A, 60A, 61A, and 62A correspond to cross-sections along the line A in FIG. 4 during the respective steps. FIGS. 59B, 60B, 61B, and 62B correspond to cross-sections along the line B in FIG. 4 during the respective steps.

The manufacturing method of the FBC according to the fifth embodiment is the same as that in the third embodiment up to the step shown in FIGS. 42A and 42B.

The polysilicon films 102 and 103 are then deposited on the gate dielectric film 208 and the plate dielectric film 213 simultaneously while doping N-type impurities. The thicknesses of the polysilicon films 102 and 103 are, for example, 5 to 10 nm.

Subsequently, the metal wires 46 and 47 (for example, tungsten) are deposited on the polysilicon films 102 and 103 as the same film by selective growth LPCVD or the like. The thicknesses of the tungsten films 46 and 47 are made less than ½ of the column direction width F of the openings of the first and second trenches Tre1 and Tre2 so that the first and second trenches Tre1 and Tre2 are not buried completely.

The tungsten films 46 and 47 are then anisotropically etched by RIE. Thus, the tungsten films 46 and 47 remain on the inner side surfaces of the first and second trenches Tre1 and Tre2. The tungsten film 46 remains so as to correspond to each of the corners at the bottom of the second trench Tre2. The tungsten film 47 remains so as to correspond to each of the corners at the bottom of the first trench Tre1. The tungsten films 46 and 47 at the respective corners are separated from each other in the column direction cross-section. The levels of tops of the tungsten films 46 and 47 are adjusted similarly to the level of the top of the polysilicon 15 in the first embodiment.

The polysilicon films 102 and 103 are etched by using the tungsten films 46 and 47 as a mask. As a result, a configuration shown in FIGS. 59A and 59B is obtained.

Figures 59A, 59B:
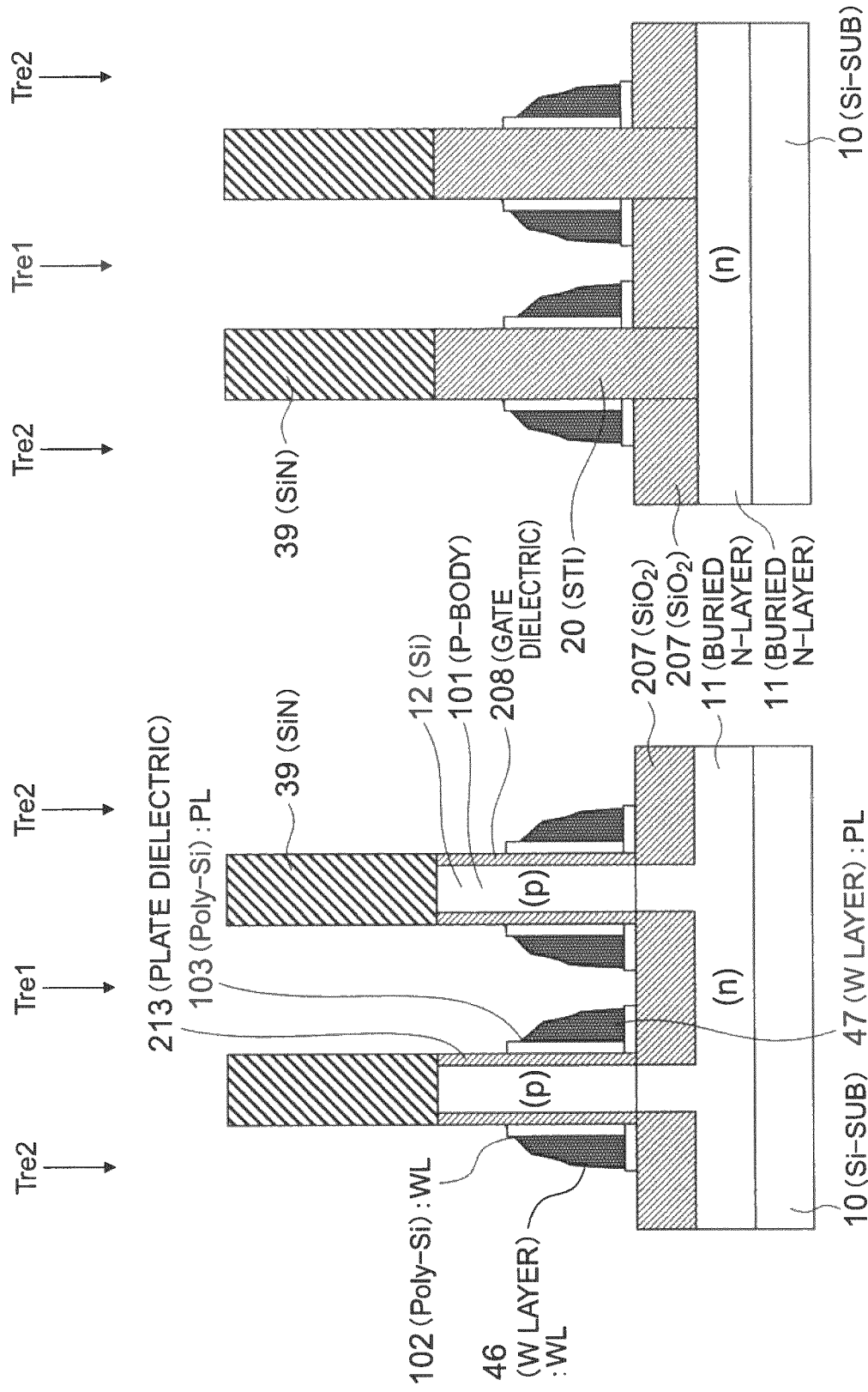
Figures 60A, 60B:
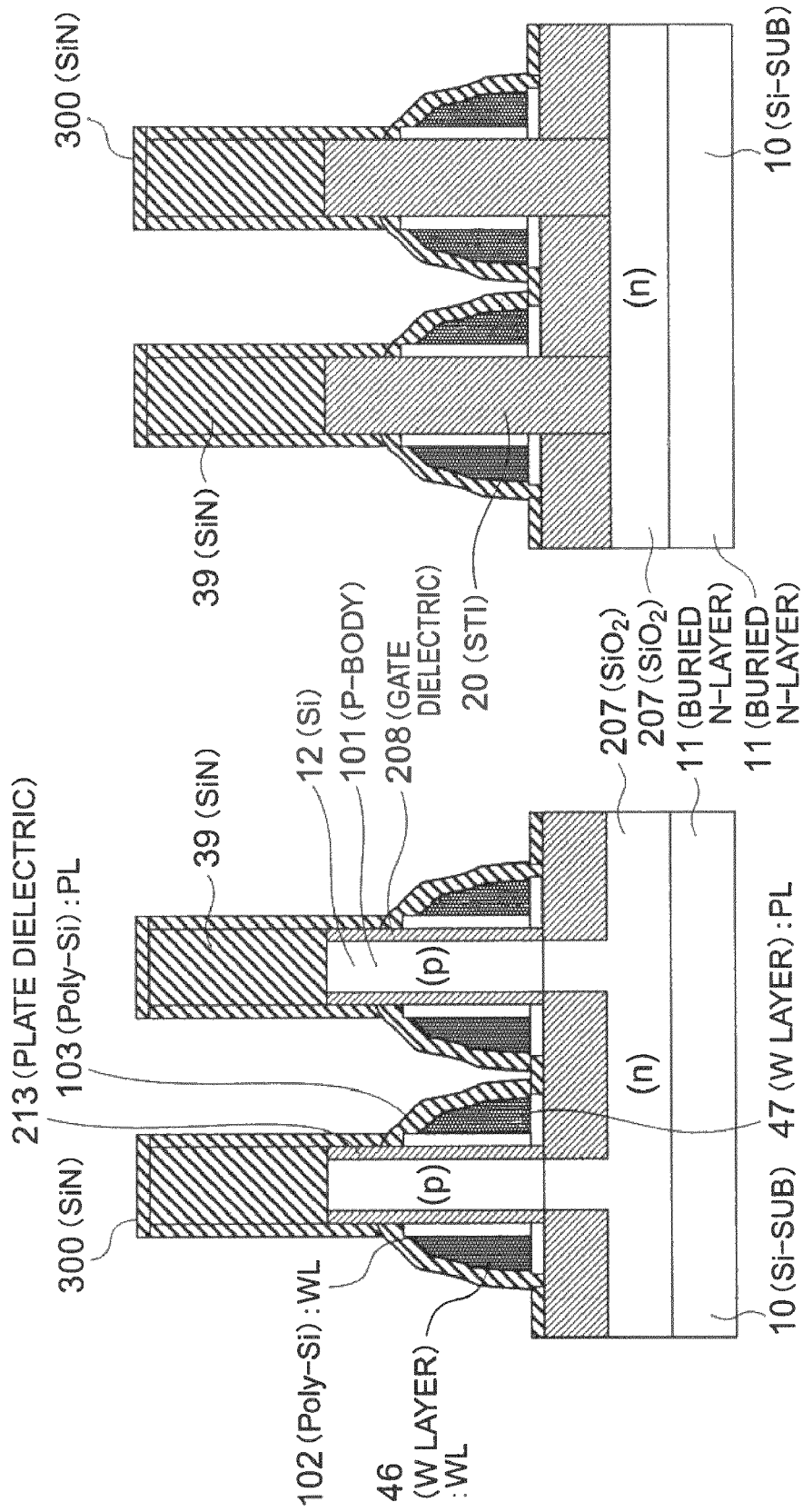

The silicon nitride film 300 is then deposited on the configuration shown in FIGS. 59A and 59B. As shown in FIGS. 60A and 60B, the tungsten films 46 and 47, the polysilicon films 102 and 103, the gate dielectric film 208, and the plate dielectric film 213 are thus covered by the silicon nitride film 300 serving as a cap material. The silicon nitride film 300 is provided to suppress oxidization of the tungsten film 46 in a subsequent thermal step.

Figures 61A, 61B:
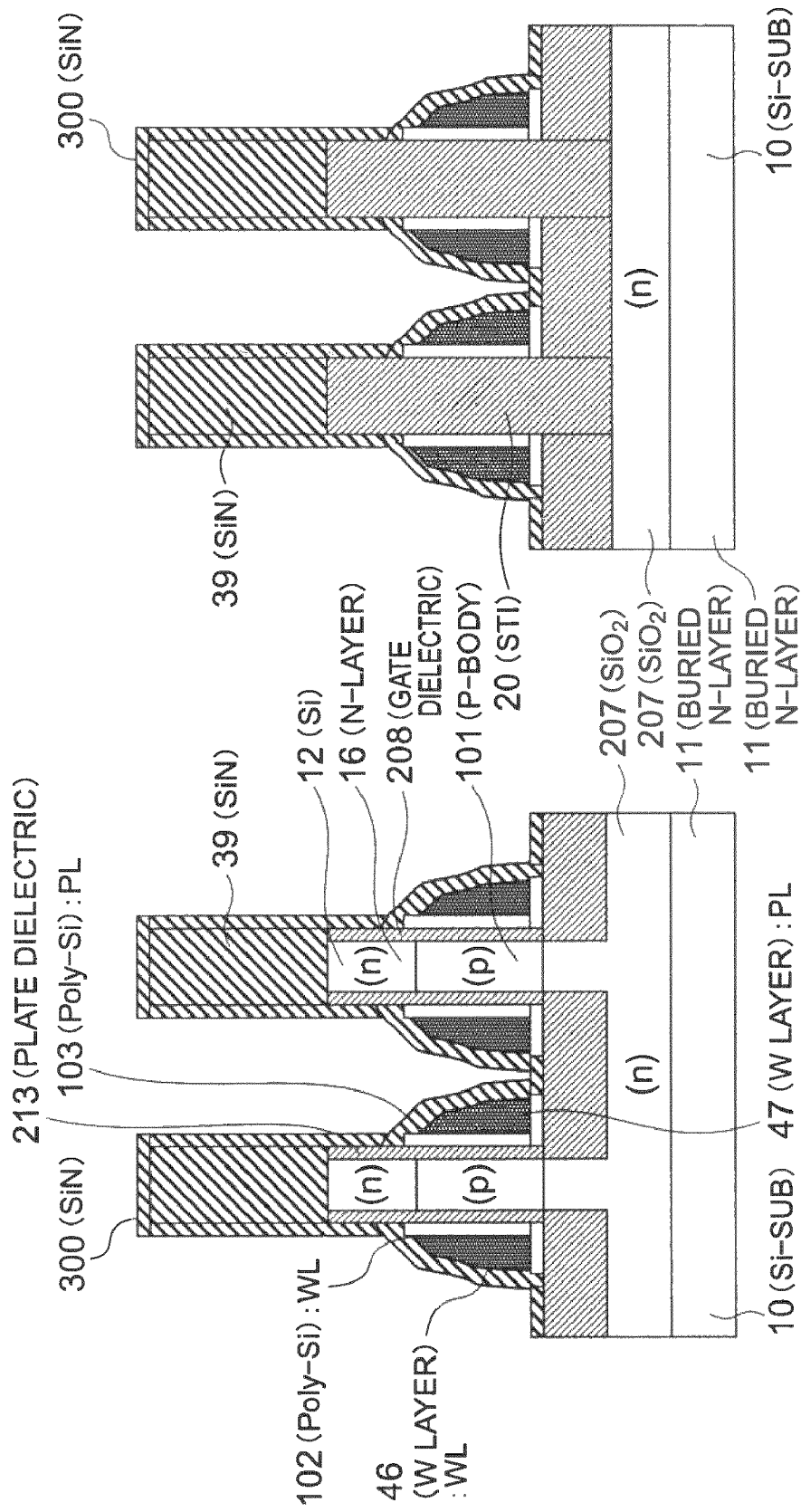
Figures 62A, 62B:
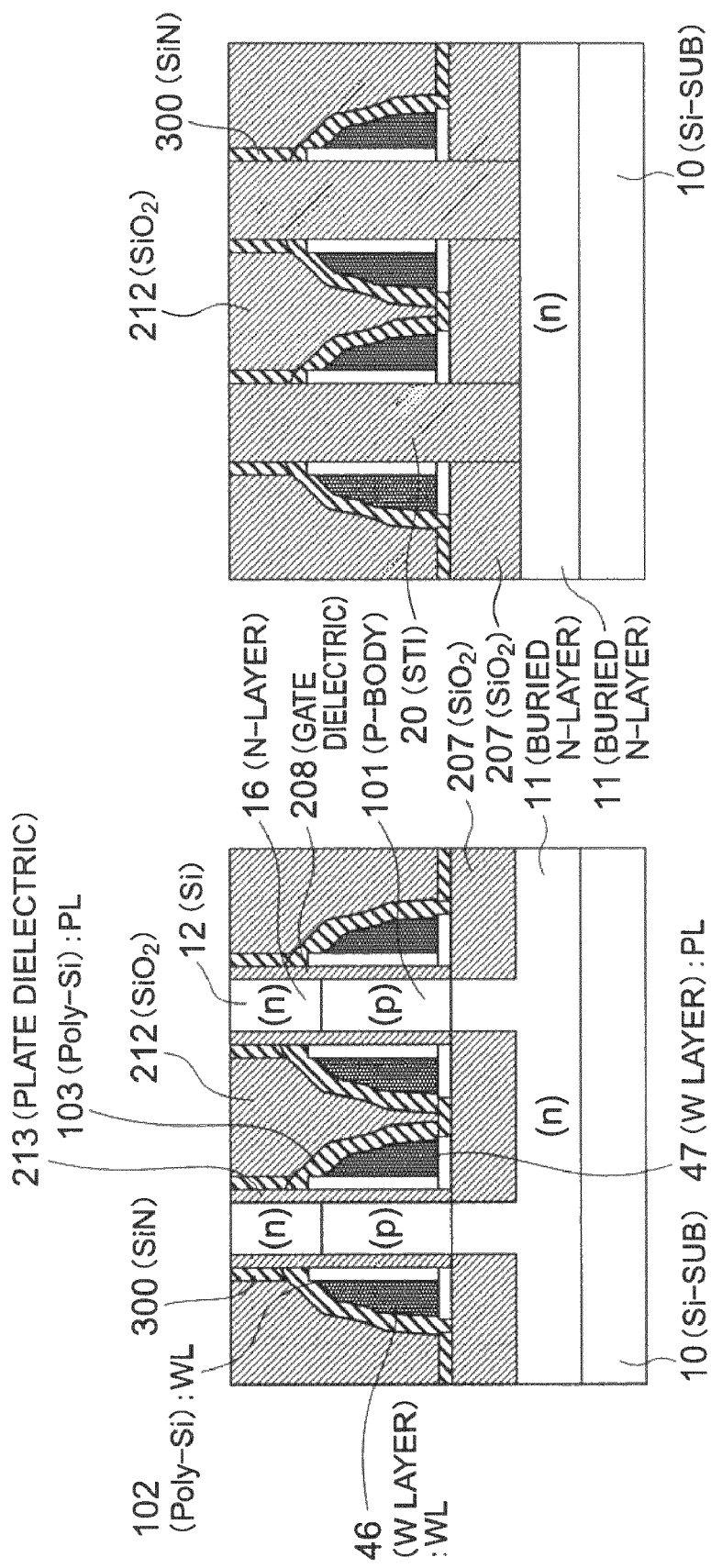

Like in the third embodiment, N-type impurities are introduced into the top of the silicon layer 12 by oblique ion implantation or the like using the word line WL and the plate line PL as a mask. As shown in FIG. 61A, the drain 16 is thus formed.

A silicon oxide film 212 is buried in the second trench Tre2 and then flattened by CMP until the top surface of the drain 16 is exposed. The silicon nitride film 39 is also removed at this time. As a result, a configuration shown in FIGS. 62A and 62B obtained.

After the steps described with reference to FIGS. 22A to 28B, the FBC memory of the fifth embodiment is completed.

The word line WL and the plate line PL include the metal wires 46 and 47, respectively, and thus the resistances of the word line WL and the plate line PL are reduced sufficiently. Accordingly, the silicide 17 does not need to be provided in the fifth embodiment. Therefore, the manufacturing process of the fifth embodiment can be simplified.

According to the fifth embodiment, the gate dielectric film 208 and the plate dielectric film 213 are formed simultaneously and the word line WL and the plate line PL are also formed simultaneously. Thus, the fifth embodiment can also achieve the effects of the third embodiment.

While a thermally oxidized film ($SiO_2$) is used as the gate dielectric films 27 and 208 and the plate dielectric films 23 and 213 in the above embodiments, a nitride film ($Si_3N_4$) or High-k materials with a higher relative dielectric constant than the silicon oxide film or the silicon nitride film (for example, $Ta_2O_5$, $BaTiO_3$, $BaZrO_3$, $ZrO_2$, $HfO_2$, $HfSiO_2$, and $Al_2O_3$) can be used instead of $SiO_2$.

While the N-type silicon layer 18 is single crystal silicon formed by selective epitaxial growth, it can be polysilicon or amorphous silicon.

The silicide 17 can be nickel silicide or titanium silicide instead of cobalt silicide. Materials for the insulation films (20, 36, 37, 200, 202, and the like) are not limited to the silicon oxide film or the silicon nitride film. Materials can be changed to the extent possible from a commonsense view in the industry. The film 300 in the fourth and fifth embodiments is preferably a silicon nitride film for suppressing oxidization of the metal wires 46 and 47.

While the above embodiments relate to FBCs using an N-channel MOSFET, they can be applied naturally to FBCs using a P-channel MOSFET.

The drain 16 is provided on the body 14 and the source is provided under the body 14 in the above embodiments. The described positional relationship between the drain and the source is for convenience and these positions can be opposite.

Figure 63:
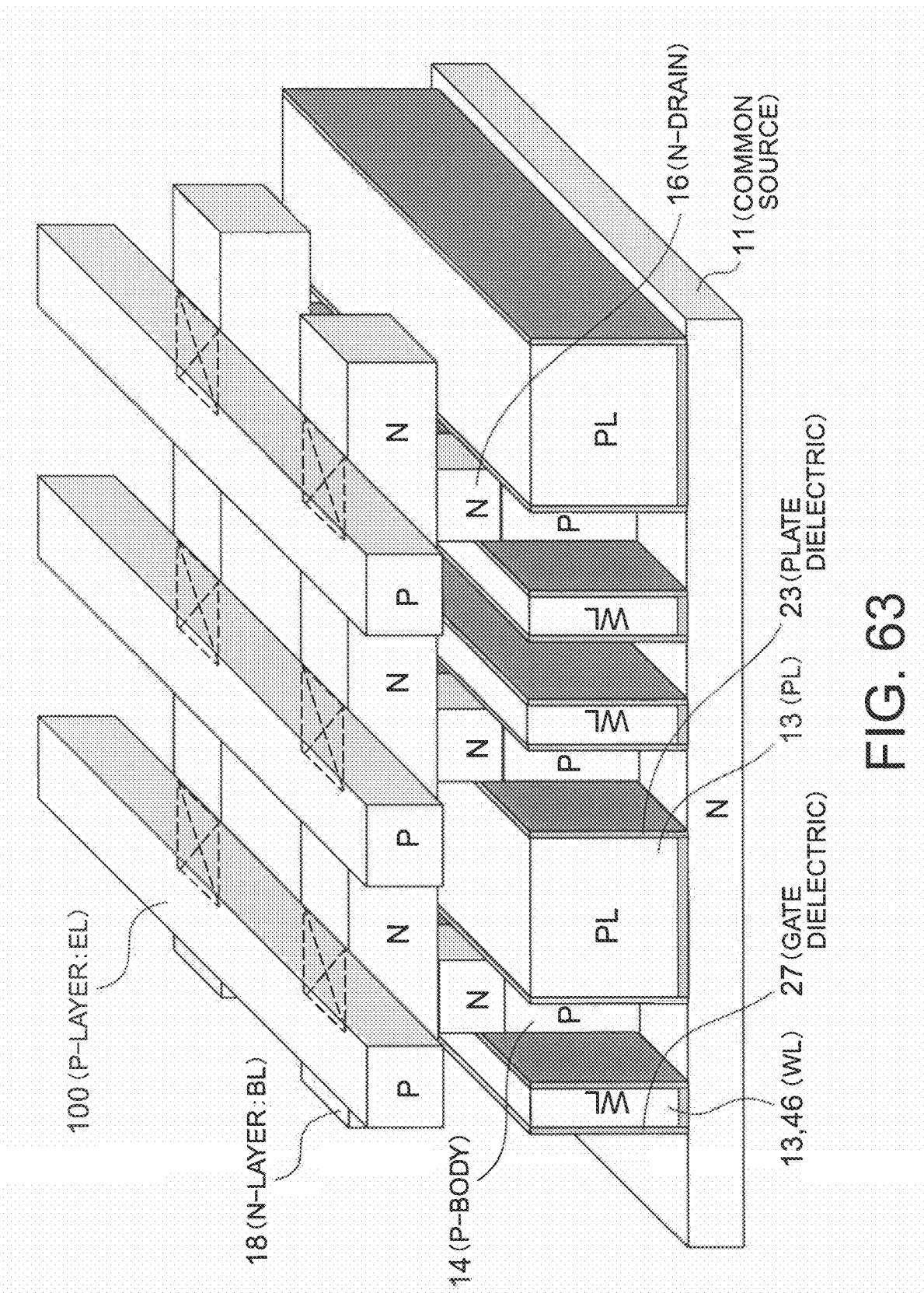
FIG. 63 is a partial perspective view of the bipolar-write FBC according to the first and fourth embodiments.
Figure 64:
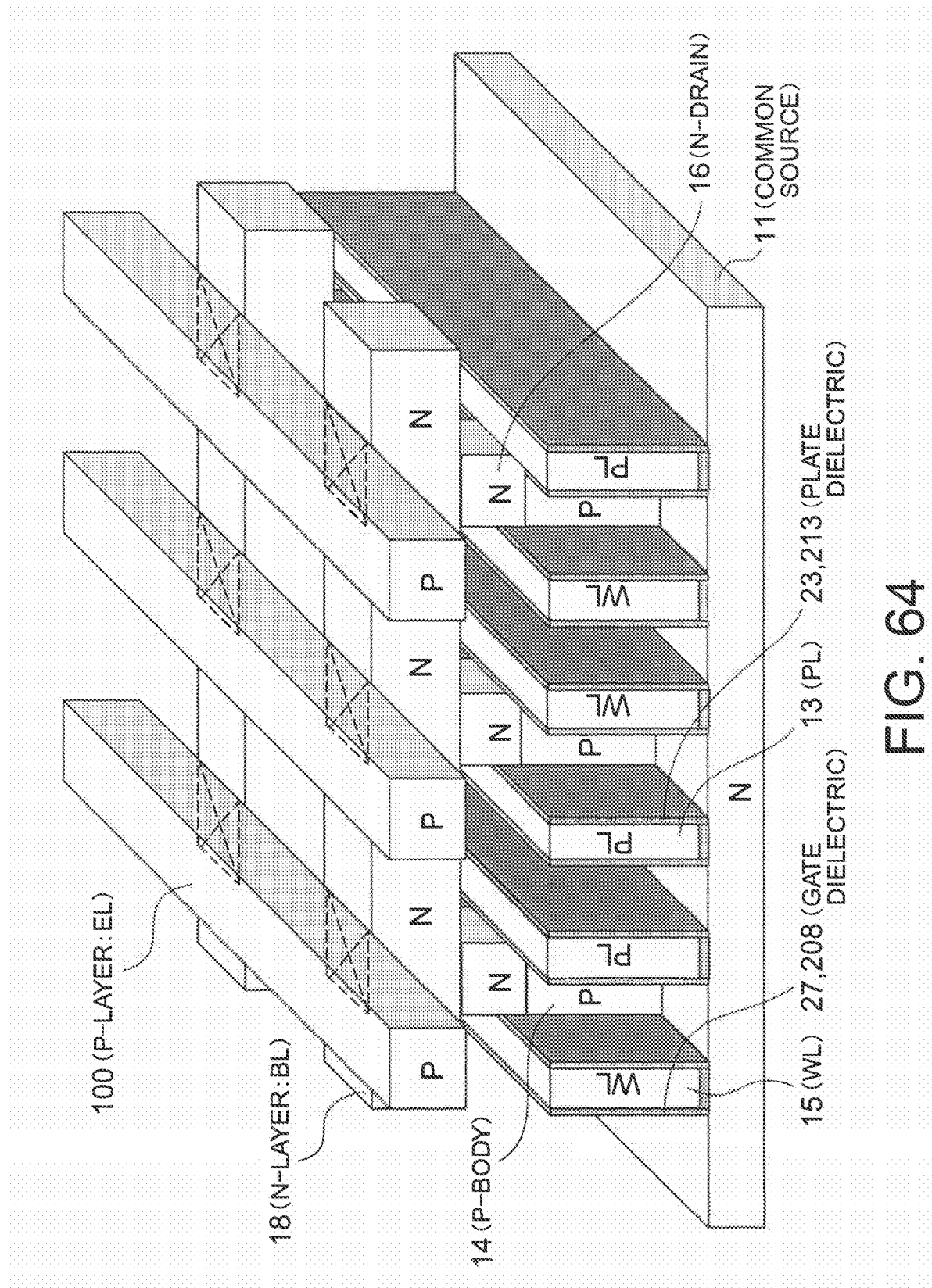
FIG. 64 is a partial perspective view of the bipolar-write FBC according to the second, third, and fifth embodiments.

FIG. 63 is a partial perspective view of the bipolar-write FBC according to the first and fourth embodiments. FIG. 64 is a partial perspective view of the bipolar-write FBC according to the second, third, and fifth embodiments. FIGS. 63 and 64 show the configuration from the buried N-layer 11 to the emitter line EL (the polysilicon layer 100).

With reference to FIGS. 63 and 64, the directions in which the respective wires extend and the relationships between the body 14 and the wires can be understood clearly.

The invention claimed is:

1. A semiconductor memory device comprising:
    bodies electrically floating and accumulate or discharge carriers to store therein data;
    sources, each of which is adjacent to one of a top surface and a bottom surface of one of the bodies;
    drains, each of which is adjacent to the other one of the top surface and the bottom surface of the one of the bodies;
    gate electrodes, each of which is adjacent to one side surface of the one of the bodies via a gate dielectric film;
    plates, each of which is adjacent to the other side surface of the one of the bodies via a plate dielectric film;
    first bit lines on the drains, the first bit lines including a semiconductor with a same conductivity type as that of the drains; and
    emitters on the semiconductor of the first bit lines, the emitters including a semiconductor with an opposite conductivity type to that of the semiconductor of the first bit lines, wherein
    the emitters are stacked above the bodies and the drains.

2. The semiconductor memory device according to claim 1, wherein the emitters extend in a second direction crossing a first direction in which the first bit lines extend.

3. The semiconductor memory device according to claim 1, wherein each of the plates is shared by two of the bodies adjacent to each other in a first direction in which the first bit lines extend.

4. The semiconductor memory device according to claim 1, wherein each of the plates is separated so as to correspond to two of the bodies adjacent to each other in a first direction in which the first bit lines extend.

5. The semiconductor memory device according to claim 1, further comprising:
    bit line contacts, each of which is provided between the two emitters adjacent to each other in a first direction in which the first bit lines extend, the bit line contacts connected to the first bit lines while isolated from the emitters; and
    second bit lines provided above the emitters while isolated from the emitters, the second bit lines extending in the first direction and connected via the bit line contacts to the first bit lines.

6. The semiconductor memory device according to claim 3, further comprising:
    bit line contacts, each of which is provided between the two emitters adjacent to each other in the first direction in which the first bit lines extend, the bit line contacts connected to the first bit lines while isolated from the emitters; and second bit lines provided above the emitters while isolated from the emitters, the second bit lines extending in the first direction and connected via the bit line contacts to the first bit lines.

7. The semiconductor memory device according to claim 4, further comprising:

bit line contacts, each of which is provided between the two emitters adjacent to each other in the first direction in which the first bit lines extend, the bit line contacts connected to the first bit lines while isolated from the emitters; and second bit lines provided above the emitters while isolated from the emitters, the second bit lines extending in the first direction and connected via the bit line contacts to the first bit lines.

8. The semiconductor memory device according to claim 1, wherein the plates extend in a second direction crossing a first direction in which the first bit lines extend, and the gate electrodes extend in the second direction as word lines.

9. The semiconductor memory device according to claim 1, wherein either the gate electrodes or the plates, or both of them include metal wirings.

* * * * *